United States Patent
Yamaguchi et al.

(10) Patent No.: US 9,653,657 B2
(45) Date of Patent: May 16, 2017

(54) SEMICONDUCTOR LIGHT EMITTING APPARATUS

(71) Applicant: ASAHI KASEI E-MATERIALS CORPORATION, Tokyo (JP)

(72) Inventors: Fujito Yamaguchi, Tokyo (JP); Nao Shirokura, Tokyo (JP)

(73) Assignee: ASAHI KASEI E-MATERIALS CORPORATION, Tokyo (JP)

(*) Notice: Subject to any disclaimer, the term of this patent is extended or adjusted under 35 U.S.C. 154(b) by 0 days.

(21) Appl. No.: 14/897,159

(22) PCT Filed: Jun. 2, 2014

(86) PCT No.: PCT/JP2014/064575
§ 371 (c)(1),
(2) Date: Dec. 9, 2015

(87) PCT Pub. No.: WO2014/199851
PCT Pub. Date: Dec. 18, 2014

(65) Prior Publication Data
US 2016/0149089 A1    May 26, 2016

(30) Foreign Application Priority Data

Jun. 10, 2013 (JP) ................. 2013-121580
Jul. 23, 2013 (JP) ................. 2013-152682
Jul. 26, 2013 (JP) ................. 2013-155598

(51) Int. Cl.
*H01L 33/00* (2010.01)
*H01L 33/50* (2010.01)
(Continued)

(52) U.S. Cl.
CPC .......... *H01L 33/50* (2013.01); *H01L 33/22* (2013.01); *H01L 33/24* (2013.01); *H01L 33/504* (2013.01); *H01L 2933/0083* (2013.01)

(58) Field of Classification Search
None
See application file for complete search history.

(56) References Cited

U.S. PATENT DOCUMENTS 7,804,103 B1   9/2010   Zhai et al.
2003/0057444 A1   3/2003   Niki et al.
(Continued)

FOREIGN PATENT DOCUMENTS

JP   2003-318441 A   11/2003
JP   2004-15063 A   1/2004
(Continued)

OTHER PUBLICATIONS

International Preliminary Report on Patentability for Application No. PCT/JP2014/064575 dated Dec. 23, 2015.
(Continued)

*Primary Examiner* — Calvin Choi
(74) *Attorney, Agent, or Firm* — Birch, Stewart, Kolasch & Birch, LLP

(57) ABSTRACT

A semiconductor light emitting apparatus comprised of a semiconductor light emitting device (100) having a layered semiconductor layer (110) configured by layering at least two or more semiconductor layers (103), (105) and a light emitting layer (104) to emit first light, and a wavelength conversion member that covers at least apart of the semiconductor light emitting device (100), absorbs at least a part of the first light and that emits second light with a wavelength different from that of the first light, characterized in that the semiconductor light emitting device (100) is provided with a fine structure layer, as a component, including dots comprised of a plurality of convex portions or concave portions extending in the out-of-plane direction on one of main surfaces forming the semiconductor light emitting device (100), the fine structure layer forms a two-dimensional photonic crystal (102) controlled by at least one of a
(Continued)

pitch among the dots, a dot diameter and a dot height, and that the two-dimensional photonic crystal (102) has at least two or more periods each of 1 μm or more.

15 Claims, 23 Drawing Sheets

(51) Int. Cl.
*H01L 33/22* (2010.01)
*H01L 33/24* (2010.01)

(56) References Cited

U.S. PATENT DOCUMENTS

| | | |
|---|---|---|
| 2003/0227249 A1 | 12/2003 | Mueller et al. |
| 2004/0061433 A1 | 4/2004 | Izuno et al. |
| 2007/0023763 A1 | 2/2007 | Takigawa et al. |
| 2007/0176196 A1 | 8/2007 | Kim et al. |
| 2008/0231170 A1 | 9/2008 | Masato et al. |
| 2012/0012874 A1 | 1/2012 | Morioka et al. |
| 2012/0074453 A1 | 3/2012 | Wuu et al. |
| 2012/0138985 A1 | 6/2012 | Ono et al. |
| 2014/0217449 A1 | 8/2014 | Yamaguchi et al. |
| 2015/0060926 A1 | 3/2015 | Ishii et al. |

FOREIGN PATENT DOCUMENTS

| | | |
|---|---|---|
| JP | 2007-35967 A | 2/2007 |
| JP | 2007-88277 A | 4/2007 |
| JP | 2007-208236 A | 8/2007 |
| JP | 2007-234968 A | 9/2007 |
| JP | 2008-205511 A | 9/2008 |
| JP | 2012-74701 A | 4/2012 |
| JP | 2012-124257 A | 6/2012 |
| JP | 2012-193283 A | 10/2012 |
| JP | 2013-38447 A | 2/2013 |
| WO | WO 2010/082286 A1 | 7/2010 |
| WO | WO 2013/031887 A1 | 3/2013 |

OTHER PUBLICATIONS

International Search Report issued in PCT/JP2014/064575, dated Aug. 26, 2014.
European Office Action for Application No. 14811003.4, dated May 2, 2016.

Z-PHASE SIGNAL

REFERENCE PULSE SIGNAL

MODULATED PULSE SIGNAL

US 9,653,657 B2

SEMICONDUCTOR LIGHT EMITTING APPARATUS

TECHNICAL FIELD

The present invention relates to a semiconductor light emitting apparatus including a semiconductor light emitting device and a wavelength conversion member to be comprised thereof.

BACKGROUND ART

A light emitting diode (LED) that is a semiconductor light emitting device using semiconductor layers has characteristics such as a small size, high power efficiency and fast on-off responsibility, as compared with conventional light emitting apparatuses such as traditional fluorescent lamps and incandescent lamps, and since the diode is all formed of solid, has many advantages such as high resistance to vibration and long apparatus life.

In addition, in the LED, the center emission wavelength is a single, the single wavelength is limited in its use to use as various kinds of light sources, and therefore, as an emission light source, white light is required.

For example, Patent Document 1 discloses the invention related to a semiconductor light emitting device for generating white light by combining a blue LED and a fluorescent material which absorbs the emitted light to emit yellow fluorescence, and mixing the yellow light and blue light that is not absorbed.

Further, Patent Document 2 discloses the invention related to a white LED lamp having a light emitting diode chip that emits first light of UV light to violet light and a transparent resin layer with a fluorescent material layer dispersed. When the first light passes through the transparent resin layer and arrives at the fluorescent material layer, the fluorescent material powder inside the fluorescent material layer emits light (second light) such as blue light, green light, yellow light and red light, and at this point, it is determined that the color of light obtained by mixing respective colors of the second light is white.

Patent Document 3 discloses the invention related to a semiconductor light emitting device that is one component of a semiconductor light emitting apparatus. It is mentioned in Patent Document 3 that a concavo-convex pattern of micro-order is provided on the substrate surface forming an LED, and that the waveguide direction of light in a light emitting layer is changed to enable the light extraction efficiency to be improved. In addition, also in the invention as described in Patent Document 3, it is mentioned that a fluorescent material including YAG is mixed with a resin and formed on the surface of the semiconductor light emitting device to enable a white light emitting apparatus with high light extraction efficiency to be obtained (see paragraph [0077], etc. in Patent Document 3).

Patent Document 4 discloses a light emitting apparatus with high light extraction efficiency by forming a concavo-convex structure on a light emitting exposed surface of a semiconductor light emitting device, and coating with a coating layer including fluorescent materials.

Further, Patent Document 5 discloses a semiconductor light emitting apparatus in which a light extraction layer made of resin material with a concavo-convex structure formed on its surface is provided on a layered semiconductor layer including a light emitting layer.

Furthermore, Patent Document 6 discloses the invention related to a substrate for semiconductor light emitting device and semiconductor light emitting device in which a pattern of nanosize is provided on the substrate and the pattern is provided with a long period of micro-order. According to Patent Document 6, it is mentioned that it is possible to suppress crystal defect dislocations in epitaxial growth in manufacturing an LED and to increase the internal quantum efficiency of the LED, the light extraction efficiency is also increased by providing the long period of micro-order, and that as a result the external quantum efficiency, which is defined by the product of the internal quantum efficiency and the light extraction efficiency, is also enhanced.

PRIOR ART DOCUMENT

Patent Document

[Patent Document 1] Japanese Unexamined Patent Publication No. 2004-15063
[Patent Document 2] Japanese Unexamined Patent Publication No. 2013-38447
[Patent Document 3] Japanese Unexamined Patent Publication No. 2003-318441
[Patent Document 4] Japanese Unexamined Patent Publication No. 2008-205511
[Patent Document 5] Japanese Unexamined Patent Publication No. 2007-35967
[Patent Document 6] International Publication Pamphlet No. 2013/031887

DISCLOSURE OF INVENTION

Problems to be Solved by the Invention

However, no mention has conventionally been made to structure for enabling luminous efficiency of a white light emitting apparatus to be enhanced in applying semiconductor light emitting devices provided with the concavo-convex structure as described in Patent Documents 3 to 6 to the white light emitting apparatus for emitting the emitted light and fluorescence as described in Patent Document 1 or 2.

Further, as described in Patent Document 3, in order to increase the luminous efficiency of an LED itself, techniques have been widely applied in which concavo-convex pattern of micro-order is provided on the substrate surface forming the LED.

As factors to determine external quantum efficiency EQE indicative of luminous efficiency of an LED, there are electron injection efficiency EIE, internal quantum efficiency IQE, and light extraction efficiency LEE. Among the factors, the internal quantum efficiency IQE is dependent on the dislocation density caused by crystal mismatch of the GaN-based semiconductor crystal. Further, the light extraction efficiency LEE is improved by disturbing the waveguide mode inside the GaN-based semiconductor crystal by light scattering due to the concavo-convex structure provided on the substrate.

In other words, as the roles (effects) of the concavo-convex pattern provided in a semiconductor light emitting device, there are (1) improvements in internal quantum efficiency IQE by decreasing dislocations inside the semiconductor crystal, and (2) improvements in light extraction efficiency LEE by resolving the waveguide mode.

However, in the techniques as described in Patent Document 3, improvements in light extraction efficiency LEE due to the effect of (2) are made, but the effect (1) of decreasing dislocations is considered a little. The reason why dislocation defects decrease by providing concavities and convexities on the surface of the substrate for semiconductor light emitting device is that a CVD growth mode of the GaN-based semiconductor layer is disturbed by the concavities and convexities, and that the dislocation defects associated with layer growth collide and disappear. Therefore, when concavo-convex patterns corresponding to the number of defects exist, it is effective in decreasing defects. However, in the number of concavo-convex patterns less than the number of defects, the effect of decreasing dislocations is limited. For example, in terms of nano-order, the dislocation density of $1\times10^9/cm^2$ corresponds to $10/\mu m^2$, and the dislocation density of $1\times10^8/cm^2$ corresponds to $1/\mu m^2$. When about two concavo-convex patterns are provided in 5 μm×5/μm (□5 μm), the concavo-convex pattern density is $0.08\times10^8/cm^2$, and when about two concavo-convex patterns are provided in 500 nm×500 nm (□500 nm), the concavo-convex pattern density is $8\times10^8/cm^2$. Thus, when the size of the concavo-convex pattern is made a pitch of nano-order, there is a significant effect in decreasing the dislocation density.

However, when the concavo-convex pattern density is fine, the scattering effect on light decreases, and there is a problem that the effect (2) of resolving the waveguide mode is reduced.

Therefore, in techniques as described in Patent Document 6, the concavo-convex pattern of nanosize is provided on the substrate, and the pattern is provided with a long period of micro-order to increase the external quantum efficiency of the LED.

In the techniques, as described above, the concavo-convex pattern of nanosize is to suppress crystal defect dislocations in epitaxial growth in LED manufacturing, and the internal quantum efficiency IQE of the LED is increased. Further, by providing an arrangement of the concavo-convex pattern of nanosize with a long period of micro-order, the light extraction efficiency LEE is increased, and as a result, it is also possible to increase the external quantum efficiency EQE which is defined by the product of the internal quantum efficiency IQE and the light extraction efficiency LEE.

However, in the above-mentioned techniques, the principal object is to increase the luminous efficiency of the LED itself, and therefore, there is a problem that the efficiency is decreased as compared with the efficiency of single-color emission, in the case of using the LED to which the above-mentioned techniques are applied, and applying to the white light emitting apparatus that emits the emitted light and fluorescence as described in Patent Document 1 or Patent Document 2. Further, there is another problem that color unevenness of the white color is observed. Particularly, in the case of illumination purposes, as an emission distribution of the white light emitting apparatus, a Lambertian type emission distribution with little angle dependence is required over all visible light wavelengths.

The above-mentioned problems are interpreted as described below. The long period structure of micro-order provided in the LED is set to be suitable for the emitted light. Therefore, it is considered that when the fluorescent material absorbs a part of the emitted light and emits fluorescence with a different wavelength from that of the emitted light, sufficient light scattering properties do not function. As a result, since the light extraction efficiency with respect to the fluorescence is lower than that of the emitted light, the efficiency is not increased in the entire white light from the white light emitting apparatus. Further, as in the foregoing, since light scattering properties are different between the emitted light and the fluorescence, the angle distributions are different, and as a result, the angle dependence is observed over all visible light wavelengths.

Further, in the semiconductor light emitting apparatus obtained by coating the semiconductor light emitting device provided with the concavo-convex structure on the light emitting exposed surface of the semiconductor light emitting device with the coating layer including fluorescent materials as described in Patent Document 4, the light extraction efficiency is increased in the first emitted light from the semiconductor light emitting device, but any effect is not found out in the light extraction efficiency of the fluorescence light from the fluorescent materials.

Similarly, also in the semiconductor light emitting apparatus as described in Patent Document 5, the effect is disclosed to increase the light extraction efficiency with respect to the first emitted light from the semiconductor light emitting device, but any effect is not found out in the light extraction efficiency of fluorescence light from fluorescent materials.

Further, in the case of coating the semiconductor light emitting device provided with the concavo-convex structure on the light emitting exposed surface of the semiconductor light emitting device using the coating layer including fluorescent materials of nanoparticles as described in Patent Document 2, there is a problem that the light extraction efficiency of the first emitted light from the semiconductor light emitting device is decreased, as compared with the case of using the coating layer including fluorescent materials of micro-order.

The above-mentioned problem is interpreted as described below. By forming the concavo-convex structure on the light emitting exposed surface of the semiconductor light emitting device, the diffraction or light scattering effect is produced, and the waveguide mode inside the semiconductor light emitting device is disturbed to increase the light extraction efficiency of the first emitted light. However, the diffractive index of the coating layer including the fluorescent materials of nanoparticles is approximated by effective medium approximation because of including the nanoparticles, the refractive index of the fluorescent materials is higher than that of a dispersion medium of the coating layer, and as a result, the refractive index of the coating layer is high. For example, in the case of dispersing a fluorescent material with a refractive index of 2.3 into a dispersion medium with a refractive index of 1.5 by a volume fraction of 40%, the refractive index of the coating layer is calculated as 1.80 from the following equations (A) and (B).

$$fa(\in a-\in)/(\in a+2\in)+fb(\in b-\in)/(\in b+2\in)=0 \quad (A)$$

$$n=\sqrt{\in} \quad (B)$$

Herein, fa and fb are respective volume fractions of a medium a and medium b, $\in a$, $\in b$ and $\in$ are respective dielectric constants of the medium a, medium b and effective medium, and n is a refractive index of the effective medium.

From the foregoing, the difference in the refractive index is decreased between the concavo-convex structure and the coating layer, and as a result, since the diffraction/dispersion effect due to the concavo-convex structure is reduced, it is considered that the light extraction efficiency of the first emitted light is decreased even when the concavo-convex structure is formed on the light emitting exposed surface of the semiconductor light emitting device.

Thus, in the conventional techniques, with respect to the emitted light from an LED, it is possible to satisfy both (1) the improvements in internal quantum efficiency IQE and (2) the improvements in light extraction efficiency LEE by resolving the waveguide mode due to light scattering, but in the white light emitting apparatus combined with the fluorescent materials, there are problems that sufficient luminous efficiency is not developed, and that the angle dependence exists in the emission distribution.

The present invention was made in view of the above-mentioned respects, and it is an, object of the invention to provide a semiconductor light emitting apparatus for enabling luminous efficiency to be enhanced for emitted light from an LED by increasing internal quantum efficiency IQE and light extraction efficiency LEE, and concurrently enabling luminous efficiency to be enhanced also for fluorescence by increasing light scattering properties. Further, it is another object to provide the semiconductor light emitting apparatus with little angle dependence of the emission distribution and easy to apply as industrial uses.

Means for Solving the Problem

A semiconductor light emitting apparatus of the present invention is a semiconductor light emitting apparatus having a semiconductor light emitting device having a layered semiconductor layer configured by layering at least two or more semiconductor layers and a light emitting layer to emit first light, and a wavelength conversion member that covers at least a part of the semiconductor light emitting device, absorbs at least a part of the first light and that emits second light with a wavelength different from that of the first light to be comprised thereof, and is characterized in that the semiconductor light emitting device is provided with a fine structure layer, as a component, including dots comprised of a plurality of convex portions or concave portions extending in an out-of-plane direction on one of main surfaces forming the semiconductor light emitting device, the fine structure layer forms a two-dimensional photonic crystal controlled by at least one of a pitch among the dots, a dot diameter and a dot height, and that the two-dimensional photonic crystal has at least two or more periods each of 1 μm or more.

In the semiconductor light emitting apparatus of the invention, it is preferable that the two-dimensional photonic crystal has at least two or more periods six or more times an optical wavelength of the first light and six or more times an optical wavelength of the second light.

Further, the semiconductor light emitting apparatus of the invention is a semiconductor light emitting apparatus having a semiconductor light emitting device having a layered semiconductor layer configured by layering at least two or more semiconductor layers, and a light emitting layer to emit first light, and a wavelength conversion member that covers at least a part of the semiconductor light emitting device, absorbs at least a part of the first light and that emits second light with a wavelength different from that of the first light to be comprised thereof, and is characterized in that the semiconductor light emitting device is provided with a fine structure layer, as a component, including dots comprised of a plurality of convex portions or concave portions extending in an out-of-plane direction on one of main surfaces forming the semiconductor light emitting device, the fine structure layer forms a two-dimensional photonic crystal controlled by at least one of a pitch among the dots, a dot diameter and a dot height, and that the two-dimensional photonic crystal has at least two or more periods six or more times an optical wavelength of the first light and six or more times an optical wavelength of the second light.

Further, in the semiconductor light emitting apparatus of the invention, it is preferable that the wavelength conversion member contains a first material transparent at least to the first light and the second light, and a second material that absorbs at least a part of the first light to emit the second light.

Furthermore, it is preferable that the fine structure layer is provided at least on an uppermost surface of the semiconductor light emitting device as a component, and that an intermediate material, which is substantially transparent at least to the first light and the second light and does not contain the second material, is filled, in between the fine structure layer and the wavelength conversion member.

Still furthermore, it is preferable that the second material has an average particle diameter smaller than the optical wavelength of the first light in the first material.

Moreover, in the semiconductor light emitting apparatus of the invention, it is preferable that the wavelength conversion member is configured to emit the second light and third light with a wavelength different from that of each of the first light and the second light, and contains a first material transparent at least to the first light, the second light and the third light, and a third material that absorbs at least a part of the first light to emit the third light, and that the two-dimensional photonic crystal has a period six or more times an optical wavelength of the third light.

Further, it is preferable that the fine structure layer is provided at least on an uppermost surface of the semiconductor light emitting device as a component, and that an intermediate material, which is substantially transparent at least to the first light, the second light and the third light and does not contain any of the second material and the third material, is filled in between the fine structure layer and the wavelength conversion member.

Furthermore, it is preferable that at least one of the second material and the third material has an average particle diameter smaller than the optical wavelength of the first light in the first material.

Moreover, in the semiconductor light emitting apparatus of the invention, it is preferable that the wavelength conversion member is configured to emit the second light, the third light, and fourth light with a wavelength different from that of each of the first light, the second light and the third light, and contains a first material transparent at least to the first light, the second light, the third light and the fourth light, and a fourth material that absorbs at least a part of the first light to emit the fourth light, and that the two-dimensional photonic crystal has a period six or more times an optical wavelength of the fourth light.

Further, it is preferable that the fine structure layer is provided at least on an uppermost surface of the semiconductor light emitting device as a component, and that an intermediate material, which is substantially transparent at least to the first light, the second light, the third light and the fourth light and does not contain any of the second material, the third material and the fourth material, is filled in between the fine structure layer and the wavelength conversion member.

Furthermore, it is preferable that at least one of the second material, the third material and the fourth material has an average particle diameter smaller than the optical wavelength of the first light in the first material.

Still furthermore, in the semiconductor light emitting apparatus of the invention, it is preferable that the two-dimensional photonic crystal is configured on two or more different main surfaces forming the semiconductor light emitting device, and the periods of respective two-dimensional photonic crystals are different from one another.

Moreover, in the semiconductor light emitting apparatus of the invention, the periods of the two-dimensional photonic crystal are capable of being configured to have periods at least in one axial direction of the main surface, or configured to have periods at least in independent two axial directions of the main surface.

Advantageous Effect of the Invention

According to the present invention, the two-dimensional photonic crystal forming the fine structure layer has at least two or more periods of 1 µm or more, or six or more times the optical wavelength of the first light and six or more times the optical wavelength of the second light (light with a wavelength different from that of the first light which is emitted in the wavelength conversion member by absorbing at least a part of the first light), and it is thereby possible to strengthen light scattering properties more than light diffraction properties. Therefore, in the semiconductor light emitting device of the invention, it is possible to develop light scattering properties strongly with respect to the emitted light from inside the semiconductor layer and the emitted light from the wavelength conversion member, and by the light scattering properties, it is possible to resolve the waveguide mode and increase the light extraction efficiency LEE. Further, it is possible to efficiently convert the wavelength of the first emitted light that is efficiently emitted from the semiconductor light emitting device. As a result, it is possible to enhance final luminous efficiency from the semiconductor light emitting apparatus. Furthermore, it is possible to provide the semiconductor light emitting apparatus with the angle dependence of the emission distribution made little and easy to apply as industrial uses.

BEST MODE FOR CARRYING OUT THE INVENTION

One Embodiment (hereinafter, abbreviated as "Embodiment") of the present invention will specifically be described below. In addition, the present invention is not limited to the following Embodiment, and is capable of being carried into practice with various modifications thereof within the scope of the subject matter thereof.

Semiconductor light emitting apparatuses according to this Embodiment will specifically be described below. The semiconductor light emitting apparatus in the present invention has a semiconductor light emitting device having a layered semiconductor layer configured by layering at least two or more semiconductor layers and a light emitting layer to emit first light, and a wavelength conversion member that covers at least apart of the semiconductor light emitting device, absorbs at least a part of the first light and that emits second light with a wavelength different from that of the first light to be comprised thereof.

Figure 1:
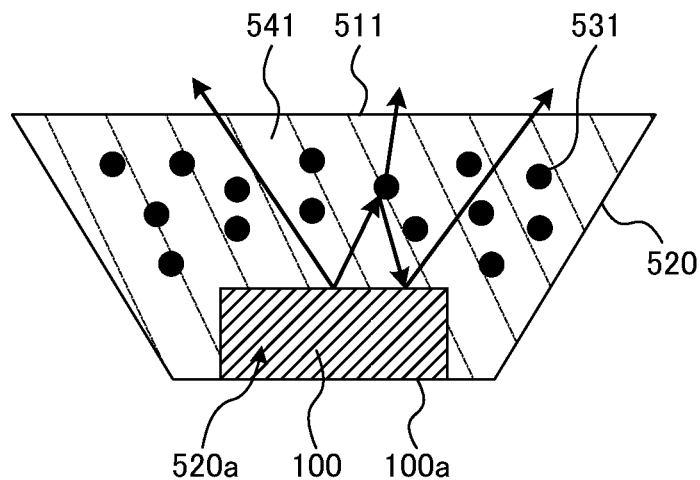
FIG. 1 is a cross-sectional schematic diagram of a semiconductor light emitting apparatus according to this Embodiment.

For example, the semiconductor light emitting apparatus of this. Embodiment is configured in a cross-sectional schematic diagram as shown in FIG. 1. As shown in FIG. 1, a semiconductor light emitting apparatus 500 has a configuration where a semiconductor light emitting device 100 is disposed inside a storage portion 520a of a package 520.

In the Embodiment as shown in FIG. 1, the package 520 is filled with a wavelength conversion member 511. Therefore, the apparatus has a structure where each surface except a backside 100a of the semiconductor light emitting device 100 is covered with the wavelength conversion member 511.

As shown in FIG. 1, the wavelength conversion member 511 has a filler 541 that is a first material substantially transparent to the center emission wavelength of emitted light (first light) from the semiconductor light emitting device 100, and a fluorescent material (second material) 531 which is contained and dispersed in the filler 541, and is comprised thereof. The fluorescent material 531 has a fluorescence property with respect to the center emission wavelength of the first light that is the emitted light emitted from the semiconductor light emitting device 100, absorbs at least a part of the first light, and emits fluorescence that is second light with a wavelength different from that of the first light. Further, the filler 541 is substantially transparent also to the fluorescence that is the second light, and is substantially transparent also to third light and fourth light described later.

Hereinafter, "substantially transparent" in the invention refers to a state in which absorption of light with the corresponding wavelength is little, and more specifically, absorptance of light with the corresponding wavelength is 10% or less, preferably 5% or less, and more preferably 2% or less. Alternatively, "substantially transparent" is defined as that transmittance of light with the corresponding wavelength is 80% or more, preferably 85% or more, and more preferably 90% or more.

The filler 541 is capable of being an organic substance or an inorganic substance, and for example, of being made of epoxy, acrylic polymer, polycarbonate, silicone polymer, optical glass, chalcogenide glass, spiro compound, and materials containing a mixture thereof, but is not particularly limited in the material.

Further, the filler 541 may contain fine particles substantially transparent to the first light, the second light, the third light and the fourth light. By containing fine particles, heat resistance, durability, weather resistance, and thermal dimensional stability are improved, and therefore, such a filler is preferable.

The fine particles contained in the filler 541 are not particularly limited, and it is possible to use metal oxides, metal nitrides, nitridosilicate and their mixtures. As examples of suitable metal oxides, it is possible to contain calcium oxide, cerium oxide, hafnium oxide, titanium oxide, zinc oxide, zirconium oxide and their mixtures.

In the emitted light from the semiconductor light emitting apparatus 500 is observed a mixed color of the first light emitted from the semiconductor light emitting device 100 and the second color that is fluorescence from the wavelength conversion member 511. For example, in the case where the first light is blue with the center emission wavelength near 450 nm and the second light is fluorescence from a yellow fluorescent material with the main wavelength near 590 nm, the emitted light of the semiconductor light emitting apparatus 500 is observed as white.

Wavelengths of the first light and the second light are not limited particularly, and as described above, are selected arbitrarily so that the emitted light color from the semiconductor light emitting apparatus 500 exhibits a color corresponding to the purpose. In addition, since the second light that is fluorescence is obtained by absorbing the first light, the wavelength of the second light is certainly longer than that of the first light.

Further, it is not necessary that both the first light and the second light is visible light, and for example, the first light may be ultraviolet light having a wavelength of 410 nm or less, while the second light may be green. In this case, as the emitted light from the semiconductor light emitting apparatus 500, single-color light is only observed. As the emitted light from the semiconductor light emitting apparatus 500, it is possible to select various kinds corresponding to the purpose, and corresponding thereto, various kinds are selected in the configuration of the semiconductor light emitting device 100 and the material of the fluorescent material 531.

A part of the emitted light from the semiconductor light emitting device 100 is absorbed in the fluorescent material 531 to emit fluorescence. The fluorescence is guided to outside the system of the semiconductor light emitting apparatus 500 without modification, and as shown in FIG. 1, a part thereof is scattered and returns to the semiconductor light emitting device 100. At this point, by a fine structure layer provided in the semiconductor light emitting device 100, described later, the fluorescence undergoes scattering, and is guided to outside the system of the semiconductor light emitting apparatus 500. As distinct from this. Embodiment, when the fine structure layer is not provided in the semiconductor light emitting device 100, the angle of the light returned to the semiconductor light emitting apparatus 500 is not changed, apart of the light becomes the waveguide mode to generate a phenomenon that the light is not guided to outside the system of the semiconductor light emitting apparatus 500, and as a result, the luminous efficiency of the semiconductor light emitting apparatus 500 is decreased.

Figure 2:
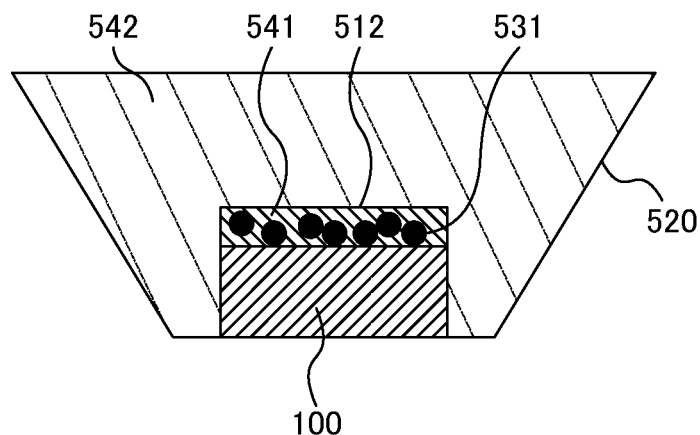
FIG. 2 is a cross-sectional schematic diagram showing another example of the semiconductor light emitting apparatus according to this Embodiment.

FIG. 2 is a cross-sectional schematic diagram showing another example of the semiconductor light emitting apparatus according to this Embodiment. In a semiconductor light emitting apparatus 501, a part of the light emitting surface of the semiconductor light emitting device 100 installed in the package 520 is covered with a wavelength conversion member 512. As shown in FIG. 2, the inside of the package 520 is filled with a sealant 542. The wavelength conversion member 512 has the filler 541 substantially transparent to the emitted light from the semiconductor light emitting device 100, and a fluorescent material 531 which is contained and dispersed in the filler 541, and is comprised thereof.

In the semiconductor light emitting apparatus 501 as shown in FIG. 2, as in the semiconductor light emitting apparatus 500 of FIG. 1 as described above, the emitted light (first light) from the semiconductor light emitting device 100 and the fluorescence (second light) from the fluorescent material 531 undergoes scattering due to the fine structure layer provided in the semiconductor light emitting device 100, and is efficiently guided to outside the system of the semiconductor light emitting apparatus 501. In the semiconductor light emitting apparatus 501 of FIG. 2, the volume of the wavelength conversion member 512 is smaller than that in the semiconductor light emitting apparatus 500 of FIG. 1, the emitted light from the semiconductor light emitting device 100 and fluorescence is harder to undergo scattering from the fluorescent material 531, and therefore, stronger scattering properties are required for the fine structure layer provided in the semiconductor light emitting device 100. Thus, according to the configuration, use and the like of the semiconductor light emitting apparatus, it is possible to design the fine structure layer provided in the semiconductor light emitting device 100 as appropriate.

As the sealant 542 used in the semiconductor light emitting apparatus 501 as shown in FIG. 2, for example, it is possible to use the same transparent member as the filler 541 used in the wavelength conversion member 512.

Figure 3:
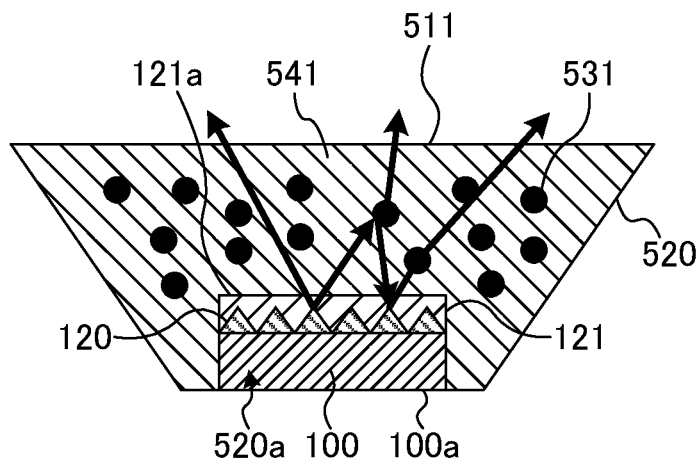
FIG. 3 is a cross-sectional schematic diagram showing still another example of the semiconductor light emitting apparatus according to this Embodiment.

FIG. 3 is a cross-sectional schematic diagram showing still another example of the semiconductor light emitting apparatus according to this Embodiment. As shown in FIG. 3, a semiconductor light emitting apparatus 510 has a configuration where the semiconductor light emitting device 100 is disposed inside the storage portion 520a of the package 520.

In the Embodiment as shown in FIG. 3, the package 520 is filled with the wavelength conversion member 511. Further, the semiconductor light emitting device 100 is provided on its uppermost surface with a fine structure layer 120 including dots comprised of concave portions or convex portions, as a component.

As shown in FIG. 3, an intermediate material 121 exists between the fine structure layer 120 and the wavelength conversion member 511, and the fine structure layer 120 is not brought into contact with the wavelength conversion member 511. In other words, the intermediate material 121 is formed between the uppermost surface of the fine structure layer 120 and the surface opposed to the fine structure layer 120 of the wavelength conversion member 511 with a thickness.

As shown in FIG. 3, the intermediate material 121 is filled in between dots comprised of convex portions of the fine structure layer 120. Alternatively, in a form where the dots are comprised of concave portions, the intermediate material 121 is filled inside the concave portions. Accordingly, the entire space of from the surface of the fine structure layer 120 to the wavelength conversion member 511 is filled with the intermediate material 121.

The intermediate material 121 as shown in FIG. 3 is cured and hardened after coating. The intermediate material 121 may be formed according to waviness of the surface of the fine structure layer 120, and as shown in FIG. 3, a surface 121a of the intermediate material 121 (intermediate layer) may be formed of a plat surface.

Alternatively, it is possible to make a form where the intermediate material 121 is filled only in between dots comprised of convex portions of the fine structure layer 120 or only inside dots formed of concave portions. In such a configuration, the material 121 contacts at least a part between the uppermost surface of the fine structure layer 120 and the surface opposed to the fine structure layer 120 of the wavelength conversion member 511. In addition, such a configuration is also defined as the configuration the intermediate material 121 exists (is filled in) between the fine structure layer 120 and the wavelength conversion member 511.

In addition, such a form is preferable that the intermediate material 121 exists between the fine structure layer 120 and the wavelength conversion member 511, and that the fine structure layer 120 is not in contact with the wavelength conversion member 511.

Also in FIG. 3, the wavelength conversion member 511 has the filler 541 that is the first material substantially transparent to the center emission wavelength of emitted light (first light) from the semiconductor light emitting device 100, and the fluorescent material (second material) 531 which is contained and dispersed in the filler 541, and is comprised thereof. The fluorescent material 531 has a fluorescence property with respect to the center emission wavelength of the first light that is the emitted light emitted from the semiconductor light emitting device 100, absorbs at least a part of the first light, and emits fluorescence that is the second light with a wavelength different from that of the first light. Further, the filler 541 is substantially transparent also to the fluorescence that is the second light, and is substantially transparent also to the third light and the fourth light described later.

The intermediate material 121 filled in between dots of the fine structure layer 120 is substantially transparent to the center emission wavelength of the emitted light (first light) from the semiconductor light emitting device 100. Further, the material 121 is substantially transparent also to the fluorescence that is the second light, and is further substantially transparent also to the third light and the fourth light described later.

The intermediate material 121 is capable of being an organic substance or an inorganic substance, and for example, of being made of epoxy, acrylic polymer, polycarbonate, silicone polymer, optical glass, chalcogenide glass, spiro compound, and materials containing a mixture thereof, but is not particularly limited in the material.

The intermediate material 121 may be the same material or different material as/from that of the filler 541. In addition, in the case where the same material is used in the intermediate material 121 and the filler 541, it is possible to effectively increase light emission characteristics, and such a case is suitable. For example, it is possible to select a silicone resin for the intermediate material 121 and the filler 541.

Further, the intermediate material 121 may contain fine particles substantially transparent to the first light, the second light, the third light and the fourth light. By containing fine particles, heat resistance, durability, weather resistance, and thermal dimensional stability are improved, and therefore, such a material is preferable.

The fine particles contained in the intermediate material 121 are not limited particularly, but it is not preferable that the effective refractive index increases in the intermediate material 121 filled in between dots of the fine structure layer 120, and it is preferable that the refractive index is substantially equal to that of the intermediate material 121 or less. Herein, "substantially equal" is that the difference in the refractive index from the intermediate material 121 is 0.1 or less. In the case where the difference in the refractive index is 0.1 or less, when the fine particles contained in the intermediate material 121 have a volume fraction of 50% or less, the effective refractive index of the intermediate material 121 containing the fine particles is equal to the refractive index of only the intermediate material 121, and such a case is preferable. The fine particles contained in the intermediate material 121 are not particularly limited, and it is possible to use metal oxides, metal nitrides, nitridosilicate and their mixtures. As examples of suitable metal oxides, it is possible to contain silicon oxide, calcium oxide, cerium oxide, hafnium oxide, titanium oxide, zinc oxide, zirconium oxide and their mixtures. Further, the fine particles may be the same material as the fine particles contained in the filler 541 as described previously.

In this Embodiment, in between the fine structure layer 120 and the wavelength conversion member 511, the intermediate material 121 is filled, but the fluorescent material (second material) 531 is not contained. In the case where the fine structure layer 120 is formed of dots of convex portions, the fluorescent material (second material) 531 does not exist between dots. Further, in the case where the fine structure layer 120 is formed of dots of concave portions, the fluorescent material (second material) 531 does not exist inside the dots. Accordingly, there is the configuration where only the intermediate material 121 exists between the fine structure layer 120 and the wavelength conversion member 511, or the intermediate material 121 containing the fine particles exists. Since the fluorescent material 531 is thus not filled in between dots or inside the dots of the fine structure layer 120, the effective refractive index between dots or inside the dots does not increase, and the efficiency of diffraction or scattering due to the fine structure layer 120 does not decrease with respect to the first light from the semiconductor light emitting device 100. As a result, also when the wavelength conversion member 511 is provided so as to cover at least a part of the semiconductor light emitting device 100, it is possible to prevent the light extraction efficiency from the semiconductor light emitting apparatus 500 from decreasing.

As distinct from this Embodiment, when the fluorescent material 531 exists between dots or inside the dots of the fine structure layer 120 of the semiconductor light emitting device 100 and the effective refractive index increases between dots or inside the dots, since the diffraction or scattering efficiency due to the fine structure layer 120 decreases with respect to the fluorescence, such a phenomenon occurs that guiding to outside the system of the semiconductor light emitting apparatus 100 is prevented, and as a result, the luminous efficiency decreases in the semiconductor light emitting apparatus 510.

Figure 4:
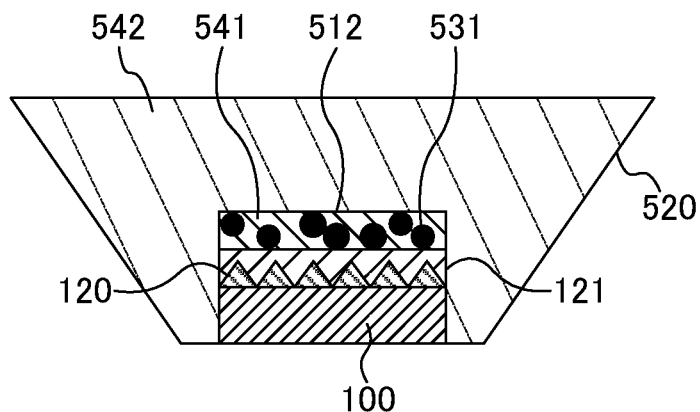
FIG. 4 is a cross-sectional schematic diagram showing still another example of the semiconductor light emitting apparatus according to this Embodiment.

FIG. 4 is a cross-sectional schematic diagram showing still another example of the semiconductor light emitting apparatus according to this Embodiment. In a semiconductor light emitting apparatus 508, a part of the light emitting surface of the semiconductor light emitting device 100 installed in the package 520 is covered with the wavelength conversion member 512. As shown in FIG. 4, the inside of the package 520 is filled with the sealant 542. The wavelength conversion member 512 has the filler 541 substantially transparent to the emitted light from the semiconductor light emitting device 100, and the fluorescent material 531 which is contained and dispersed in the filler 541, and is comprised thereof.

Also in the semiconductor light emitting apparatus 508 as shown in FIG. 4, as in the semiconductor light emitting apparatus 510 of FIG. 3 as described above, the emitted light (first light) from the semiconductor light emitting device 100 and the fluorescence (second light) from the fluorescent material 531 undergoes scattering due to the fine structure layer 120 provided in the semiconductor light emitting device 100, and is efficiently guided to outside the system of the semiconductor light emitting apparatus 508. In the semiconductor light emitting apparatus 508 of FIG. 4, the volume of the wavelength conversion member 512 is smaller than that in the semiconductor light emitting apparatus 510 of FIG. 3, the emitted light from the semiconductor light emitting device 100 and fluorescence is harder to undergo scattering from the fluorescent material 531, and therefore, stronger scattering properties are required for the fine structure layer 120 provided in the semiconductor light emitting device 100. Thus, according to the configuration, use and the like of the semiconductor light emitting apparatus, it is possible to design the fine structure layer 120 provided in the semiconductor light emitting device 100 as appropriate.

Also in FIG. 4, the intermediate material 121 that does not contain the fluorescent material 531 exists between the fine structure layer 120 provided in the semiconductor light emitting device 100 and the wavelength conversion member 512, and the fine structure layer 120 is not brought into contact with the wavelength conversion member 512.

As the sealant 542 used in the semiconductor light emitting apparatus 508 as shown in FIG. 4, for example, it is possible to use the same transparent member as the filler 541 used in the wavelength conversion member 512.

Figure 5:
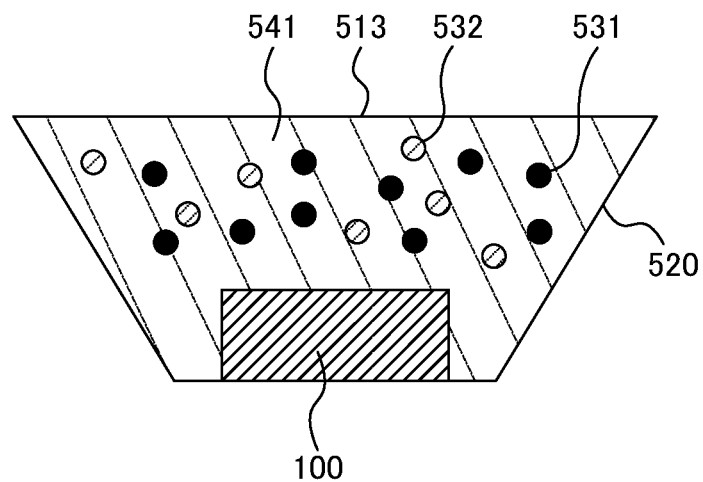
FIG. 5 is a cross-sectional schematic diagram showing still another example of the semiconductor light emitting apparatus according to this Embodiment.

FIG. 5 is a cross-sectional schematic diagram showing still another example of the semiconductor light emitting apparatus according to this Embodiment. In a semiconductor light emitting apparatus 502 of FIG. 5, the semiconductor light emitting device 100 installed in the package 520 is covered with a wavelength conversion member 513 as in FIG. 1. The wavelength conversion member 513 is comprised of the filler 541 that is the first material substantially transparent to the center emission wavelength of the emitted light that is the first light from the semiconductor light emitting device 100, and the fluorescent material 531 and fluorescent material 532 which are contained and dispersed in the filler 541.

The fluorescent material 532 has a fluorescence property with respect to the center emission wavelength of the first light that is the emitted light emitted from the semiconductor light emitting device 100, and is a third material which absorbs at least a part of the first light, and emits fluorescence that is the third light with a wavelength different from those of the first light and second light. In the emitted light from the semiconductor light emitting apparatus 502 is observed a mixed color of the first light emitted from the semiconductor light emitting device 100, and the second light and the third light that is fluorescence from the wavelength conversion member. For example, in the case where the first light is blue with the center emission wavelength near 450 nm, the second light is green with the main wavelength near 545 nm, and the third light is red with the main wavelength near 700 nm, the emitted light of the semiconductor light emitting apparatus 502 is recognized as white.

Further, the filler 541 is substantially transparent also to the second light and the third light.

Wavelengths of the first light, the second light and the third light are not limited particularly, and as described above, are selected arbitrarily so that the emitted light color from the semiconductor light emitting apparatus 502 exhibits a color corresponding to the purpose. In addition, since the second light and third light that is fluorescence is obtained by absorbing the first light, the wavelengths of the second light and the third light are certainly longer than that of the first light.

In the semiconductor light emitting apparatus 502 of FIG. 5, a part of the second light and third light is scattered, and returns to the semiconductor light emitting device 100. Then, due to the fine structure layer provided in the semiconductor light emitting device 100, the light undergoes scattering, and is guided to outside the system of the semiconductor light emitting apparatus 502. By such action, it is possible to increase the luminous efficiency of the semiconductor light emitting apparatus 502.

In the semiconductor light emitting apparatus 502 as shown in FIG. 5, as in the semiconductor light emitting apparatus 501 as shown in FIG. 2, it is also possible to make a configuration where a part of the light emitting surface of the semiconductor light emitting device 100 is covered with the wavelength conversion member 513 that the fluorescent materials 531 and 532 are dispersed inside the filler 541, and further the inside of the package 520 is filled with the sealant 542 of FIG. 2.

Figure 6:
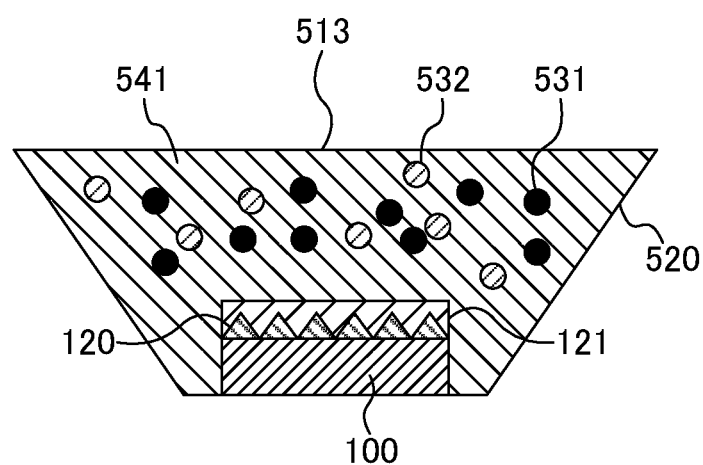
FIG. 6 is a cross-sectional schematic diagram showing still another example of the semiconductor light emitting apparatus according to this Embodiment.

FIG. 6 is a cross-sectional schematic diagram showing still another example of the semiconductor light emitting apparatus according to this Embodiment. In a semiconductor light emitting apparatus 509 of FIG. 6, the semiconductor light emitting device 100 installed in the package 520 is covered with the wavelength conversion member 513 as in FIG. 5. The wavelength conversion member 513 is comprised of the filler 541 that is the first material substantially transparent to the center emission wavelength of the emitted light that is the first light from the semiconductor light emitting device 100, and the fluorescent material (second material) 531 and fluorescent material (third material) 532 which are contained and dispersed in the filler 541.

In FIG. 6, the intermediate material 121 that does not contain any of the fluorescent materials 531 and 532 exists between the fine structure layer 120 provided in the semiconductor light emitting device 100 and the wavelength conversion member 513, and the fine structure layer 120 is not brought into contact with the wavelength conversion member 513.

In the semiconductor light emitting apparatus 509 of FIG. 6, a part of the second light and third light is scattered, and returns to the semiconductor light emitting device 100. Then, due to the fine structure layer 120 provided in the semiconductor light emitting device 100, the light undergoes scattering, and is guided to outside the system of the semiconductor light emitting apparatus 509. By such action, it is possible to increase the luminous efficiency of the semiconductor light emitting apparatus 509.

In the semiconductor light emitting apparatus 509 as shown in FIG. 6, as in the semiconductor light emitting apparatus 508 as shown in FIG. 4, it is also possible to make a configuration where a part of the light emitting surface of the semiconductor light emitting device 100 is covered with the wavelength conversion member 513 that the fluorescent materials 531 and 532 are dispersed inside the filler 541, and further the inside of the package 520 is filled with the sealant 542 of FIG. 4. Also in this case, there is the structure that the intermediate material 121 that does not contain the fluorescent materials 531 and 532 exists between the fine structure layer 120 provided on the surface of the semiconductor light emitting device 100 and the wavelength conversion member 513, and that the fine structure layer 120 and the wavelength conversion member 513 are directly not in contact with each other.

Figure 7:
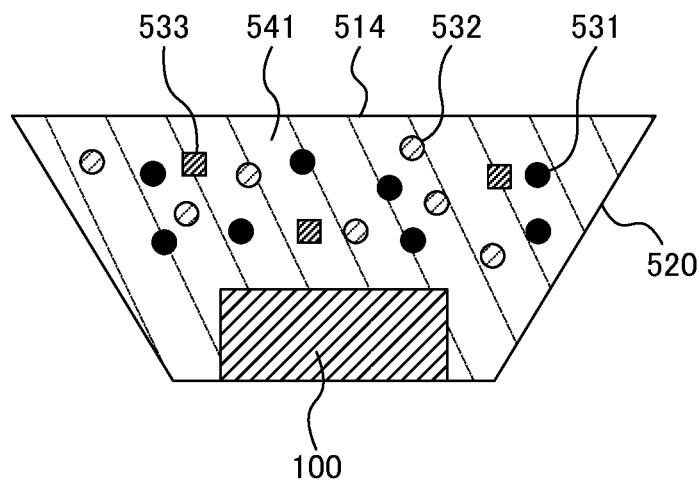
FIG. 7 is a cross-sectional schematic diagram showing still another example of the semiconductor light emitting apparatus according to this Embodiment.

FIG. 7 is a cross-sectional schematic diagram showing still another example of the semiconductor light emitting apparatus according to this Embodiment. In a semiconductor light emitting apparatus 503 of FIG. 7, the semiconductor light emitting device 100 installed in the package 520 is covered with a wavelength conversion member 514. The wavelength conversion member 514 is comprised of the filler 541 that is the first material substantially transparent to the center emission wavelength of the emitted light from the semiconductor light emitting device 100, and the fluorescent material 531, fluorescent material 532 and fluorescent material 533 which are contained and dispersed in the filler 541.

The fluorescent material 533 has a fluorescence property with respect to the center emission wavelength of the first light that is the emitted light emitted from the semiconductor light emitting device 100, absorbs at least a part of the first light, and emits fluorescence that is the fourth light with a wavelength different from those of the first light, second light and third light. In the emitted light from the semiconductor light emitting apparatus 503 is observed a mixed color of the first light emitted from the semiconductor light emitting device 100, and the second color, third light and fourth light that is fluorescence from the wavelength conversion member 514. For example, in the case where the first light is UV light with the center emission wavelength near 360 nm, the second light is green with the main wavelength near 545 nm, the third light is red with the main wavelength near 700 nm and the fourth light is blue with the main wavelength near 436 nm, the emitted light of the semiconductor light emitting apparatus 503 is recognized as white.

Further, the filler 541 is substantially transparent also to each light of the second light, the third light and the fourth light.

Wavelengths of the first light, the second light, the third light and the fourth light are not limited particularly, and as described above, are selected arbitrarily so that the emitted light color from the semiconductor light emitting apparatus 503 exhibits a color corresponding to the purpose. In addition, since the second light, the third light and the fourth light that is fluorescence is obtained by absorbing the first light, the wavelengths of the second light, the third light and the fourth light are certainly longer than that of the first light.

In the semiconductor light emitting apparatus 503 as shown in FIG. 7, a part of the second light, third light and fourth light is scattered, and returns to the semiconductor light emitting device 100. Then, due to the fine structure layer provided in the semiconductor light emitting device 100, the light undergoes scattering, and is guided to outside the system of the semiconductor light emitting apparatus 503. By such action, it is possible to increase the luminous efficiency of the semiconductor light emitting apparatus 503.

Figure 8:
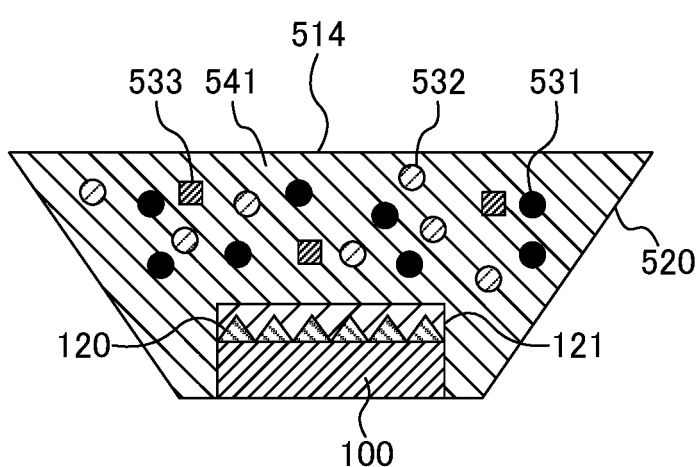
FIG. 8 is a cross-sectional schematic diagram showing still another example of the semiconductor light emitting apparatus according to this Embodiment.

FIG. 8 is a cross-sectional schematic diagram showing still another example of the semiconductor light emitting apparatus according to this Embodiment. A semiconductor light emitting apparatus 515 of FIG. 8 has a configuration that the semiconductor light emitting device 100 installed in the package 520 is covered with the wavelength conversion member 514. The wavelength conversion member 514 is comprised of the filler 541 that is the first material substantially transparent to the center emission wavelength of the emitted light that is the first light from the semiconductor light emitting device 100, and the fluorescent material (second material) 531, fluorescent material (third material) 532 and fluorescent material (fourth material) 533 which are contained and dispersed in the filler 541.

In FIG. 8, the intermediate material 121 that does not contain any of the fluorescent materials 531, 532 and 533 exists between the fine structure layer 120 provided in the semiconductor light emitting device 100 and the wavelength conversion member 514, and the fine structure layer 120 is not brought into contact with the wavelength conversion member 514.

Further, the filler 541 and the intermediate material 121 are substantially transparent also to each light of the second light, the third light and the fourth light.

Also in the semiconductor light emitting apparatus 515 as shown in FIG. 8, a part of the second light, third light and fourth light is scattered, and returns to the semiconductor light emitting device 100. Then, due to the fine structure layer 120 provided in the semiconductor light emitting device 100, the light undergoes scattering, and is guided to outside the system of the semiconductor light emitting apparatus 515. By such action, it is possible to increase the luminous efficiency of the semiconductor light emitting apparatus 515.

The fluorescent materials 531, 532 and 533 are not limited particularly, as long as the materials absorb at least a part of the first light to emit predetermined fluorescence, and examples thereof are yttrium aluminium garnet, sulfur-substituted aluminate, non-substituted aluminate, alkali earth metal boric acid halogen compound, alkali earth metal aluminate, alkali earth silicate, alkali earth thiogallate, alkali earth silicon nitride, germanate, phosphate, silicate, selenide, sulfide, nitride, oxynitride, and their mixtures. For example, it is possible to dope a lanthanide-series element such as Ce and Eu to these materials to activate. Further, in addition to Ce and Eu, it is also possible to contain at least one or more elements selected from Tb, Cu, Ag, Cr, Nd, Dy, Co, Ni, Ti and Mg.

It is preferable that each of the fluorescent materials 531, 532 and 533 has an average particle diameter smaller than the optical wavelength of the first light in the filler (first material) 541. When the material is a fluorescent particle with an average particle diameter smaller than the optical wavelength of the first light in the first material i.e. a nano-particle diameter, it is possible to reduce optical scattering properties due to the fluorescent particles, and increase the light extraction efficiency from the semiconductor, light emitting apparatus. Further, since, the material is the fluorescent particle with a nano-particle diameter, it is possible to efficiently convert the wavelength of the first emitted light (first light) emitted from the semiconductor light emitting device, and it is thereby possible to further increase the light extraction efficiency. Herein, the average particle diameter in the present invention is a mass average particle diameter of a first particle of the fluorescent particle, and is capable of being obtained using a transmission electron microscope (TEM) by the method as described in JIS Z8827.

In FIGS. 5 and 6, at least one of the fluorescent materials 531 and 532 is required to have an average particle diameter smaller than the optical wavelength of the first light in the filler (first material) 541, and it is preferable that all the fluorescent materials 531 and 532 have average particle diameters smaller than the optical wavelength of the first light in the filler (first material) 541.

Further, in FIGS. 7 and 8, at least one of the fluorescent materials 531, 532 and 533 is required to have an average particle diameter smaller than the optical wavelength of the first light in the filler (first material) 541, and it is preferable that all the fluorescent materials 531, 532 and 533 have average particle diameters smaller than the optical wavelength of the first light in the filler (first material) 541.

It is preferable that each of the fluorescent materials 531, 532 and 533 is in the shape of a particle. In addition, the shape is not limited to the shape of a sphere, and may be the shape of a polygon, the shape of an ellipse or the like.

The semiconductor light emitting device 100 constituting a part of the semiconductor light emitting apparatus of this Embodiment will specifically be described next.

Figure 9:
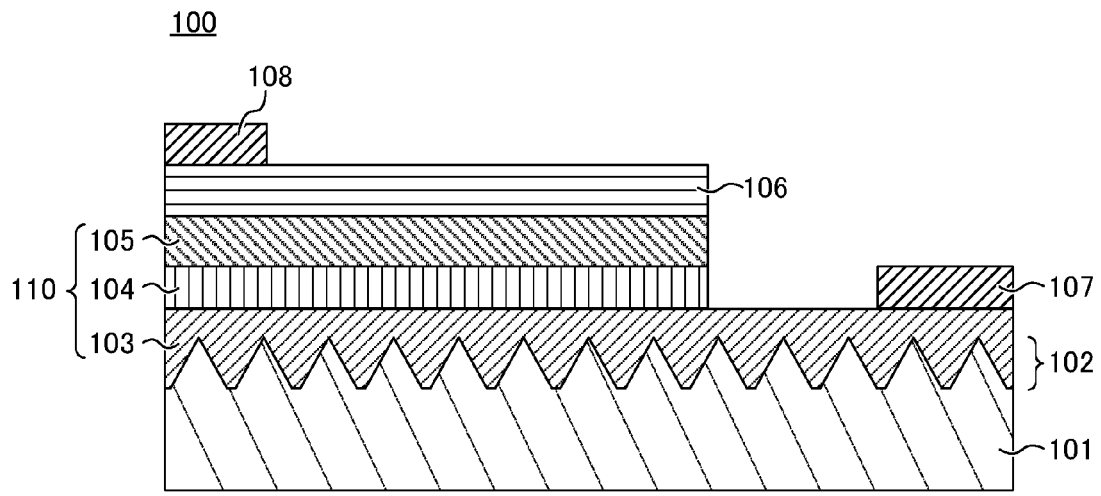
FIG. 9 is a cross-sectional schematic diagram of a semiconductor light emitting device according to this Embodiment.

FIG. 9 is a cross-sectional schematic diagram of the semiconductor light emitting device in the semiconductor light emitting apparatus according to this Embodiment. As shown in FIG. 9, in the semiconductor light emitting device 100, an n-type semiconductor layer 103, light emitting layer 104 and p-type semiconductor layer 105 are sequentially layered on a two-dimensional photonic crystal 102 provided on one main surface of a substrate 101 for semiconductor light emitting device. In addition, the n-type semiconductor layer 103, light emitting layer 104 and p-type semiconductor layer 105 sequentially layered on the substrate 101 for semiconductor light emitting device are referred to as a layered semiconductor layer 110. Herein, the "main surface" refers to a wide surface constituting the substrate 101 for semiconductor light emitting device and layer, and for example, is a layer surface (formation surface) in layering the layered semiconductor layer 110 or an opposite surface to the layer surface. The "main surface" includes space between the substrate for semiconductor light emitting device and the layer, interfaces between layers, exposed frontsides of the substrate 101 for semiconductor light emitting device and the layer, and exposed backsides.

The photonic crystal is a nano-structure body in which the refractive index (dielectric constant) varies periodically, and the two-dimensional photonic crystal refers to a two-dimensional period structure body.

As shown in FIG. 9, a transparent conductive film 106 is formed on the p-type semiconductor layer 105. Further, a cathode electrode 107 is formed on the n-type semiconductor layer 103 surface, and an anode electrode 108 is formed on the transparent conductive film 106 surface. In addition, in FIG. 9, the layered semiconductor layer 110 is formed on the two-dimensional photonic crystal 102 provided on one main surface of the substrate 101 for semiconductor light emitting device. Alternatively, the layered semiconductor layer 110 may be formed on the other main surface opposed to the surface with the two-dimensional photonic crystal 102 provided of the substrate 101 for semiconductor light emitting device.

Figure 10:
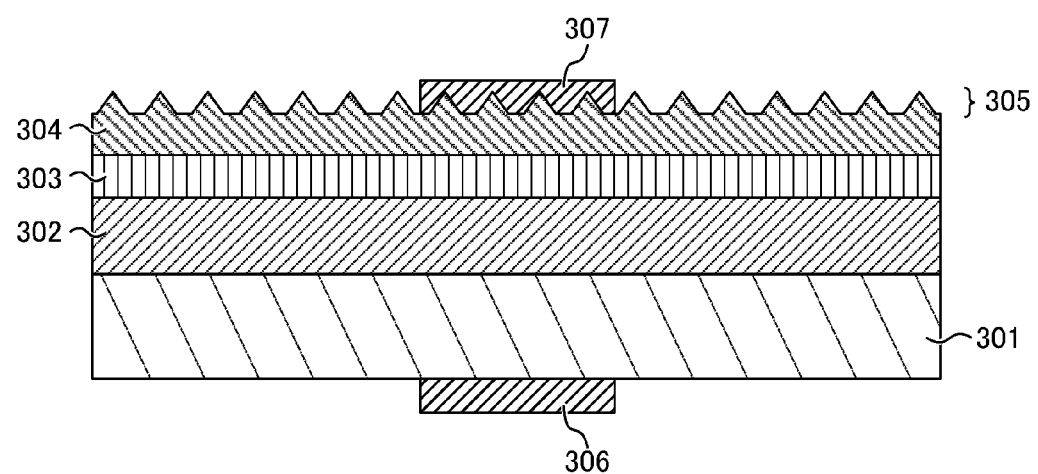
FIG. 10 is a cross-sectional schematic diagram showing another example of the semiconductor light emitting device according to this Embodiment.

FIG. 10 is a cross-sectional schematic diagram showing another example of the semiconductor light emitting device according to this Embodiment. As shown in FIG. 10, in a semiconductor light emitting device 300, a p-type semiconductor layer 302, light emitting layer 303 and n-type semiconductor layer 304 are sequentially layered on a substrate 301 for semiconductor light emitting device. Then, a two-dimensional photonic crystal 305 is provided on one main surface (exposed surface) of the n-type semiconductor layer 304.

Further, as shown in FIG. 10, an anode electrode 306 is formed on the main surface on the side opposite to the main surface in contact with the p-type semiconductor layer 302 of the substrate 301 for semiconductor light emitting device, and a cathode electrode 307 is formed on the surface of the n-type semiconductor layer 304.

In FIG. 10, a method of manufacturing the semiconductor light emitting device is adopted in which the n-type semiconductor layer 304, light emitting layer 303 and p-type semiconductor layer 302 are sequentially layered on a substrate not shown, and then, are bonded to the substrate 301 for semiconductor light emitting device, and the substrate is peeled off. After peeling off the substrate, each of the anode electrode 306 and the cathode electrode 307 is formed to obtain the semiconductor light emitting device in the semiconductor light emitting apparatus of this Embodiment. After providing the n-type semiconductor layer on the substrate, peeling is carried out in the interface with the n-type semiconductor-layer, and therefore, the two-dimensional photonic crystal 305 is transferred and formed.

Figure 11:
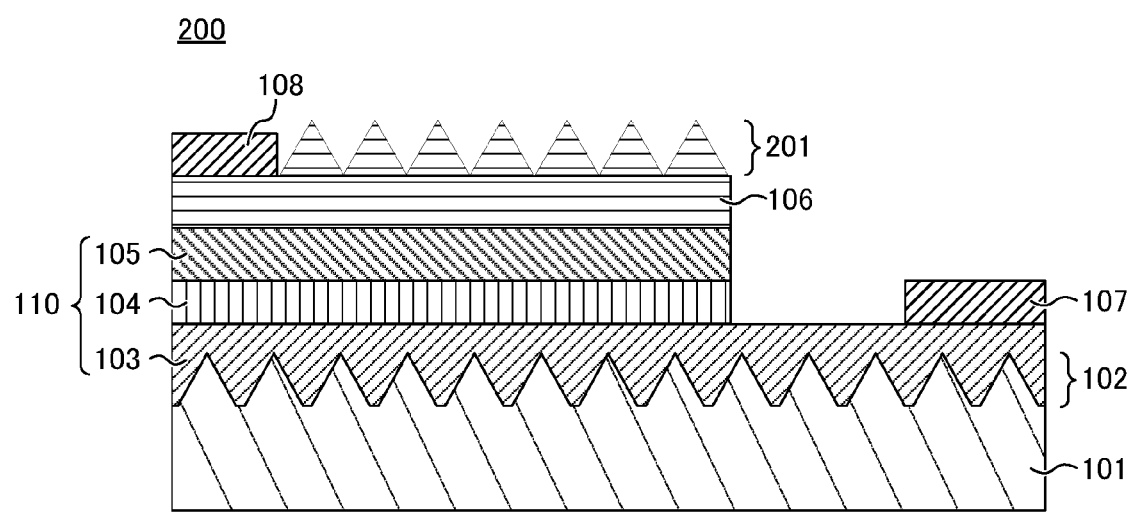
FIG. 11 is a cross-sectional schematic diagram showing still another example of the semiconductor light emitting device according to this Embodiment.

FIG. 11 is a cross-sectional schematic diagram showing another example of the semiconductor light emitting device according to this Embodiment. As shown in FIG. 11, in a semiconductor light emitting device 200, a two-dimensional photonic crystal 201 is formed on the main surface (exposed surface) of the transparent conductive film 106 shown in FIG. 9. As described later, in the two-dimensional photonic crystal of this Embodiment, it is necessary to have at least two or more periods. As shown in FIG. 11, in the semiconductor light emitting device 200, as components, the two-dimensional photonic crystals 102 and 201 are respectively provided on different main surfaces of the semiconductor light emitting apparatus. In the case of providing two or more two-dimensional photonic crystals 102, 201, it is not necessary that each of the two-dimensional photonic crystals 102 and 201 has two or more periods, and two or more two-dimensional photonic crystals 102, 201 with different periods may be components of the semiconductor light emitting apparatus. The light emitted from the semiconductor light emitting device and the light emitted from the wavelength conversion member undergoes diffraction and scattering effects in the interface forming the two-dimensional photonic crystal due to transmission, reflection, diffraction and scattering inside the semiconductor light emitting apparatus. The effects do not need to be in the same interface, and any of different interfaces and the same interface exhibits the same effects. Therefore, it is possible to develop the effects of the present invention by providing two or more periods in either the different interfaces or the same interface.

The semiconductor light emitting devices 100, 200 and 300 as shown in FIGS. 9 to 11 are of the example of applying this Embodiment to the semiconductor light emitting device of double-hetero structure, but the layered structure of the layered semiconductor layer is not limited thereto. Further, a buffer layer or undoped semiconductor layer, not shown, may be provided between the substrate for semiconductor light emitting device and the n-type semiconductor layer. Furthermore, a reflecting layer not shown may be provided in the interface between the substrate for semiconductor light emitting device and the semiconductor layer.

Figure 12:
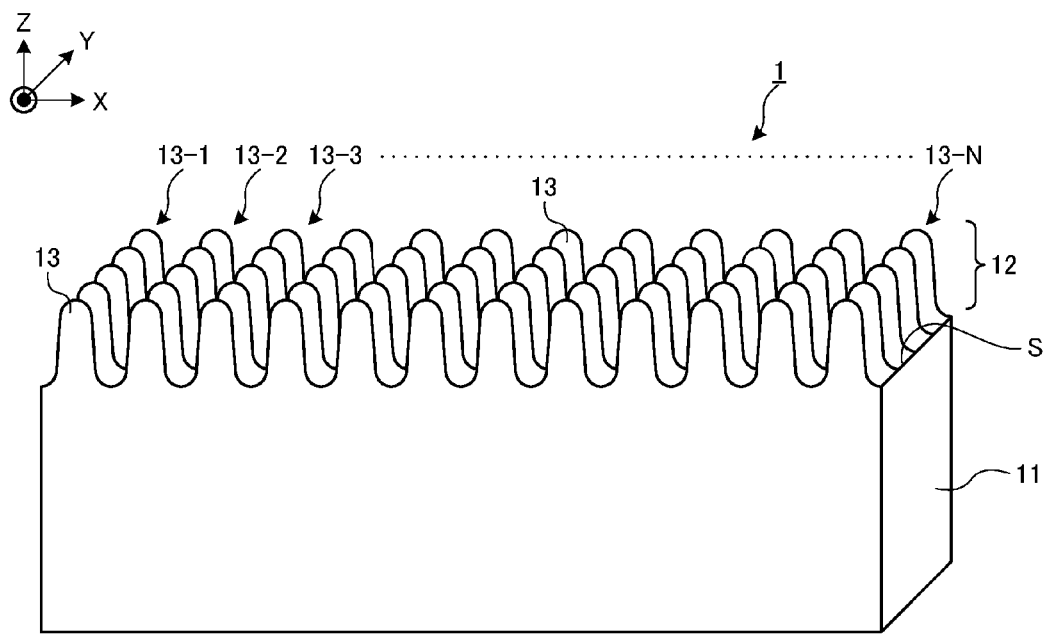
FIG. 12 is a perspective schematic diagram showing an example of a substrate for semiconductor light emitting device according to Embodiment 1.

Referring to FIG. 12, a configuration of the substrate for semiconductor light emitting device according to Embodiment 1 will specifically be described next. FIG. 12 is a perspective schematic diagram showing an example of a substrate 1 for semiconductor light emitting device according to Embodiment 1. As shown in FIG. 12, the substrate 1 for semiconductor light emitting device has substantially the shape of a plate, and is provided with a substrate 11 and a fine structure layer (two-dimensional photonic crystal) provided on one main surface of the substrate 11. The fine structure layer 12 includes a plurality of convex portions 13 (convex-portion lines 13-1 to 13-N) protruding upward from the main surface of the substrate 11. The convex portions 13 are arranged with respective particular intervals.

The fine structure layer 12 may be formed on the main surface of the substrate 11 separately, or may be formed by directly processing the substrate 11.

In addition, FIG. 12 shows the example where the fine structure of the fine structure layer 12 is comprised of a plurality of convex portions 13, but the invention is not limited thereto, and the fine structure of the fine structure layer 12 may be comprised of a plurality of concave portions.

Figure 13:
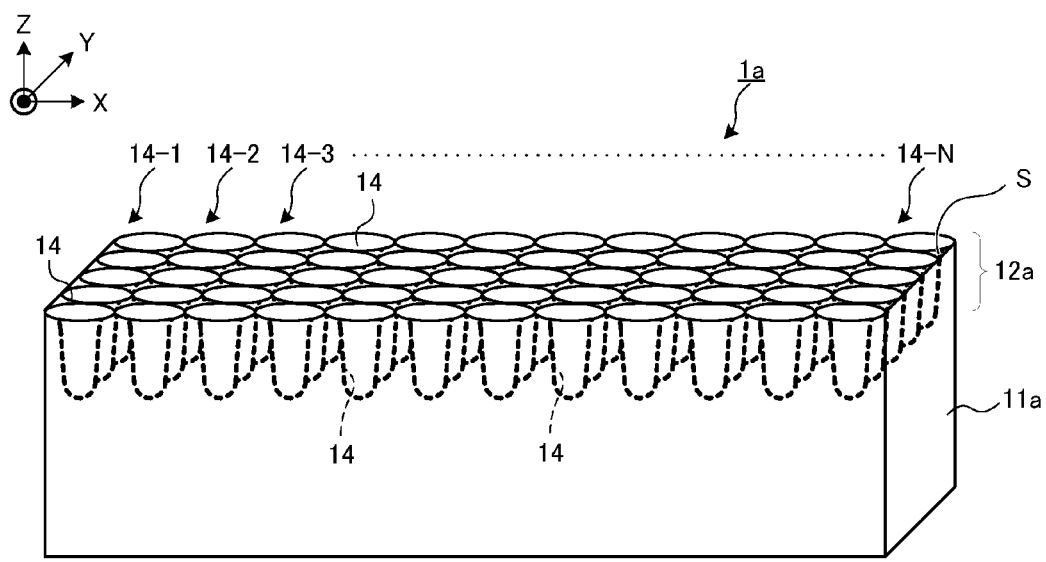
FIG. 13 is a perspective schematic diagram to explain another example of the substrate for semiconductor light emitting device according to this Embodiment.

FIG. 13 is a perspective schematic diagram showing another example of the substrate for semiconductor light emitting device according to this Embodiment. As shown in FIG. 13, a substrate 1a for semiconductor light emitting device has substantially the shape of a plate, and is provided with a substrate 11a and a fine structure layer 12a (two-dimensional photonic crystal) provided on one main surface of the substrate 11a. The fine structure layer 12a includes a plurality of concave portions 14 (concave-portion lines 14-1 to 14-N) dented from the frontside S of the fine structure layer 12a toward the backside of the substrate 11a. The concave portions 14 are arranged with respective predetermined intervals.

The fine structure layer 12a may be formed on the main surface of the substrate 11a separately, or may be formed by directly processing the substrate 11a.

Hereinafter, the convex portions 13 or concave portions 14 constituting the fine structure of the fine structure layer 12 or 12a are referred to as "dots" in the substrate 1 or 1a for semiconductor light emitting device, respectively.

In this Embodiment, diameters and pitches of the above-mentioned dots are of nano-order. According to this configuration, since the concavo-convex structure of nano-order is provided on the surface of each of the substrates 1 and 1a for semiconductor light emitting device, the CVD growth mode of the semiconductor layer is disturbed in forming the semiconductor layer on the surface of each of the substrates 1 and 1a for semiconductor light emitting device, dislocation defects in association with phase growth collide and disappear, and it is possible to develop the effect of reducing dislocation defects. Then, since dislocation defects inside the semiconductor crystal are decreased, it is possible to increase the internal quantum efficiency IQE of the semiconductor light emitting device.

In the semiconductor light emitting device according to this Embodiment, the two-dimensional photonic crystal is formed which is controlled by one of the pitch between the above-mentioned dots, dot diameter and dot height. In this Embodiment, by the photonic crystal in which the refractive index periodically changes, it is possible to control reflection, transmission and diffraction characteristics with respect to the propagated light inside the crystal.

The diameter and pitch of dots formed on one main surface of the substrate for semiconductor light emitting device of this Embodiment is of nano-order, and is substantially equal to a wavelength of the propagated light. Therefore, in this Embodiment, the characteristics of the photonic crystal are determined by a periodical change in the effective refractive index distribution with refractive indexes caused by the structure averaged (effective medium approximation). Since the effective refractive index distribution is repeated inside the main surface of the substrate for semiconductor light emitting device, the two-dimensional photonic crystal is formed.

Further, in the substrate for semiconductor light emitting device of this Embodiment, the period of the two-dimensional photonic crystal has at least two or more different periods each of 1 μm or more. Alternatively, the period has two or more periods six or more times the optical wavelength of the first light and six or more times the optical wavelength of the second light. Since the two-dimensional photonic crystal has two or more different periods each of 1 μm or more, or periods six or more times respective optical wavelengths of the first light and the second light, light scattering properties are more strengthened than light diffraction properties. Therefore, in the semiconductor light emitting device of this Embodiment, it is possible to develop light scattering properties strongly with respect to the emitted light from inside the semiconductor layer and the emitted light from the wavelength conversion member, and by the light scattering properties, it is possible to resolve the waveguide mode and increase the light extraction efficiency LEE.

Furthermore, at the same time, by strong light scattering properties, the angle dependence in the emission characteristics is weakened, and the emission characteristics, get closer to Lambertian emission characteristics easy to apply to industrial uses.

In this Embodiment, it is preferable that each of the periods of the two-dimensional photonic crystal is 1 μm or more, and that the crystal has at least two or more periods six or more times the optical wavelength of the first light and six or more times the optical wavelength of the second light. By this means, it is possible to effectively strengthen light scattering properties more than light diffraction properties, and to increase the light extraction efficiency LEE.

In addition, FIGS. 12 and 13 are of one example of applying the fine structure layer having the two-dimensional photonic crystal of this Embodiment to the substrates 1, 1a for semiconductor light emitting device, respectively, and are the same also in applying to any of interfaces forming the semiconductor light emitting device, which is the same in the following description. In other words, the two-dimensional photonic crystal is not limited to being provided on one main surface of the substrate for semiconductor light emitting device, is provided in one or more portions inside the semiconductor light emitting device, and is also provided on the uppermost surface of the semiconductor light emitting device.

The two-dimensional photonic crystal controlled by the pitch between dots, dot diameter or dot height will be described more specifically with drawings.

Figure 14:
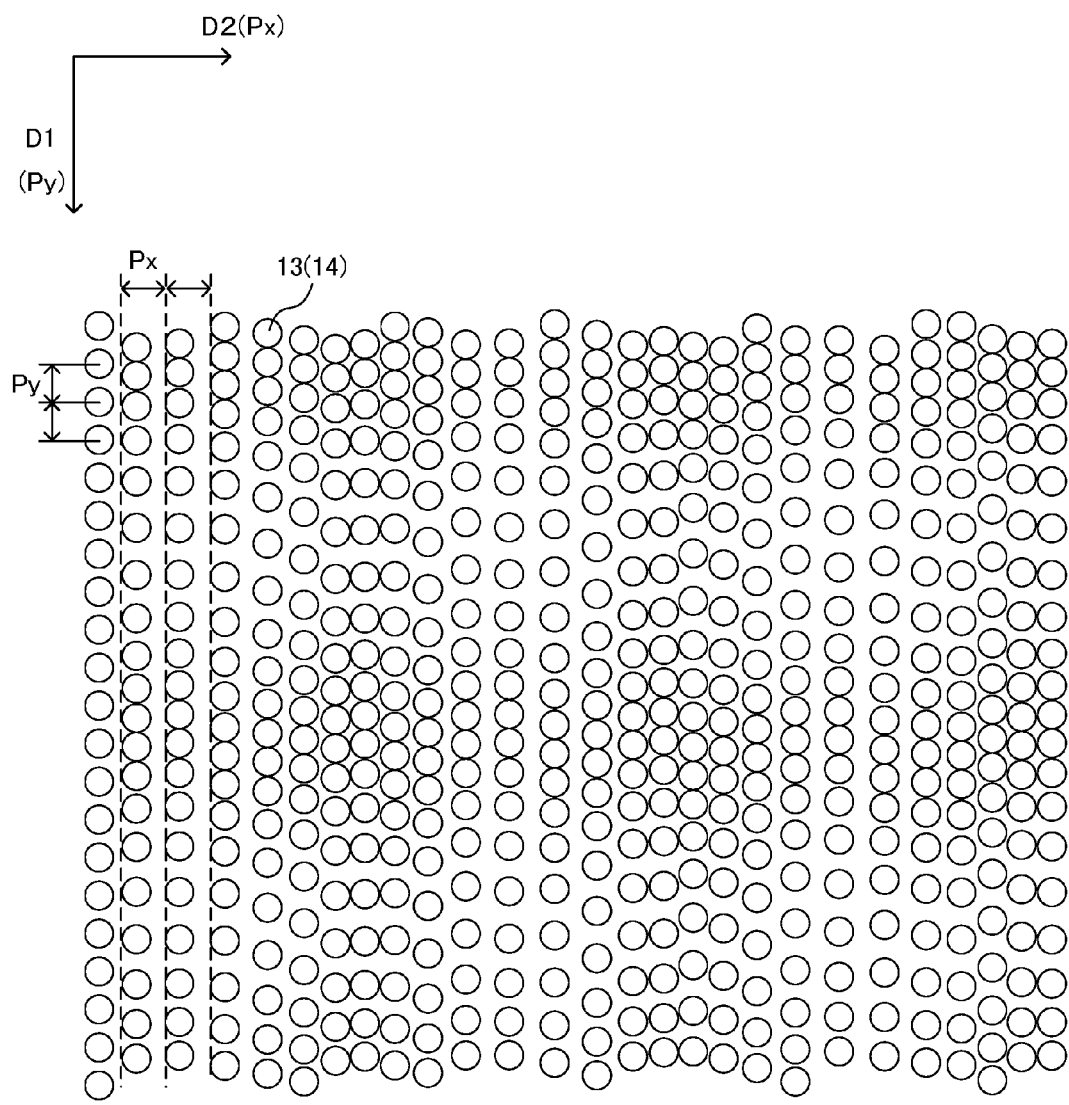
FIG. 14 is a plan schematic diagram showing an example of a substrate for semiconductor light emitting device according to this Embodiment.

FIG. 14 is a plan schematic diagram of the substrate 1 for semiconductor light emitting device according to this Embodiment, and illustrates the two-dimensional photonic crystal formed on the surface (one main surface) of the substrate 1 for semiconductor light emitting device.

As shown in FIG. 14, the dots (convex portions 13 or concave portions 14) forma plurality of dot lines (convex-portion lines 13-1 to 13-N or concave-portion lines 14-1 to 14-N; see FIGS. 12 and 13) in which a plurality of dots is arranged with pitches Py of inconstant intervals in a first direction D1 inside the main surface of the substrate 1 for semiconductor light emitting device. Further, respective dot lines are arranged with pitches Px of inconstant intervals in a second direction D2 orthogonal to the first direction D1 inside the main surface of the substrate 1 for semiconductor light emitting device.

Further, in the first direction D1, the pitch Py of the inconstant interval between dots periodically increases and decreases. Further, the pitch Px of the inconstant interval in the second direction D2 orthogonal to the first direction D1 periodically increases and decreases. The pitches Py and Px of inconstant intervals may periodically increase and decrease in both the first direction D1 and the second direction D2, or such configuration may be made that the pitches Py and Px of inconstant intervals periodically increase and decrease in one of the first direction D1 and the second direction D2. By increasing and decreasing the interval between dots, it is possible to form the two-dimensional photonic crystal controlled by the pitch between dots. Because the size and pitch of each dot is equal to or less than the emission wavelength, the existence of each dot is optically substituted by the effective refractive index due to effective medium approximation. In FIG. 14, since the pitch Py of the inconstant interval between dots periodically increases and decreases in the first direction D1, the light senses the period of periodical increase/decrease in the pitch Py of the inconstant interval due to the above-mentioned effective medium approximation, and exhibits the behavior equal to that as if a larger concavo-convex structure exists.

Figure 15:
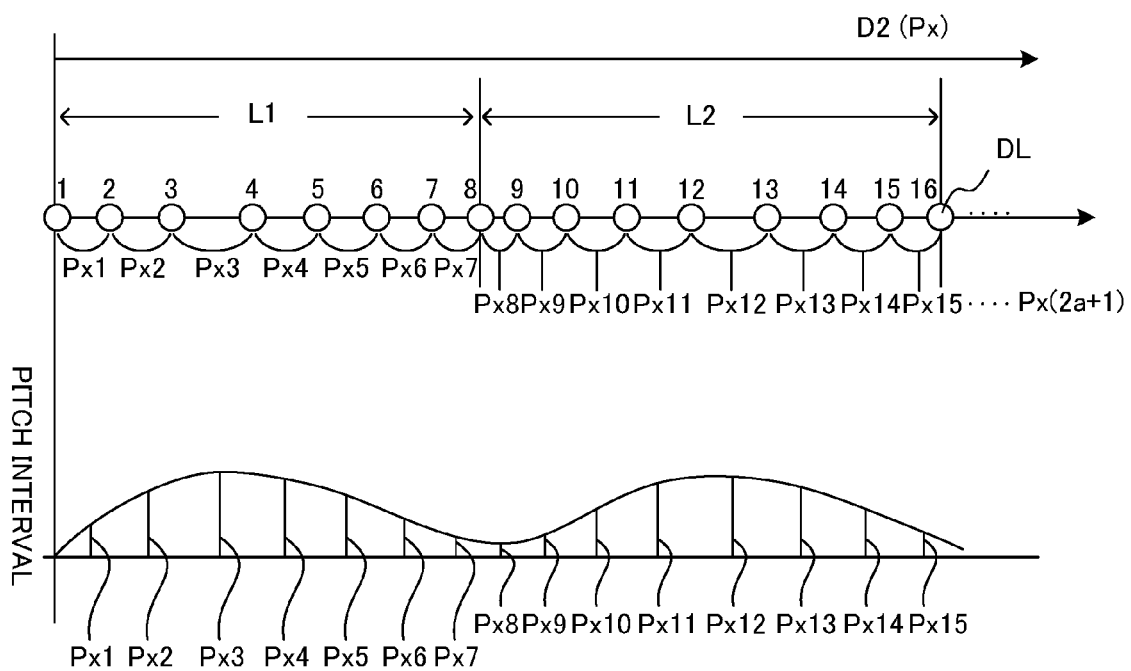
FIG. 15 is a schematic diagram showing an arrangement example of a dot line in a second direction D2 of the substrate for semiconductor light emitting device.

Moreover, using FIG. 15, an arrangement example of dot lines will specifically be described in the second direction D2 in which the pitch Px of the inconstant interval between dots periodically increases and decreases. FIG. 15 is a schematic diagram showing an arrangement example of dot lines in the second direction D2. As shown in FIG. 15, the dot lines in the second direction D2 are arranged at particular intervals (pitches Px) every eight lines, and eight dot lines are repeatedly arranged. A unit comprised of the plurality (z) of dot lines is referred to as a long-period unit Lxz (in addition, z is a positive integer, and x refers to x direction).

In this Embodiment, it is necessary that the long-period unit Lxz is 1 μm or more, or six or more times the optical wavelength emitted from the semiconductor light emitting device. In addition, also with respect to dots in the first direction D1 arranged at inconstant intervals with mutually different pitches Py, it is possible to arrange the dots as in the following description using a long-period unit Lyz.

The pitch Px is a distance between adjacent dot lines. Herein, the relationship of the following equation (1) holds for pitches Pxn among at least adjacent four to m dot lines or less ($3 \leq n \leq a$ or $3 \leq n \leq 2a+1$. In addition, m and a are positive integers and $n=m-1$.) in the long-period unit Lxz.

$$Px1 < Px2 < Px3 < \ldots < Pxa > \ldots > Pxn \qquad (1)$$

In addition, the diameter of each dot is smaller than the pitch Pxn. The length of from the pitches Px1 to Pxn constitutes the long-period unit Lxz.

FIG. 15 shows the case where the long-period unit Lxz is comprised of eight dot lines e.g. the case of $m=8$. In this case, since $n=7$ and $a=3$, in the long-period unit L1, the relationship of the following equation (2) holds for the pitches Pxn among dot lines.

$$Px1 < Px2 < Px3 > Px4 > Px5 > Px6 > Px7 \qquad (2)$$

Further, the pitches Px in the long-period unit Lxz are set so that the maximum phase deviation δ expressed by a difference between the maximum value (Px(max)) and the minimum value (Px(min)) of the pitch Px meets $(Px(min)) \times 0.01 < \delta < (Px(min)) \times 0.66$, preferably $(Px(min)) \times 0.02 < \delta < (Px(min)) \times 0.5$, and more preferably $(Px(min)) \times 0.1 < \delta < (Px(min)) \times 0.4$.

For example, in the long-period unit L1 as shown in FIG. 15, the pitch Pxn between respective dot lines is expressed as described below.

$$Px1 = Px(min)$$

$$Px2 = Px(min) + \delta a$$

$$Px3 = Px(min) + \delta b = Px(max)$$

$$Px4 = Px(min) + \delta c$$

$$Px5 = Px(min) + \delta d$$

$Px6 = Px(\min) + \delta e$ $Px7 = Px(\min) + \delta f$

In addition, values of δa to δf meet $Px(\min) \times 0.01 < (\delta a \sim \delta f) < Px(\min) \times 0.5$, and are the same as in an adjacent long-period unit L2.

Further, the maximum value of z in the long-period unit Lxz or long-period unit Lyz is set so as to meet $4 \le z \le 1,000$, preferably $4 \le z \le 100$, and more preferably $4 \le z \le 20$.

In addition, the long-period units Lxz and Lyz in the first direction D1 and second direction D2 do not need to be the same as each other.

In the substrate 1 for semiconductor light emitting device of this Embodiment, it is preferable that at least one or more dot groups having the above-mentioned long-period unit Lyz are arranged in the first direction D1, and that at least one or more dot line groups having the above-mentioned long-period unit Lxz are arranged in the second direction D2.

The arrangement arranged at inconstant intervals with pitches Py is defined by replacing the dot lines with dots in the arrangement example of dot lines in the second direction D2 arranged at inconstant intervals with mutually different pitches Px as described above to read.

Figure 16:
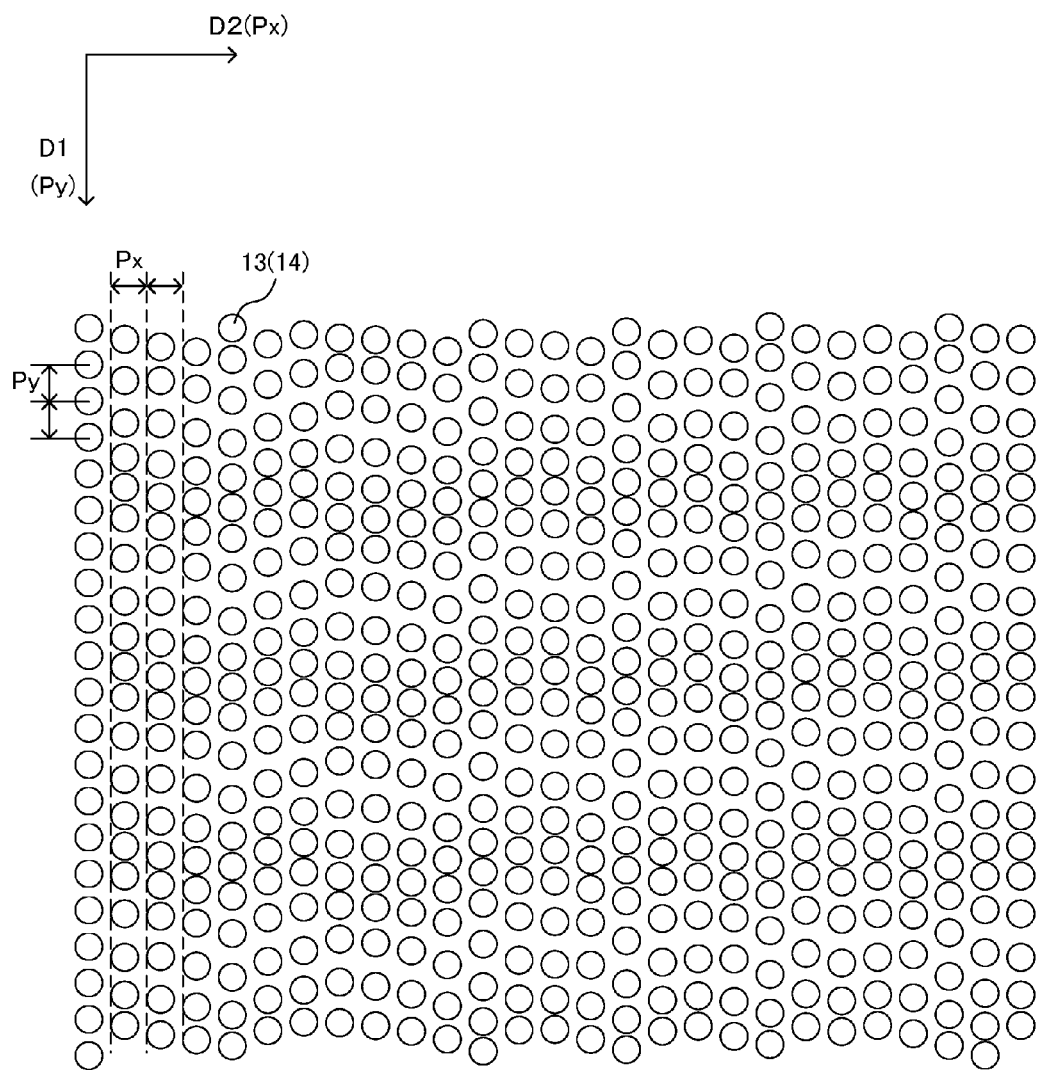
FIG. 16 is a plan schematic diagram showing another example of the substrate for semiconductor light emitting device according to this Embodiment.

In the substrate 1 for semiconductor light emitting device according to this Embodiment, the dots constituting the fine structure of the fine structure layer 12 (12a) are capable of being arranged with pitches Px and Py of inconstant intervals as described above in both the first direction D1 and the second direction D2 (see FIG. 14), and are also capable of being arranged with pitches of inconstant intervals as described above in one of the first direction D1 and the second direction D2, while being arranged with pitches of constant intervals in the other direction (see FIG. 16). FIG. 16 is a plan schematic diagram showing another example of the substrate for semiconductor light emitting device according to this Embodiment. In addition, in FIG. 16, the dots in the first direction D1 are arranged at inconstant intervals, and the dot lines in the second direction D2 are arranged with pitches of constant intervals.

The two-dimensional photonic crystal as shown in FIGS. 14 and 16 is the two-dimensional photonic crystal formed of non-periodical dots (dot lines), and in the substrate 1 for semiconductor light emitting device according to this Embodiment, a pattern of dots constituting the two-dimensional photonic crystal may be periodical. Since the periodicity of each dot is cancelled by the effective medium approximation as described above, the long-period unit Lxz is necessary to develop the effects of the substrate for semiconductor light emitting device of this Embodiment, and periodicity/non-periodicity of each dot is not important.

As an example of the periodical dot pattern, examples thereof are FIGS. 17, 18, 19 and 20. In these arrangement examples, there are an arrangement in which respective adjacent dot lines are aligned (FIGS. 19 and 20), and another arrangement in which every other dot line is aligned (FIGS. 17 and 18), and the dot pattern is arranged periodically. In addition, each of FIGS. 17 to 20 is a plan schematic diagram showing another example of the substrate for semiconductor light emitting device according to this Embodiment.

Figure 18:
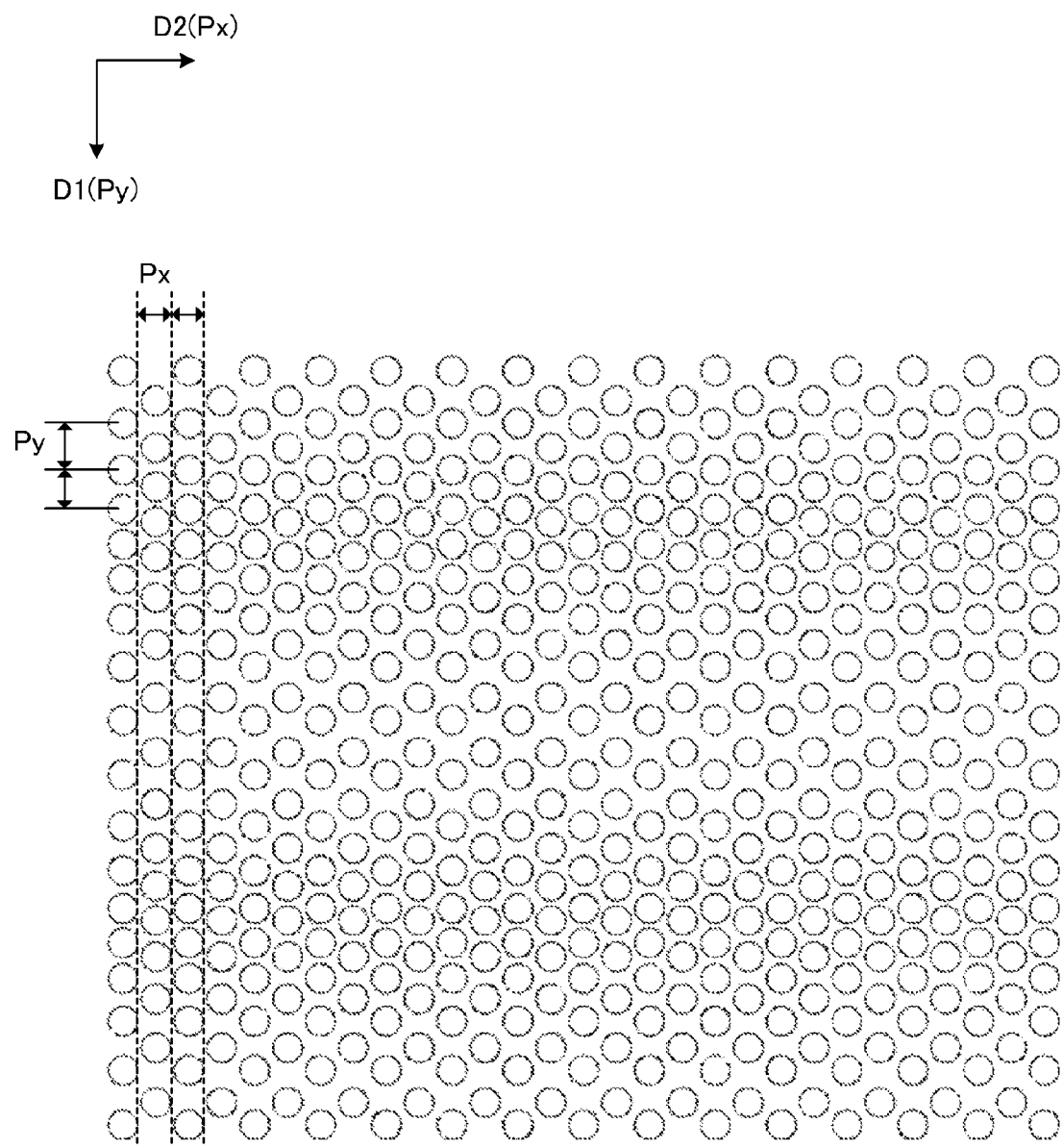
FIG. 18 is a plan schematic diagram showing still another example of the substrate for semiconductor light emitting device according to this Embodiment.
Figure 20:
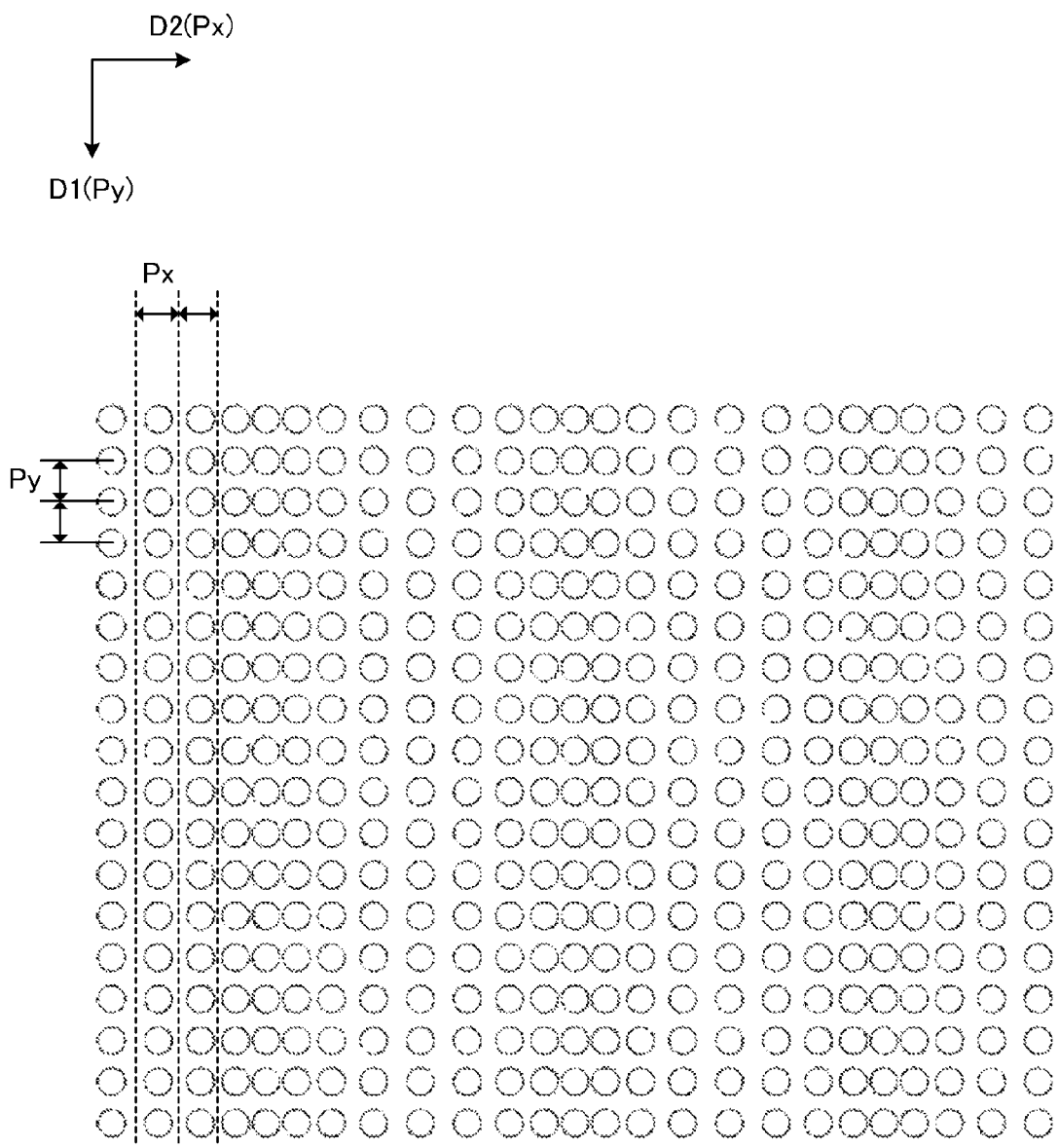
FIG. 20 is a plan schematic diagram showing still another example of the substrate for semiconductor light emitting device according to this Embodiment.

Further, in the semiconductor light emitting device according to this Embodiment, the two-dimensional photonic crystal due to the dot pattern preferably has periods six or more times respective optical wavelengths of the first light and the second light with a period different from that of the first light in one axial direction on at least one of the main surfaces constituting the semiconductor light emitting device, and specifically, is the two-dimensional photonic crystals as shown in FIGS. 16, 18 and 20.

Figure 17:
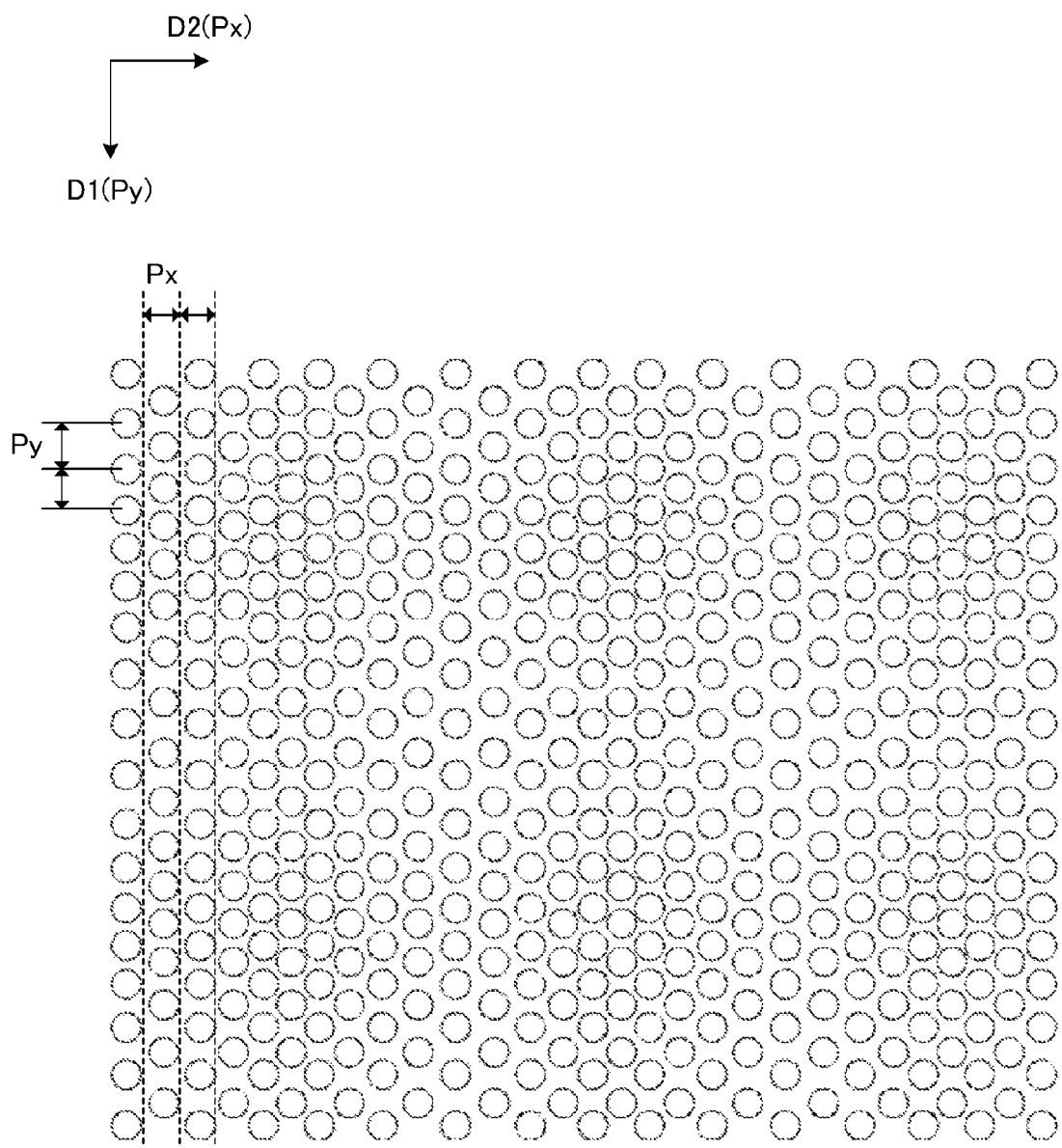
FIG. 17 is a plan schematic diagram showing still another example of the substrate for semiconductor light emitting device according to this Embodiment.
Figure 19:
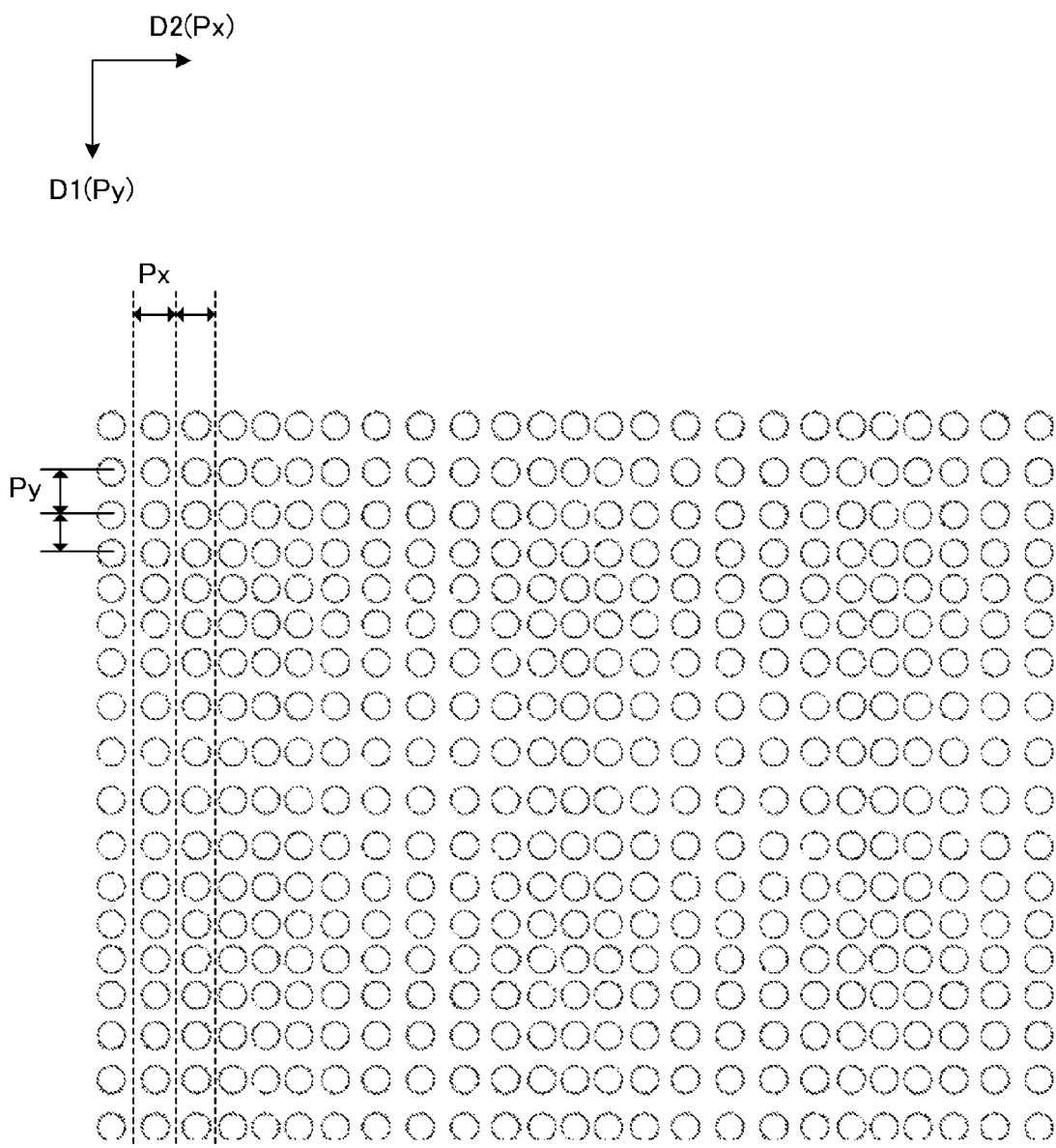
FIG. 19 is a plan schematic diagram showing still another example of the substrate for semiconductor light emitting device according to this Embodiment.

Furthermore, the periods of the two-dimensional photonic crystal are preferably periodical at least in independent two axial directions, and specifically, the crystal is the two-dimensional photonic crystals as shown in FIGS. 14, 17 and 19.

FIGS. 14, 17 and 19 are of the example in which the independent two axial directions are mutually orthogonal, but the directions do not need to be always orthogonal, and may be arranged at an arbitrary angle. Further, a pattern in independent three axial directions may be made, and in this case, it is possible to make the two-dimensional photonic crystal formed of the density of dots a triangle lattice arrangement.

Further, in the case of an arrangement in which one of the dot distance in the first direction D1 and the dot line distance in the second direction D2 is disposed at constant intervals, the ratio of the pitches of inconstant intervals to the pitch of the constant interval is preferably in a particular range.

Herein, described is an example in which dots in the first direction D1 are arranged with a pitch Pyc of the constant interval and dot lines in the second direction D2 are arranged with pitches Px of inconstant intervals. In this case, it is preferable that the ratio of the pitches Px of inconstant intervals to the pitch Pyc of the constant interval is in a range of 85% to 100%. When the ratio of the pitches Px of inconstant intervals to the pitch Pyc of the constant interval is 85% or more, overlapping of adjacent dots is small, and therefore, such ratios are preferable. Further, when the ratio of the pitches Px of inconstant intervals to the pitch Pyc of the constant interval is 100% or less, the filling rate of the convex portions 13 constituting the dots improves, and therefore, such ratios are preferable. In addition, it is more preferable that the ratio of the pitches Px of inconstant intervals to the pitch Pyc of the constant interval is in a range of 90% to 95%.

Further, one long-period unit Lxz or Lyz is preferable because long-period variations in the refractive index of light generated inside the light emitting layer go away from nano-order, and light scattering tends to occur. On the other hand, in order to obtain sufficient light extraction efficiency LEE, it is preferable that the long-period unit Lxz or Lyz is comprised of 1,001 or less dots (pitches Px or Py belonging thereto are 1,000 or less.)

In the substrate 1 (1a) for semiconductor light emitting device according to this Embodiment, the two-dimensional photonic crystal is formed which meets the relationship of the fine structure of fine structure layer 12, (12a) as described above. By this means, the light scattering effect is sufficient, and since the interval between dots (convex portions 13 or concave portions 14) is decreased, the effect of reducing dislocation defects is produced. As a result, dislocation defects inside the semiconductor layer are reduced due to concavities and convexities of nano-order, the periodicity of nano-order is concurrently disturbed, and it is thereby possible to develop light scattering properties with respect to the emitted light from the semiconductor layer.

Further, in spite of the two-dimensional photonic crystal, its light diffraction properties are suppressed, and the emission gets closer to Lambertian emission suitable for industrial uses.

Described next are dot shapes (concavo-convex structures) constituting the two-dimensional photonic crystal of the fine structure layer 12 (12a) of the substrate 1 (1a) for semiconductor light emitting device according to this Embodiment, respectively. The shapes of the convex portion 13 and concave portion 14 are not limited particularly within the scope in which the effects of the present invention are obtained, and are capable of being modified as appropriate according to a use. As the shapes of the convex portion 13 and concave portion 14, for example, it is possible to use the shape of a pillar, the shape of a hole, the shape of a cone, the shape of a pyramid, the shape of an elliptical cone and the like.

The foregoing description is given to the case where the two-dimensional photonic crystal in this Embodiment is configured by the intervals of dots, and the crystal may be configured by sizes of dot diameters. Specifically, in the dot shape (concavo-convex structure) constituting the fine structure of the fine structure layer 12 (12*a*) of the substrate 1 (1*a*) for semiconductor light emitting device according to this Embodiment, it is preferable that the diameter of each of dots increases or decreases corresponding to the pitch Py and/or the pitch Px.

An example of the dot diameter increasing or decreasing corresponding to the pitch will specifically be described below. In the substrate for semiconductor light emitting device according to this Embodiment, it is preferable that when the pitch Py is the inconstant interval, dot diameters Dyn of at least adjacent four dots to m dots or less ($3 \leq n \leq 2a$ or $3 \leq n \leq 2a+1$. In addition, m and a are positive integers and n=m−1.) forming the pitch meet the relationship of the following equation (3) while dot groups formed with the dot diameters Dy1 to Dyn are repeatedly arranged in the long-period unit Lyz in the first direction D1, and that when the pitch Px is the inconstant interval, dot diameters Dxn of at least adjacent four dots to m dots or less ($3 \leq n \leq 2a$ or $3 \leq n \leq 2a+1$. In addition, m and a are positive integers and n=m−1.) forming the pitch meet the relationship of the following equation (4) while dot groups formed with the dot diameters Dx1 to Dxn are repeatedly arranged in the long-period unit Lxz in the second direction D2. In this Embodiment, the long-period unit Lxz or Lyz needs to be 1 μm or more, or six or more times respective optical wavelengths of the first light emitted from the semiconductor light emitting device and the second light. In addition, the following description will be given to Lxz, and is the same as in Lyz.

$$Dy1 < Dy2 < Dy3 < \ldots < Dya > \ldots > Dyn \quad (3)$$

$$Dx1 < Dx2 < Dx3 < \ldots < Dxa > \ldots > Dxn \quad (4)$$

Figure 21:
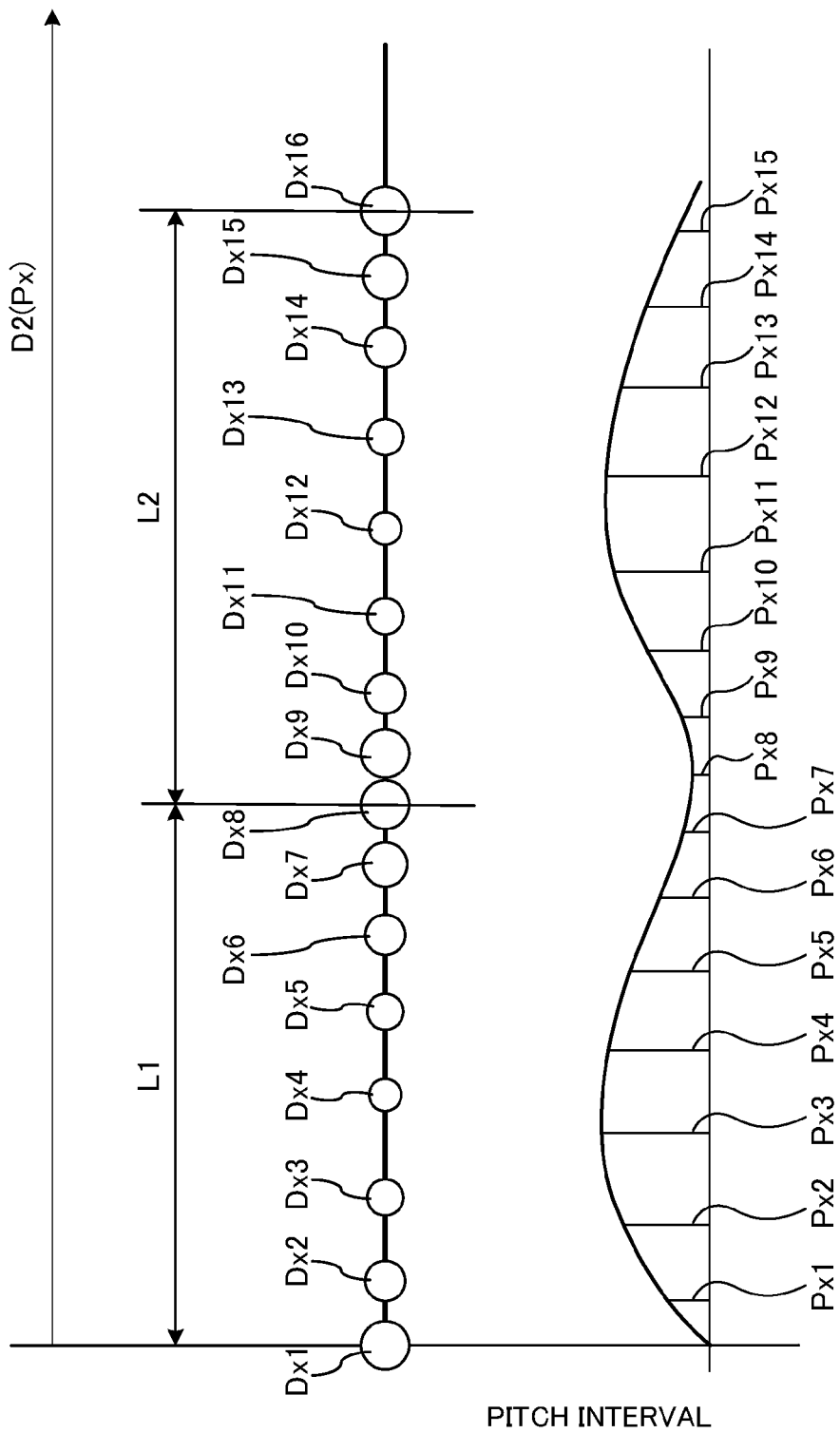
FIG. 21 is a schematic diagram showing an arrangement example of a dot line in the second direction D2 of the substrate for semiconductor light emitting device according to this Embodiment.

FIG. 21 shows the case where the long-period unit Lxz is comprised of eight dot lines i.e. the case of m=8. FIG. 21 is a schematic diagram showing an arrangement example of dots in the second direction D2 of the substrate for semiconductor light emitting device according to this Embodiment. In this case, since n=7 and a=3, in the long-period unit L1, the relationship of the above-mentioned equation (4) holds for the diameter Dxn of each of dots forming the dot line.

In FIG. 21, when the interval between adjacent dots widens, the dot diameter decreases, and when the dot interval narrows, the dot diameter increases. In the increase/decrease range in which the dot diameter increases and decreases, when the range is too large, adjacent dots contact each other, and therefore, such a range is not preferable. When the range is too small, the light extraction efficiency LEE is decreased, and therefore, such a range is not preferable. In the case of within ±20% with respect to the average diameter of dots in the same long-period unit Lxz, the light extraction efficiency LEE increases, and such a case is preferable.

By the above-mentioned configuration, the volume of dots increases or decreases in the long-period unit Lxz, and the two-dimensional photonic crystal is configured. This is because it is possible to represent the effective medium approximation by the volume fraction of the distribution of dielectric constant in a simplified manner, and the dielectric constant is the square of the refractive index. In other words, by the volume of the medium changing in the long-period unit Lxz, the effective refractive index changes in the long-period unit Lxz.

In this Embodiment, since the two-dimensional photonic crystal is formed that has periods of 1 μm or more, or six or more times respective optical wavelengths of the first light and the second light, light scattering properties are increased with respect to the emitted light, and the light extraction efficiency LEE is increased in the semiconductor light emitting device.

Described next is an example in which the two-dimensional photonic crystal is controlled by the dot height in the semiconductor light emitting device according to this Embodiment.

In the substrate 1 (1*a*) for semiconductor light emitting device according to this Embodiment, it is preferable that the height of each of dots in the dot shape (concavo-convex structure) constituting the fine structure of the fine structure layer 12 (12*a*) increases or decreases corresponding to the pitch Py and/or pitch Px in synchronization with the above-mentioned two-dimensional pattern.

In the substrate 1 (1*a*) for semiconductor light emitting device according to this Embodiment, it is preferable that when the pitch Py is the inconstant interval, dot heights Hyn of at least adjacent four dots to m dots or less ($3 \leq N \leq 2a$ or $3 \leq n \leq 2a+1$. In addition, in and a are positive integers and n=m−1.) forming the pitch meet the relationship of the following equation (5) while dot groups formed with the dot heights Hy1 to Hyn are repeatedly arranged in the long-period unit Lyz in the first direction D1, and that when the pitch Px is the inconstant interval, dot heights Hxn of at least adjacent four dots to m dots or less ($3 \leq N \leq 2a$ or $3 \leq n \leq 2a+1$. In addition, m and a are positive integers and n=m−1.) forming the pitch meet the relationship of the following equation (6) while dot groups formed with the dot heights Hx1 to Hxn are repeatedly arranged in the long-period unit Lxz in the second direction D2. In this Embodiment, the long-period unit Lxz or Lyz needs to be 1 μm or more, or six or more times respective optical wavelengths of the first light emitted from the semiconductor light emitting device and the second light. In addition, the following description will be given to Lxz, and is the same as in Lyz.

$$Hy1 < Hy2 < Hy3 < \ldots < Hya > \ldots > Hyn \quad (5)$$

$$Hx1 < Hx2 < Hx3 < \ldots < Hxa > \ldots > Hxn \quad (6)$$

Figure 22:
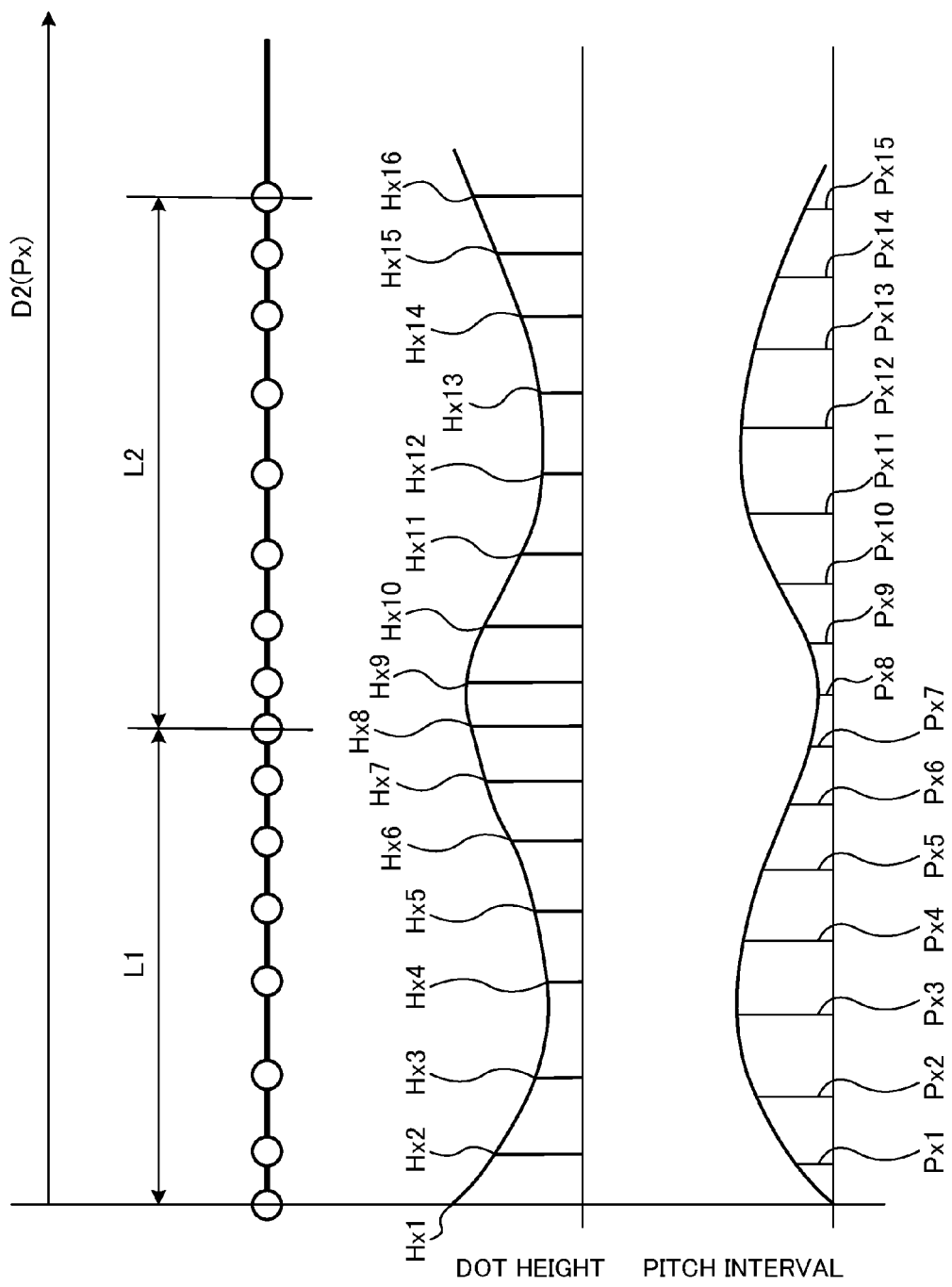
FIG. 22 is another schematic diagram showing an arrangement example of a dot line in the second direction D2 of the substrate for semiconductor light emitting device according to this Embodiment.

FIG. 22 shows the case where the long-period unit Lxz is comprised of eight dot lines i.e. the case of m=8. FIG. 22 is a schematic diagram showing an arrangement example of dots in the second direction D2 of the substrate for semiconductor light emitting device according to this Embodiment. In this case, since n=7 and a=3, in the long-period unit L1, the relationship of the above-mentioned equation (6) holds for the height Hxn of each of dots forming the dot line.

In FIG. 22, when the interval between adjacent dots widens, the dot height decreases, and when the dot interval narrows, the dot height increases. In the increase/decrease range in which the dot height increases and decreases, when the range is too large, fluctuations in, light extraction efficiency LEE are large in the portion, and therefore, such a range is not preferable. When the range is too small, the effect is decreased in increasing the light extraction efficiency LEE due to the increase/decrease of dot height, and therefore, such a range is not preferable. In the case of within ±20% with respect to the average height of dots in the same long-period unit Lxz, the light extraction efficiency LEE increases without fluctuations, and therefore, such a case is preferable.

By the above-mentioned configuration, the volume of dots increases or decreases in the long-period unit Lxz, and the two-dimensional photonic crystal is configured. This is because it is possible to represent the effective medium approximation by the volume fraction of the distribution of dielectric constant in a simplified manner, and the dielectric constant is the square of the refractive index. In other words, by the volume of the medium changing in the long-period unit Lxz, the effective refractive index changes in the long-period unit Lxz.

In this Embodiment, since the two-dimensional photonic crystal is formed that has periods of 1 μm or more, or six or more times respective optical wavelengths of the first light and the second light, light scattering properties are increased with respect to the emitted light, and the light extraction efficiency LEE is increased in the semiconductor light emitting device.

The foregoing description is given to the case of the two-dimensional photonic crystal having one period inside the same main surface, and as illustrated in FIG. 11, by providing at least two or more two-dimensional photonic crystals 102, 201 with different periods on one of main surfaces forming the semiconductor light emitting device, it is also possible to make the semiconductor light emitting apparatus of this Embodiment.

Figure 23:
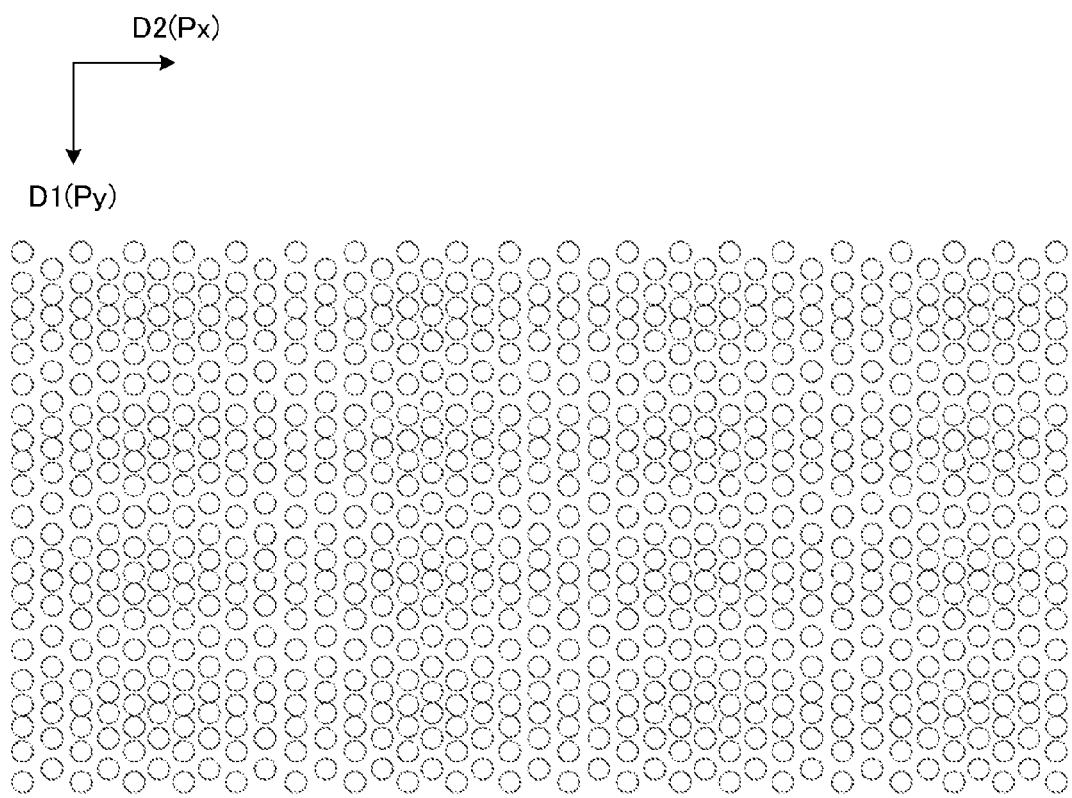
FIG. 23 is a plan schematic diagram of the substrate for semiconductor light emitting device comprised of dots with dot intervals having long periods.

Described next is the case of the two-dimensional photonic crystal having two or more periods inside the same main surface. As in FIG. 17, FIG. 23 is a plan schematic diagram of the two-dimensional photonic crystal comprised of dots with dot intervals having long periods. In the two-dimensional photonic crystal as shown in FIG. 23, respective long periods comprised of pitches Py in the D1 direction and pitches Px in the D2 direction are different from each other, where the D1 direction and D2 direction are orthogonal to each other. In this configuration, for example, it is possible to set the period in the D1 direction at 1 μm or more, or six or more times the optical wavelength of the first light, and set the period in the D2 direction at 1 μm or more, or six or more times the optical wavelength of the second light, and the crystal is the two-dimensional photonic crystal having two or more different periods inside the same main surface.

According to this configuration, for example, it is possible to provide the D1 direction with a long period suitable for diffraction and scattering of the first light, and to provide the D2 direction with a long period suitable for diffraction and scattering of the second light.

Figure 24:
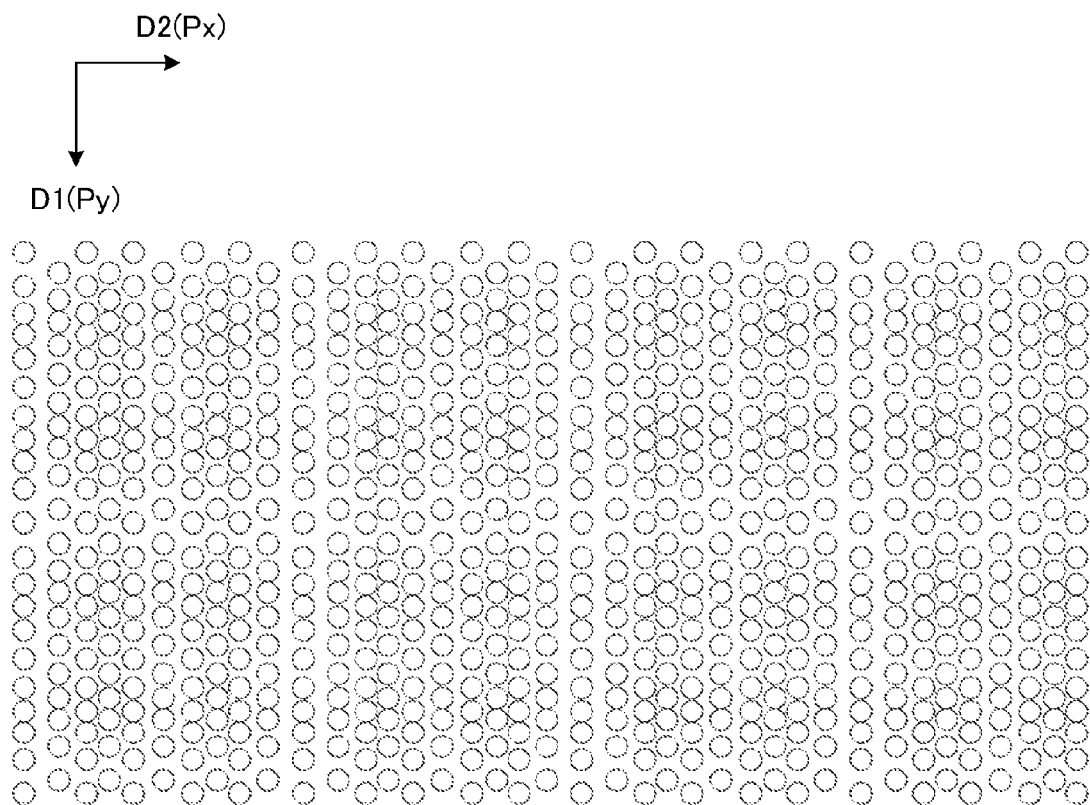
FIG. 24 is another plan schematic diagram of the substrate for semiconductor light emitting device having two or more periods inside the same main surface.

FIG. 24 is another plan schematic diagram of the two-dimensional photonic crystal having two or more periods inside the same main surface. In the two-dimensional photonic crystal as shown in FIG. 24, two types of long periods overlap in the long period of the pitch Py in the D1 direction. Therefore, it is possible to form the two-dimensional photonic crystal having periods of 1 μm or more, or periods six or more times respective optical wavelengths of the first light and the second light, it is thereby possible to enhance light scattering properties with respect to each of the first light and the second light, and the light extraction efficiency LEE is enhanced in the semiconductor light emitting device.

In FIG. 24, the pitch Py in the D1 direction and the pitch Px in the D2 direction are the same, but in the semiconductor light emitting device of this Embodiment, the pitches do not need to be always the same, and are capable of being changed as appropriate.

For example, as in the two-dimensional photonic crystal illustrated in FIG. 23, it is possible to change the long periods in the D1 direction and the D2 direction, and examples thereof are that (1) two or more long periods are formed in only the D1 direction, while providing the D2 direction with one long period, and that (2) two or more long periods are formed in the D1 direction and the D2 direction, while providing one direction with the same long period among the long periods.

Further, as illustrated in FIG. 11, also in the case of providing two or more two-dimensional photonic crystals 102, 201 with different periods on one of the main surfaces forming the semiconductor light emitting device, two or more periods are formed in respective long periods. Alternatively, by selecting as appropriate long periods such that different long periods are formed in the D1 direction and D2 direction and that two or more long periods are formed in the D1 direction, it is possible to provide the semiconductor light emitting apparatus of this Embodiment.

Moreover, in the semiconductor light emitting apparatus according to this Embodiment as described above, it is preferable that each of the pitch Px and the pitch Py ranges from 100 nm to 1,000 nm. When the pitches Px and Py are in this range, the concavities and convexities of nano-order are provided on the surface of the substrate for semiconductor light emitting device constituting the semiconductor light emitting apparatus of this Embodiment, and it is thereby possible to decrease the number of dislocation defects in the semiconductor layer in the case where the semiconductor layer is provided on the surface of the substrate for semiconductor light emitting device. By the pitches Px and Py of 100 nm or more, the light extraction efficiency LEE is increased in the semiconductor light emitting device, and the effect of reducing dislocation defects appears which contributes to improvements in luminous efficiency. Further, by the pitches Px and Py of 1,000 nm or less, the effect of decreasing the number of dislocation defects is maintained.

Described next are principles that the light extraction efficiency LEE is improved by the semiconductor light emitting apparatus according to this Embodiment.

In this Embodiment, in the semiconductor light emitting apparatus having the semiconductor light emitting device and the wavelength conversion member to be comprised thereof, the semiconductor light emitting device is provided with the fine structure layer as a component, and the fine structure layer forms the two-dimensional photonic crystal. Then, the two-dimensional photonic crystal has at least two or more periods of 1 μm or more, or six or more times the optical wavelength of the first light and six or more times the optical wavelength of the second light. Herein, the first light is emitted from the semiconductor light emitting device, and the second light is light that has a different wavelength from that of the first light and that is emitted by absorbing at least a part of the first light in the wavelength conversion member. In addition, as in Embodiments in FIGS. 5 to 8, when the third light, fourth light . . . exist, the two-dimensional photonic crystal has periods of 1 μm or more suitable for scattering properties of each of the light or two or more periods six or more times the optical wavelength of each of the light.

As described previously, by providing the two-dimensional photonic crystal comprised of the fine structure layer of concavities and convexities (dots) of nano-order in any of interfaces forming the semiconductor light emitting device, it is possible to obtain the effect of improving the light extraction efficiency LEE by resolving the waveguide mode due to light scattering.

By repeatedly setting the long-period unit Lxz comprised of a plurality of dots, the refractive index changes for each long-period unit Lxz, and the same effect is exerted as in the case where a plurality of dots forming the long-period unit Lxz is repeated as a single unit. In other words, in the case of a plurality of dots of the same order as the wavelength, since it is possible to explain the behavior of light by the average distribution of the refractive index (effective medium approximation), in calculating the spatial average refractive index distribution, the light is acted as if a plurality of dots of the long-period unit Lxz is repeated as a single unit. A plurality of dots thus arranged in the long-period unit Lxz exhibits the light scattering effect.

By thus adjusting and controlling the period of the two-dimensional photonic crystal, it is possible to increase light scattering properties with respect to the emitted light, and the light extraction efficiency LEE is increased in the semiconductor light emitting device. As a result, it is possible to enhance the luminous efficiency of the semiconductor light emitting apparatus. Further, it is possible to provide the semiconductor light emitting apparatus with the angle dependence of the emission distribution made little and easy to apply as industrial uses.

In this Embodiment, by making the semiconductor light emitting apparatus provided with the two-dimensional photonic crystal of 1 μm or more or six or more times the optical wavelength of each light, as shown in experiment results described later, as compared with the conventional structure without having the period that is 1 μm or more and that is six or more times the optical wavelength, it was understood that it is possible to obtain high luminous efficiency as the semiconductor light emitting apparatus. Further, it was understood there is little angle dependence in light emission characteristics, and that it is possible to make the semiconductor light emitting apparatus suitable in industrial practical use.

Further, it is suitable that the period of the two-dimensional photonic crystal is 200 times or less. In the case where the period of the two-dimensional photonic crystal is a period exceeding 200 times, the two-dimensional photonic crystal is not sufficiently small as compared with the outside shape of the semiconductor light emitting device constituting the semiconductor light emitting apparatus, the difference in performance between semiconductor light emitting devices is increased, and therefore, such a case is not preferable. This is because the density of the two-dimensional photonic crystal formed on the semiconductor light emitting device tends to vary between semiconductor light emitting devices.

In addition, in the semiconductor light emitting apparatus according to this Embodiment, it is possible to increase or decrease the diameter of each of dots corresponding to the pitch. The spatial average refractive index distribution changes, while depending on the volume fraction of the configuration unit. Therefore, in a plurality of dots of the long-period unit Lxz, when the volume of each dot changes, a change in the average refractive index distribution is increased corresponding thereto, and the light scattering effect is more increased even in the same long-period unit Lxz. This effect is more remarkable by increasing the diameter of the dot when the pitch between dots is narrow, or decreasing the diameter of the dot when the pitch between dots is wide.

Further, in the semiconductor light emitting apparatus according to this Embodiment, it is also possible to increase or decrease the height of the dot corresponding to the pitch between dots. Also in this case, by the same reason as described above, by increasing the height of the dot when the pitch between dots is narrow, or decreasing the height of the dot when the pitch between dots is wide, the average refractive index distribution inside the long-period unit Lxz is large, and the light scattering effect is increased.

Furthermore, in the arrangement in which the long-period unit Lxz comprised of a plurality of dots is repeatedly arranged, in the case of increasing or decreasing both the diameter of each of the dots and the height of the dot as described above corresponding to the pitch, the difference in the refractive index distribution described by effective medium approximation is further increased, and such a case is preferable. In this case, by increasing the diameter of the dot and the height of the dot when the pitch between dots is narrow, or decreasing the diameter of the dot and the height of the dot when the pitch between dots is wide, in the spatial average refractive index distribution, the difference in the volume fraction of the configuration unit is large, the light scattering effect is further increased, and such a case is preferable.

In the semiconductor light emitting apparatus according to this Embodiment, materials of the substrate for semiconductor light emitting device to apply are not limited particularly, as long as it is possible to use the materials as the substrate for semiconductor light emitting device. For example, it is possible to use substrates for semiconductor light emitting device of sapphire, SiC, SiN, GaN, silicon, zinc oxide, magnesium oxide, manganese oxide, zirconium oxide, manganese oxide zinc iron, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, molybdenum, GaP, GaAs and the like. Among the materials, from the viewpoint of lattice matching with the semiconductor layer, it is preferable to apply substrates for semiconductor light emitting device of sapphire, GaN, GaP, GaAs, SiC and the like. Further, the substrate may be used alone, or a substrate of hetero structure for semiconductor light emitting device may be used in which another substrate for semiconductor light emitting device is provided on the main body of the substrate for semiconductor light emitting device using the materials.

In the semiconductor light emitting device according to this Embodiment, materials of the n-type semiconductor layer are not limited particularly, as long as it is possible to use the materials as the n-type semiconductor layer suitable for a semiconductor light emitting device. For example, it is possible to apply element semiconductors such as silicon and germanium, and materials obtained by doping various elements to chemical semiconductors of group III-V, group II-VI, group VI-VI and the like as appropriate.

Further, in the semiconductor light emitting device according to this Embodiment, materials of the p-type semiconductor layer are not limited particularly, as long as it is possible to use the materials as the p-type semiconductor layer suitable for a semiconductor light emitting device. For example, it is possible to apply element semiconductors such as silicon and germanium, and materials obtained by doping various elements to chemical semiconductors of group III-V, group II-VI, group VI-VI and the like as appropriate.

In the semiconductor light emitting device according to this Embodiment, materials of the transparent conductive film are not limited particularly, as long as it is possible to use the materials as the transparent conducive film suitable for a semiconductor light emitting device. For example, it is possible to apply metal thin films of a Ni/Au electrode and the like, conductive oxide films of ITO, ZnO, $In_2O_3$, $SnO_2$, IZO, IGZO and the like, etc. Particularly, from the viewpoints of transparency and electrical conductivity, ITO is preferable.

Described next is the semiconductor light emitting device according to the semiconductor light emitting apparatus of this Embodiment. The semiconductor light emitting device according to this Embodiment includes the substrate for semiconductor light emitting device according to this Embodiment as described above in the configuration. By incorporating the substrate for semiconductor light emitting device according to this Embodiment into the configuration, it is possible to increase the internal quantum efficiency IQE, increase the electron injection efficiency EIE, and increase the light extraction efficiency LEE.

The semiconductor light emitting device according to this Embodiment has the layered semiconductor layer configured by layering at least two or more semiconductor layers and the light emitting layer on the main surface of the substrate for semiconductor light emitting device, for example. Then, the layered semiconductor layer is provided with the two-dimensional photonic crystal including dots comprised of a plurality of convex portions or concave portions extending in the out-of-plane direction (for example, direction substantially orthogonal to the main surface) from the main surface of the semiconductor layer with the layered semiconductor layer positioned on the uppermost surface, and the two-dimensional photonic crystal corresponds to two-dimensional photonic crystal structure of the substrate for semiconductor light emitting device according to the above-mentioned Embodiments. The layered semiconductor layer is as described using FIGS. 9 to 11.

In the semiconductor light emitting device according to this Embodiment, the semiconductor layer is not limited particularly, as long as it is possible to use as the semiconductor layer suitable for a semiconductor light emitting device. For example, it is possible to apply element semiconductors such as silicon and germanium, and materials obtained by doping various elements to chemical semiconductors of group III-V, group II-VI, group VI-VI and the like as appropriate. Further, it is possible to provide the n-type semiconductor layer and p-type semiconductor layer respectively with an n-type clad layer and p-type clad layer not shown, as appropriate.

The light emitting layer is not limited particularly, as long as the layer has light emission characteristics as a semiconductor light emitting device. For example, as the light emitting layer, it is possible to apply semiconductor layers of AsP, GaP, AlGaAs, InGaN, GaN, AlGaN, ZnSe, AlHaInP, ZnO and the like. Further, the light emitting layer may be doped with various elements as appropriate corresponding to characteristics.

It is possible to deposit the layered semiconductor layer (n-type semiconductor layer, light emitting layer, and p-type semiconductor layer) on the surface of the substrate for semiconductor light emitting device by publicly-known techniques. For example, as the deposition method, it is possible to apply the organic metal vapor phase growth method (MOCVD), hydride vapor phase growth method (HVPE), molecular beam epitaxial growth method (MBE) and the like.

Described next is a method of manufacturing the semiconductor light emitting device according to this Embodiment. In the method of manufacturing the semiconductor light emitting device according to this Embodiment, it is a feature to include at least a step of providing the semiconductor layer on the substrate for semiconductor light emitting device according to this Embodiment as described previously.

As described previously, an n-type semiconductor layer, light emitting layer and p-type semiconductor layer are formed on the main surface side with the two-dimensional photonic crystal of the substrate for semiconductor light emitting device having the two-dimensional photonic crystal layer on the main surface. In the method of manufacturing the semiconductor light emitting device according to this Embodiment, it is essential to include the step of providing the semiconductor layer on the substrate for semiconductor light emitting device, and it is not necessary that the obtained semiconductor light emitting device includes the substrate for semiconductor light emitting device. Specifically, there is a method of removing the substrate for semiconductor light emitting device after providing the semiconductor layer on the substrate for semiconductor light emitting device.

Each step will be described in FIG. 25. FIG. 25 contains cross-sectional schematic diagrams illustrating each step of the method of manufacturing the semiconductor light emitting device according to this Embodiment.

Figure 25A:
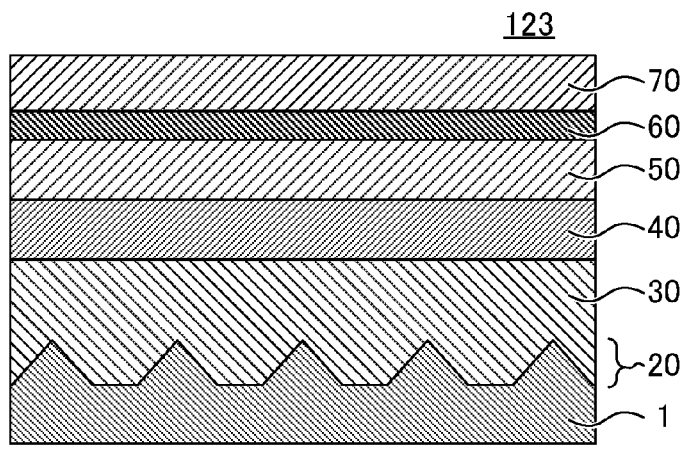
FIG. 25 contains cross-sectional schematic diagrams illustrating each step of a method of manufacturing the semiconductor light emitting device according to this Embodiment.

In a layered semiconductor layer 123 as shown in FIG. 25A, an n-type semiconductor layer 30, light emitting layer 40 and p-type semiconductor layer 50 are sequentially layered on the substrate 1 for semiconductor light emitting device. Further, a p electrode layer 60 and support product 70 are sequentially layered on the p-type semiconductor layer 50.

As the support product 70, it is possible to use a conductive substrate made of Si, Ge, GaAs, Fe, Ni, Co, Mo, Au, Cu, Cu—W or the like. Further, in FIG. 25A, the layered semiconductor layer 123 is a configuration to obtain conduction in the direction perpendicular to the device surface, and a parallel electrode type may be adopted. In this case, the support product 70 may be an insulating substrate. For junction between the support product 70 and the p electrode layer 60, it is possible to use metal eutectic such as Au—Sn, Au—Si, Ag—Sn—Cu, and Sn—Bi that is low-melting point metal, or also use an Au layer, Sn layer, Cu layer and the like that are not of low-melting point metal. In addition, a metal layer may directly be formed on the p electrode layer 60 as the support product 70 by plating, sputtering, deposition or the like. Further, a backside electrode, not shown, may be provided on the surface that does not face the p electrode layer 60 of the support product 70.

Figure 25B:
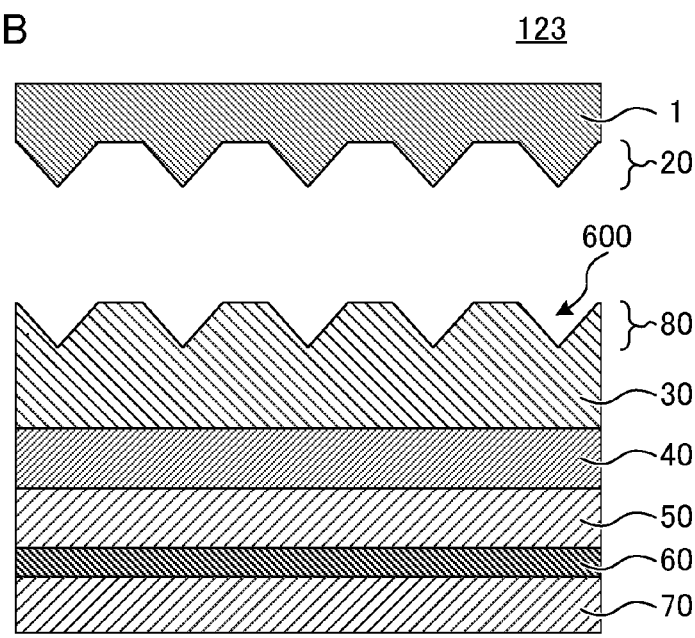

From the layered semiconductor layer 123, as shown in FIG. 25B, by peeling (lift off) the substrate 1 for semiconductor light emitting device, it is possible to obtain a semiconductor light emitting device 600 having a two-dimensional photonic crystal layer 80 that is inversion of the two-dimensional photonic crystal 20 on the peeling surface of the n-type semiconductor layer 30. In this case, the structure of the two-dimensional photonic crystal layer 20 that is an inversion source is designed as appropriate so that the inverted two-dimensional photonic crystal 80 is a structure suitable for the semiconductor light emitting device 600 to obtain.

For peeling of the substrate 1 for semiconductor light emitting device, for example, laser lift off, chemical lift off and the like is adopted. In the case of laser lift off, a laser to apply uses a wavelength that transmits the substrate 1 for semiconductor light emitting device and that does not transmit the n-type semiconductor layer 30. Further, in the case of chemical lift off, there is a method of layering a thin etching layer on the two-dimensional photonic crystal 20, and peeling off the substrate 1 for semiconductor light emitting device by chemical etching.

Figure 25C:
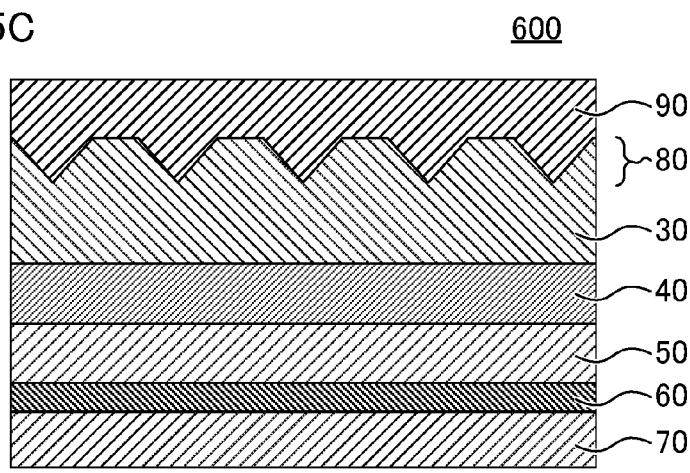

Next, in the semiconductor light emitting device 600, as shown in FIG. 25C, an n electrode layer 90 is provided on the surface of the n-type semiconductor layer 30 including the two-dimensional photonic crystal 80.

A device process is further performed after the step of sequentially layering the semiconductor layers on the substrate for semiconductor light emitting device according to this Embodiment, or the step of lifting off the substrate for semiconductor light emitting device from the layered semiconductor layer obtained as described above, and the electrode and the like are formed as appropriate to make the semiconductor light emitting device.

Described next is a manufacturing method in the case of applying the fine structure layer to the substrate for semiconductor light emitting device in the semiconductor light emitting apparatus according to this Embodiment. In addition, the manufacturing method as shown below is an example, and the method of manufacturing the substrate for semiconductor light emitting device is not limited thereto.

Figure 26:
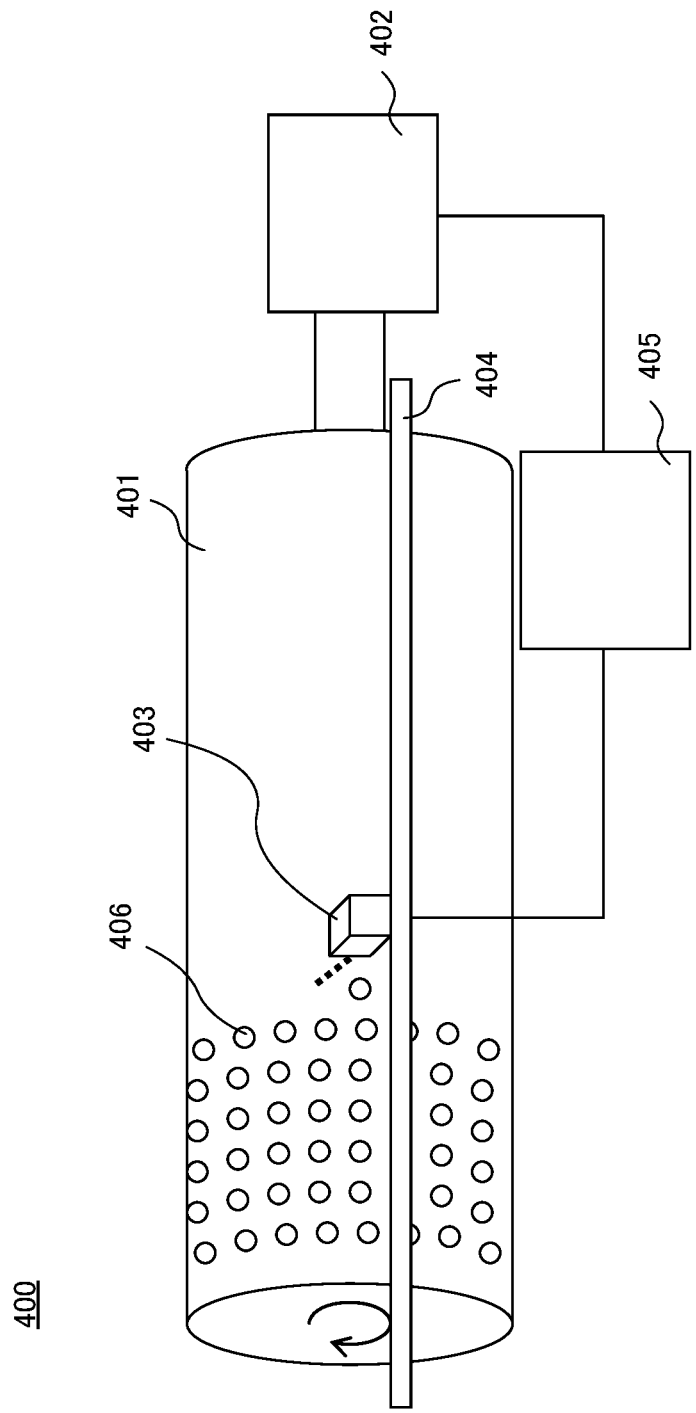
FIG. 26 is a schematic explanatory diagram showing an example of the method of manufacturing the substrate for semiconductor light emitting device according to this Embodiment.

FIG. 26 is a schematic explanatory diagram showing an example of the method of manufacturing the substrate 1 (1a) for semiconductor light emitting device according to this Embodiment.

As shown in FIG. 26, an exposure apparatus 400 grasps a roll-shaped member 401 coated with a resist layer with a roll grasp portion not shown, and is provided with a rotation control section 402, processing head portion 403, shift mechanism section 404, and exposure control section 405. The rotation control section 402 rotates the roll-shaped member 401 on the center of the roll-shaped member 401 as the axis. The processing head portion 403 applies laser light to expose the resist layer of the roll-shaped member 401. The shift mechanism section 404 shifts the processing head portion 403 at a control velocity along the long-axis direction of the roll-shaped member 401. The exposure control section 405 controls pulse signals of laser exposure by the processing head portion 403, based on a reference signal synchronized with rotation of the roll-shaped member 401 by the rotation control section 402.

Processing of the roll-shaped member 401 with the exposure apparatus 400 is performed by applying a pulse laser from the processing head portion 403, while rotating the roll-shaped member 401. The processing head portion 403 shifts along the long-axis direction of the roll-shaped member 401 by the shift mechanism section 404, while applying the pulse laser. A pattern 406 is recorded at arbitrary pitches on the resist layer of the outer periphery of the roll-shaped member 401 in the rotation direction, from the number of revolutions of the roll-shaped member 401 and the frequency of the pulse laser. This is the pitch Py in the first direction D1 in a roll-to-roll nanoimprint mold.

Further, since the scan is made along the long-axis direction of the roll-shaped member 401, when the roll-shaped member 401 rotates once from an arbitrary position, the processing head portion 403 is shifted in the long-axis direction. This is the pitch Px in the second direction D2 in the roll-to-roll nanoimprint mold. As compared with the circumference length of the roll-shaped member 401, the pitches Py and Px of the pattern 406 are of the order of nanometers and are thus extremely small, and therefore, it is possible to form the line-shaped pattern with the shift amount in the first direction D1 differing viewed in the long-axis direction, while maintaining the pitch Py in the first direction D1. Furthermore, as described above, since the pitches Py and Px of the pattern 406 are extremely small as compared with the circumference length of the roll-shaped member 401, the first direction D1 and the second direction D2 are substantially orthogonal.

The roll-shaped member 401 is obtained by providing the member formed in the shape of a cylinder with the rotating axis, and as the materials, it is possible to apply metal, carbon core, glass, quartz and the like. The roll-shaped member 401 needs processing precision permitting high rotation, and therefore, preferred as the materials are metal, carbon core and the like. Further, it is also possible to coat only the cylindrical surface portion undergoing laser exposure with a different material. Particularly, when a heat-reactive resist is used, in order to enhance the heat insulation effect, it is preferable to apply materials with lower thermal conductivity than that of metal, and examples thereof are glass, quartz, oxides, nitrides and the like. It is also possible to use the layer with which the cylindrical surface is coated as an etching layer to etch with a resist layer describe later as a mask.

The resist to coat the roll-shaped member 401 is not limited particularly, as long as the resist is exposed to laser light, and it is possible to apply photocurable resists, light-amplification type resists, heat-reactive resists and the like. Particularly, heat-reactive resists allow pattern formation with wavelengths smaller than the wavelength of laser light, and are preferable.

As heat-reactive resists, organic resists or inorganic resists are preferable. The resist layer formed from these resists may be a single-layer structure, or multi-layer structure obtained by combining a plurality of resist layers. In addition, it is possible to change which resist to select as appropriate according to the process, required processing precision and the like. For example, organic resists allow coating with a roll coater or the like in forming a resist layer to coat the roll-shaped member 401, and the process is thereby easy. In addition, the viscosity of the resist is limited because of coating onto a sleeve, and it is difficult to obtain coating thickness accuracy and control or multi-layer coating.

As organic resists, as described in "Latest Resist Material Handbook" published by Johokiko Co., Ltd. and "Photopolymer Handbook", Kogyo Chosakai Publishing Co., Ltd., examples thereof are novolac resins, mixtures of novolac resins and diazonaphthoquinone, methacrylate-based resins, polystyrene-based resins, polyethylene-based resins, phenol-based resins, polyimide-based resins, polyamide-based resins, silicone resins, polyester-based resins, epoxy-based resins, melamine-based resins, and vinyl-based resins.

On the other hand, inorganic resists are suitable for providing the resist layer to coat the roll-shaped member 401 by the resistance heating evaporation method, electron-beam sputtering method, vapor-phase method such as the CVD method or the like. Since these methods are basically of vacuum process, although the number of steps is required to form on the sleeve, it is possible to control the film thickness with accuracy, and it is easy to layer in multi-layer.

It is possible to select various inorganic resist materials corresponding to the reaction temperature. For example, among the inorganic resist materials are Al, Si, P, Ni, Cu, Zn, Ga, Ge, As, Se, In, Sn, Sb, Te, Pb, Bi, Ag, Au and their alloys. Further, among the inorganic resist materials that may be applied are oxides, nitrides, nitrogen oxides, carbides, sulfides, sulfates, fluorides, and chlorides of Mg, Al, Si, Ca, Ti, V, Cr, Mn, Fe, Co, Ni, Cu, Zn, Ga, Ge, As, Se, Sr, Y, Zr, Nb, Mo, Pd, Ag, In, Sn, Sb, Te, Ba, Hf, Ta, W, Pt, Au, Pb, Bi, La, Ce, Sm, Gd, Tb and Dy, and mixtures of such compounds.

When a heat-reactive resist material is used as the resist to coat the roll-shaped member 401, before exposure to form the following pattern, preliminary heating may be performed to process the resist at a temperature lower than that in pattern formation. By applying preliminary heating, it is possible to improve the pattern resolution in forming the pattern. Although details of the mechanism that the pattern resolution is improved by preliminary heating are uncertain, in the case where a change in the material forming the resist layer by heat energy of the heat-reactive resist material is based on a plurality of reactions, it is presumed that the pattern formation reaction is made simple by beforehand finishing reactions except the reaction in pattern formation by preliminary heating, and that the pattern resolution is improved.

A method of preliminarily heating the resist to coat the roll-shaped member 401 is not limited particularly, and among the methods are a method of heating the entire roll-shaped member 401, a method of scanning the entire roll surface with lower output than in performing patterning on the roll-shaped member 401 with the laser to apply heat energy to the resist, and the like.

When a heat-reactive resist is used as the resist to coat the roll-shaped member 401, in the case of exposing with a pulse signal that is phase-modulated based on a reference signal synchronized with rotation described later, the diameter of each of dots forming the pattern increases or decreases corresponding to the pitch Py and/or pitch Px, and the heat-reactive resin is thus preferable. In the case of using the heat-reactive resist, although an explicit mechanism that the diameter of the dot increases/decreases corresponding to the pitch is unknown, the mechanism is assumed as described below.

In the case of a heat-reactive resist, a change occurs in the material forming the resist layer by heat energy of a laser applied to an application portion, and a pattern is formed by etching characteristics changing. At this point, all of applied heat is not used in the change of the resist layer, and a part thereof is stored and transferred to an adjacent area. Therefore, heat energy in the adjacent area is provided with heat-transfer energy from the adjacent area in addition to application energy. In pattern formation of nano-order, a contribution of this heat-transfer energy is not neglected, the contribution of heat-transfer is inversely proportional to the distance between dots forming the pattern, and as a result, the obtained pattern diameter undergoes the effect of the distance between adjacent dots.

Herein, when the distance between dots changes by phase modulation, the contribution of heat-transfer energy as described above varies for each dot. When the distance between dots is wide, the contribution of heat-transfer energy is small, and the dot diameter decreases. When the distance between dots is narrow, the contribution of heat-transfer energy is large, and the dot diameter increases.

Further, in the case of using a heat-reactive resist as the resist to coat the roll-shaped member 401, providing an etching layer described later, and controlling the processing depth of the pattern, as in the same manner as described previously, when exposure is performed with a pulse signal that is phase-modulated based on a reference signal synchronized with rotation, the height of each of dots forming the pattern increases or decreases corresponding to the pitch Py and/or pitch Px, and therefore, such case preferable. In the case of using the heat-reactive resist and etching layer together, although a mechanism that the diameter of the dot increases or decreases corresponding to the pitch Px is unknown, it is possible to explain from the fact that the dot diameter increases or decreases corresponding to the distance between dots as described above.

In other words, in patterning of nano-order, the etching depth increases or decreases corresponding to the dot diameter, and there is a tendency that the etching depth is deep when the dot diameter is wide, and that the etching depth is shallow when the dot diameter is narrow. Particularly, this tendency is remarkable when the etching technique is dry etching. It is conceivable this is because exchange of an etchant or removal of etching products is not carried out promptly.

As described previously, in using the heat-reactive resist, the dot diameter is small when the distance between dots is wide, while the dot diameter is large when the distance between dots is narrow. Since there is the tendency that the etching depth increases or decreases corresponding to the dot diameter, as a result, the dot depth is shallow when the distance between dots is wide, while the dot depth is deep when the distance between dots is narrow.

The effects of increases/decreases in the distance between dots, dot diameter and dot depth as described above are remarkable when the average pitch is small. It is presumed this is because the above-mentioned effect of heat-transfer energy is larger.

In this Embodiment, it is possible to apply as the roll-to-roll nanoimprint mold without modification by using the resist layer to coat the roll-shaped member 401, or it is possible to form a pattern by etching the surface of the roll-shaped member 401 using the resist layer as a mask.

By providing the etching layer on the roll-shaped member 401, it is possible to control the processing depth of the pattern freely, and to select a film thickness most suitable for processing as the thickness of the heat-reactive resist. In other words, by controlling the thickness of the etching layer, it is possible to control the processing depth freely. Further, it is possible to control the processing depth with the etching layer, and therefore, a film thickness easy to expose and develop may be selected for the heat-reactive resist layer.

The wavelength of a laser used in the processing head portion 403 to perform exposure preferably ranges from 150 nm to 550 nm. Further, in terms of miniaturization of wavelength and easiness of availability, it is preferable to use a semiconductor laser. The wavelength of the semiconductor laser preferably ranges from 150 nm to 550 nm. This is because when the wavelength is shorter than 150 nm, output of the laser is small, and it is difficult to expose the resist layer with which the roll-shaped member 401 is coated. On the other hand, this is because when the wavelength is longer than 550 nm, it is not possible to make the spot diameter of the laser 500 nm or less, and it is difficult to form a small exposed portion.

On the other hand, to form an exposed portion with a small spot size, it is preferable to use a gas laser as the laser used in the processing head portion 403. Particularly, in gas lasers of XeF, XeCl, KrF, ArF, and $F_2$, the wavelengths are 351 nm, 308 nm, 248 nm, 193 nm and 157 nm and thus short, it is thereby possible to focus light on an extremely small spot size, and therefore, such lasers are preferable.

Further, as the laser used in the processing head portion 403, it is possible to use a second harmonic, third harmonic and fourth harmonic of a Nd:YAG laser. The wavelengths of the second harmonic, third harmonic and fourth harmonic of the Nd:YAG laser are respectively 532 nm, 355 nm, and 266 nm, and allow a small spot size to be obtained.

In the case of forming a fine pattern in the resist layer provided on the surface of the roll-shaped member 401 by exposure, rotation position accuracy of the roll-shaped member 401 is significantly high, and manufacturing is made ease by first adjusting the optical system of the laser so that the member surface is in the focus depth. However, it is very difficult to hold roll dimension accuracy and rotation accuracy adapted to nanoimprint. Therefore, it is preferable that the laser used in exposure is concentrated with an objective lens and is set for autofocus so that the surface of the roll-shaped member 401 always exists in the focus depth.

The rotation control section 402 is not limited particularly, as long as the section is an apparatus having the function of rotating the roll-shaped member 401 on the center of the roll as the axis, and for example, a spindle motor or the like is suitable.

As the shift mechanism section 404 that shifts the processing head portion 403 in the long-axis direction of the roll-shaped member 401, the section 404 is not limited particularly, as long as the section is able to shift the processing head portion 403 at a controlled velocity, and suitable examples thereof are a linear servo motor and the like.

In the exposure apparatus 400 as shown in FIG. 26, the exposure control section 405 controls the position of an exposed portion, using a pulse signal phase-modulated based on a reference signal such that the exposure pattern formed on the surface of the roll-shaped member 401 is synchronized with rotation (for example, rotation of a spindle motor) of the rotation control section 402. As the reference signal, it is possible to use an output pulse from an encoder synchronized with rotation of the spindle motor.

For example, it is possible to control the pulse signal that is phase-modulated based on the reference signal synchronized with rotation as described below.

Figure 27A:
FIG. 27 contains explanatory diagrams to explain an example for setting a reference pulse signal and modulated pulse signal using, as a reference signal, a Z-phase signal of a spindle motor in an exposure apparatus for forming the substrate for semiconductor light emitting device according to this Embodiment.
Figure 27B:
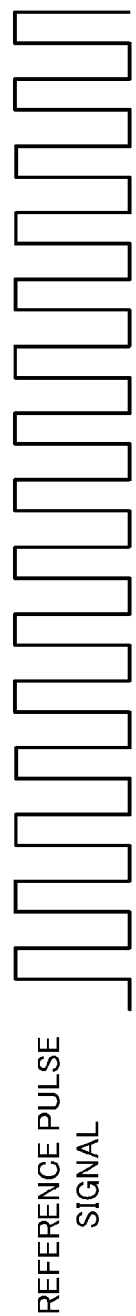
Figure 27C:

FIG. 27 contains explanatory diagrams to explain an example for setting a reference pulse signal and modulated pulse signal using, as a reference signal, a Z-phase signal of the spindle motor in the exposure apparatus for forming the substrate for semiconductor light emitting device according to this Embodiment. The relationship among the Z-phase signal of the spindle motor, reference pulse signal and modulated pulse signal will be described with reference to FIGS. 27A to 27C. Using the Z-phase signal as the reference, a pulse signal with the frequency m times (integer of m>2) that of the signal is a reference pulse signal, and a pulse signal with the frequency n times (integer of m/n>k and k>1) that of the signal is a modulated pulse signal. Each of the reference pulse signal and the modulated pulse signal is an integral multiple of the frequency of the Z-phase signal, and therefore, the integral pulse signal exists during the time the roll-shaped member 401 rotates once on the center axis.

Figure 28:
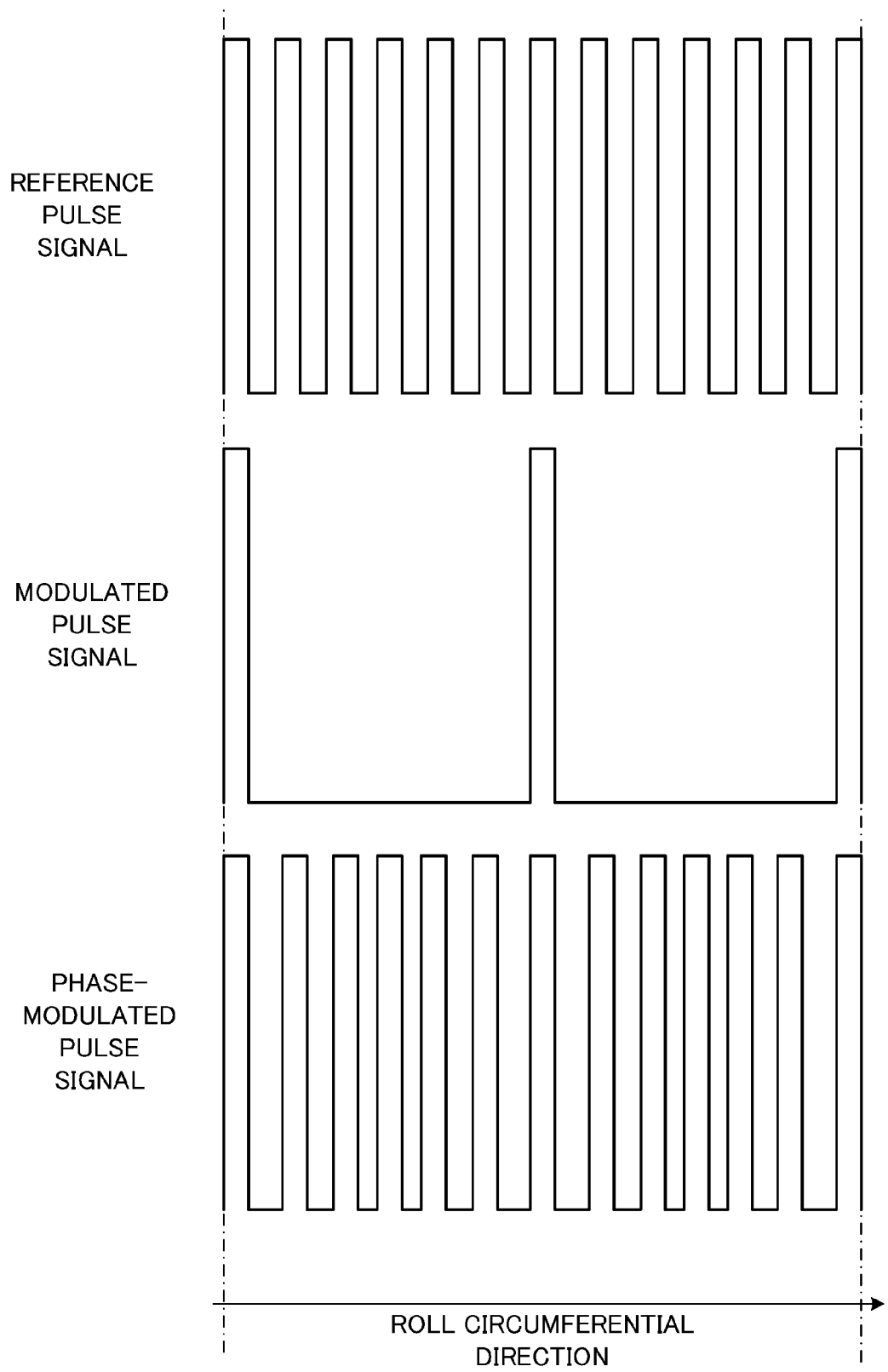
FIG. 28 is an explanatory diagram to explain an example for setting a phase-modulated pulse signal from the reference pulse signal and modulated pulse signal in the exposure apparatus for forming the substrate for semiconductor light emitting device according to this Embodiment.

FIG. 28 is an explanatory diagram to explain an example for setting a phase-modulated pulse signal from the reference pulse signal and modulated pulse signal in the exposure apparatus for forming the substrate for semiconductor light emitting device according to this Embodiment. The relationship among the reference pulse signal, modulated pulse signal and phase-modulated pulse signal will be described with reference to FIG. 28. When the phase of the reference pulse signal is increased or decreased periodically with the wavelength of the modulated pulse signal, the signal is the phase-modulated pulse signal. For example, when a reference pulse frequency fY0 is expressed by the following equation (7) and a modulation frequency fYL is expressed by the following equation (8), the frequency-modulated modulated pulse signal fY is expressed by the following equation (9).

$$fY0 = A\ \sin(\omega 0 t + \Phi 0) \quad (7)$$

$$fYL = B\ \sin(c\omega 1 t + \Phi 1) \quad (8)$$

$$fY = A\ \sin(\omega 0 t + \Phi 0 + C\ \sin(\omega 1 t)) \quad (9)$$

Further, as expressed by the following equation (10), it is also possible to obtain a phase-modulated pulse signal fY' by adding a sine curve obtained from the modulated pulse signal to the reference pulse frequency fY0.

$$fY' = fY0 + C'\ \sin(t \cdot fYL/fY0 \times 2\pi) \quad (10)$$

Furthermore, by adding a sine curve obtained from the wavelength LYL of the modulated pulse signal to the pulse wavelength LY0 of the reference pulse, it is possible to obtain the wavelength LY of the phase-modulated pulse signal.

As shown in FIG. 28, the obtained phase-modulated pulse signal is a signal such that the pulse interval of the reference pulse signal increases and decreases periodically corresponding to the signal interval of the modulated pulse signal.

Further, as shown in FIG. 24, in order to form two long periods in the D1 direction or the D2 direction, for example, it is possible to form by adding a period of another modulated pulse to the equation (10) to be equation (11).

$$fY'' = fY0 + C''\ \sin(t \cdot fYL/fY0 \times 2\pi + t \cdot fYL'/fY0 \times 2\pi) \quad (11)$$

In the equation (11), the phase-modulated pulse signal fY" is obtained by adding the sine curve obtained from the modulated pulse signal having two periods to the reference pulse frequency fY0. Two modulation frequencies fYL and fYL' in the equation (11) are two long periods in the semiconductor light emitting apparatus of this Embodiment, respectively.

At this point, in this Embodiment, the phase-modulated pulse signal is obtained by adjusting and controlling the modulated pulse signal so that the long periods are 1 μm or more, or six or more times the optical wavelength of the first light and six or more times the optical wavelength of the second light.

Figure 29:
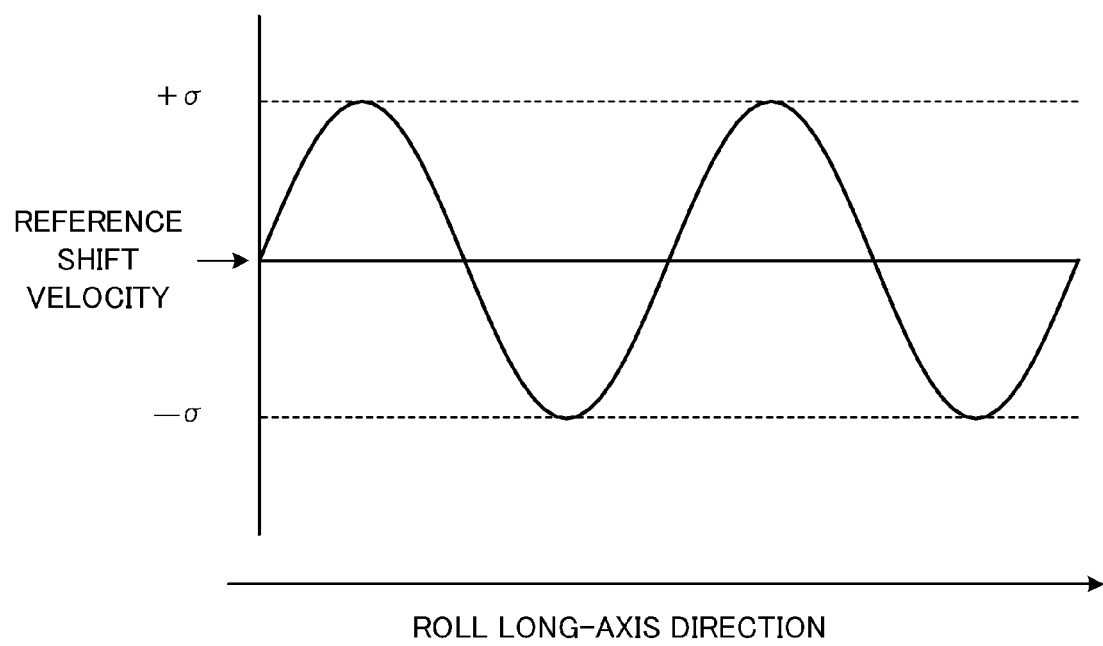
FIG. 29 is an explanatory view to explain an example of a shift velocity of a processing head portion to apply laser light in the exposure apparatus for forming the substrate for semiconductor light emitting device according to this Embodiment.

Further, in the exposure apparatus 400, it may be configured to controls pulse signal of laser exposure by the processing head portion 403 using a reference pulse signal with a certain frequency instead of the phase-modulated pulse signal, and to increase or decrease periodically the shift velocity of the processing head portion 403 by the shift mechanism section 404. In this case, for example, as shown in FIG. 29, the shift velocity of the processing head portion 403 is periodically increased and decreased. FIG. 29 is an explanatory view to explain an example of the shift velocity of the processing head portion to apply laser light in the exposure apparatus for forming the substrate for semiconductor light emitting device according to this Embodiment. The shift velocity as shown in FIG. 29 is an example of the shift velocity of reference shift velocity±σ. The shift velocity is preferably synchronized with rotation of the roll-shaped member 401, and for example, is controlled so that the velocity in the Z-phase signal is the velocity as shown in FIG. 29.

The foregoing description is given to the case where the pattern 406 (see FIG. 26) is controlled by periodical phase modulation, and it is also possible to form the pattern 406 by random phase modulation that is not periodical. For example, in the first direction D1, the pitch Py is inversely proportional to the pulse frequency. Therefore, when random frequency modulation is performed on the pulse frequency so that the maximum phase deviation is ⅒, the pitch Py has a variable width δ1 (maximum variable width) that is ⅒ the pitch Py, and it is possible to obtain a pattern in which the pitch Py increases and decreases randomly.

For the control frequency of the reference signal synchronized with rotation, the modulated pulse signal may be controlled by the reference signal with a frequency of a plurality of times such as each one roll rotation, or may be controlled only by the initial reference signal set at the exposure initial time. In the case of controlling only by the initial reference signal, when modulation occurs in the number of revolutions of the rotation control section 402, phase modulation occurs in the exposure pulse signal. This is because of rotation control of nano-order, and therefore, even in a minute potential variation of the rotation control section 402, a pitch variation of nano-order occurs and is accumulated. In the case of a pattern pitch with a pitch of 500 nm, when the roll outer circumferential length is 250 mm, laser exposure is performed 500,000 times, and only a deviation of 1 nm every 10,000 times results in a deviation of 50 nm.

Also in the same pitch and same long period, by adjusting the control frequency of the reference signal, it is possible to prepare the fine structure with the arrangement as shown in FIG. 14 or 17. In the case of forming the fine structure with the arrangement as shown in FIG. 14, the control frequency of the reference signal is decreased. Meanwhile, in the case of forming the fine structure with the arrangement as shown in FIG. 17, the control frequency of the reference signal is increased. Therefore, in the arrangement as shown in FIG. 17, the phases (positions) in the second direction D2 corresponding dots are matched, and in the arrangement as shown in FIG. 14, deviations occur in the phases (positions) in the second direction D2 of corresponding dots. The relationship between the arrangements as shown in FIGS. 16 and 18 is the same.

The roll-shaped member 401 with the resist layer provided on the surface exposed by the exposure apparatus 400 is developed, and the etching layer is etched by dry etching using the developed resist layer as a mask. After etching, by removing the residual resist layer, it is possible to obtain the roll-to-roll nanoimprint mold.

As a method of transferring the pattern 406 obtained as described above to a predetermined substrate for semiconductor light emitting device and obtaining the substrate for semiconductor light emitting device, the method is not limited particularly. For example, a pattern is transferred to the surface of a predetermined substrate for semiconductor light emitting device by the nanoimprint lithography method, the substrate for semiconductor light emitting device is etched by dry etching using the transferred pattern portion as a mask, and it is thereby possible to transfer the pattern 406 to the substrate for semiconductor light emitting device. Specifically, the roll-shaped member 401 with the pattern 406 formed is used as a cylindrical mold (roll-to-roll nanoimprint mold). A resist layer comprised of organic materials is formed on the frontside of the substrate for semiconductor light emitting device, the cylindrical mold is pressed against the resist layer, the pattern 406 is transferred to the resist layer, then the resist layer and substrate for semiconductor light emitting device are etched from the frontside to form the fine concavo-convex structure on the frontside of the substrate for semiconductor light emitting device, and it is possible to obtain the substrate for semiconductor light emitting device.

Further, instead of directly transferring the pattern 406 to the substrate for semiconductor light emitting device from the cylindrical mold (roll-shaped member 401), there is another method of transferring the pattern 406 once to a film, forming a resin mold, then forming the pattern on a substrate for semiconductor light emitting device by the nanoimprint lithography method using this resin mold, and obtaining the substrate for semiconductor light emitting device. According to this method, it is possible to increase usage efficiency of the mold, and absorb evenness of the substrate for semiconductor light emitting device, and therefore, as the method of transferring the pattern to the substrate for semiconductor light emitting device, the nano imprint lithography method using the resin mold is more preferable.

The method of transferring the pattern 406 from the cylindrical mold to the resin mold is not limited particularly, and for example, it is possible to apply a direct nanoimprint method. As the direct nanoimprint method, there are a thermal nanoimprint method of filling the pattern 406 of the cylindrical mold with a thermosetting resin while heating at a predetermined temperature, cooling the cylindrical mold, and then, releasing the cured thermosetting resin to transfer, and a photo-nanoimprint method of irradiating a photocurable resin filled in the pattern 406 of the cylindrical mold with light of a predetermined wavelength, curing the photocurable resin, and then, releasing the cured photocurable resin from the cylindrical mold to transfer.

The cylindrical mold (roll-shaped member 401) is a seamless cylindrical mold, and therefore, is particularly suitable for successively transferring to resin molds by roll-to-roll nanoimprint.

Further, there is a method of preparing an electrocast mold from a resin mold with the pattern 406 transferred thereto by electrocasting, and forming the pattern by the nanoimprint lithography method using this electrocast mold. In the case of forming an electrocast mold, such a case is preferable in terms of extending life of the cylindrical mold that is an original mold, and also in a scheme of once forming an electrocast mold, since it is possible to absorb evenness of the substrate for semiconductor light emitting device, a method of further forming a resin mold is preferable.

Furthermore, in the resin mold method, repetition transfer is easy, and the method is preferable. Herein, "repetition transfer" means either or both of (1) of manufacturing a plurality of concavo-convex pattern transfer materials inversely transferred from the resin mold (+) having the concavo-convex pattern, and (2) of, in the case of particularly using a curable resin composition as a transfer agent, obtaining a transfer material (−) inverted from the resin mold (+), next using the transfer material (−) as a resin mold (−) to obtain an inversely transferred transfer material (+) and performing repetition pattern inversion transfer of 凸凹/ 凹凸/凸凹/ 凹凸/ . . . /. In addition, (+) means a male mold, and (−) means a female mold.

After forming the pattern on the frontside of the substrate for semiconductor light emitting device using the resist layer, concavities and convexities are formed on the substrate for semiconductor light emitting device by etching using the resist layer as a mask. As the etching method, methods are not limited particularly, as long as the methods allow concavities and convexities to be formed on the substrate for semiconductor light emitting device using the resist layer as a mask, and it is possible to apply wet etching, dry etching and the like. Particularly, since it is possible to deeply form concavities and convexities of the substrate for semiconductor light emitting device, dry etching methods are preferable. Among the dry etching methods, anisotropic dry etching is preferable, and ICP-RIE and ECM-RIE are preferable. As a reactive gas used in dry etching, gases are not limited particularly, as long as the gases react with materials of the substrate for semiconductor light emitting device. $BCl_3$, $Cl_2$, $CHF_3$ or mixture gas thereof is preferable, and it is possible to mix Ar, $O_2$ and the like as appropriate.

As a method of applying the pattern 406 obtained as described above to, for example, the two-dimensional photonic crystal 201 of the semiconductor light emitting device 200 as described in FIG. 11 except the substrate for semiconductor light emitting device, the methods are not limited particularly as in the foregoing. For example, it is possible to transfer the pattern 406 to the transparent conductive film, by transferring the pattern to the surface of a predetermined transparent conductive film by the nanoimprint lithography method, and etching the transparent conductive film by etching using the transfer pattern portion as a mask.

Further, it is possible to make the semiconductor light emitting device in the semiconductor light emitting apparatus of this Embodiment, by forming a film having a refractive index substantially equal to that of the transparent conductive film on the surface of the transparent conductive film, and transferring the pattern 406 to the film as in the foregoing.

EXAMPLES

The present invention will more specifically be described below based on Examples performed to clarify the effects of the invention. In addition, materials, use compositions, processing steps and the like in the following Examples are illustrative, and are capable of being carried into practice with modifications thereof as appropriate. Moreover, it is possible to carry into practice with modifications thereof as appropriate without departing from the scope of the invention. Therefore, the invention is not limited to the following Examples at all.

Example 1

Cylindrical Mold Preparation (Preparation of Molds for Resin Mold Preparation)

Cylindrical quartz glass rolls with a diameter of 80 mm and a length of 50 mm were used as substrates for semiconductor light emitting device of cylindrical molds. A fine structure (fine concavo-convex structure) was formed on the cylindrical quartz glass roll surface by a direct-write lithography method using a semiconductor pulse laser by the following method.

First, a resist layer is deposited on the fine structure on the quartz glass surface by a sputtering method. The sputtering method was carried out with power of RF 100 W using CuO as a target (resist layer). The film thickness of the resist layer after deposition was 20 nm. The cylindrical mold prepared as described above was exposed on the following conditions, while rotating at linear speed s=1.0 m/sec. to prepare the cylindrical mold having two types of long periods.

Exposure semiconductor laser wavelength: 405 nm
Exposure laser power: 3.5 mV

Cylindrical Mold A:
  Pitch Px in the X-axis direction: 398 nm
  Variable width δ2 with respect to the pitch Px in X-axis direction: 40 nm
  Long-period unit PxL in the X-axis direction of the variable width δ2: 3.98 μm
  Pitch Py in the Y-axis direction: 460 nm
  Variable width δ1 with respect to the pitch Py in the Y-axis direction: 46 nm
  Long-period unit PyL in the Y-axis direction of the variable width δ1: 4.60 μm Cylindrical Mold B:
  Pitch Px in the X-axis direction: 398 nm
  Variable width δ2 with respect to the pitch Px in the X-axis direction: 40 nm
  Long-period unit PxL in the X-axis direction of the variable width δ2: 1.99 μm
  Pitch Py in the Y-axis direction: 460 nm
  Variable width δ1 with respect to the pitch Py in the Y-axis direction: 46 nm
  Long-period unit PyL in the Y-axis direction of the variable width δ1: 2.33 μm The pitch Py in the Y-axis direction is determined as described below. Time T required for one circumference is measured using a Z-phase signal of a spindle motor as a reference, a circumferential length L is calculated from the linear speed s, and the following equation (12) is obtained.

$$L = T \times s \quad (12)$$

Assuming a target pitch as Py, a value of 0.1% or less of the target pitch Py is added to adjust so that L/Py is an integer, and an effective pitch Py' is obtained by the following equation (13).

$$L/Py' = m \ (m \text{ is an integer}) \quad (13)$$

With respect to the target pitch Py and effective pitch Py', although strictly Py≠Py', since L/Py≈$10^7$, the equation of |Py−Py'|/Py'≈$10^{-7}$ holds, and it is possible to handle so that Py and Py' are substantially equal. Similarly, with respect to the long-period unit PyL, an effective long-period unit PyL' is obtained by the following equation (14) so that L/PyL is an integer.

$$L/PyL' = n \ (n \text{ is an integer}) \quad (14)$$

Also in this case, although strictly PyL≠PyL', since L/PyL≈$10^5$, the equation of |PyL−PyL'|/PyL'≈$10^{-5}$ holds, and it is possible to handle so that PyL and PyL' are substantially equal.

Next, from the effective pitch Py', a reference pulse frequency fy0 and fyL are calculated by equations (15) and (16).

$$fy0 = s/Py' \quad (15)$$

$$fyL = s/PyL' \quad (16)$$

Finally, from the equations (15) and (16), a pulse frequency fy at elapsed time t from the Z-phase signal of the spindle motor is determined as in equation (17).

$$fy = fy0 + \delta1 \times \sin(t \times (fyL/fy0) \times 2\pi) \quad (17)$$

An axis feed velocity in the X-axis direction is determined as described below. The time T required for one circumference is measured using the Z-phase signal of the spindle motor as a reference, and a reference feed velocity Vx0 in the axis direction is determined, from the pitch Px in the X-axis direction as in the following equation (18).

$$Vx0 = Px/T \quad (18)$$

The axis feed velocity Vx at time t is determined from the long-period unit PxL in the X-axis direction by the following equation (19) and scanning is performed.

$$Vx = Vx0 + V\delta2 \cdot \sin(Px/PxL \times t \times 2\pi) \quad (19)$$

Herein, Vδ2 is a velocity variable width in the long-period unit PxL in the X-axis direction, and is expressed with the pitch variable width δ2 of the long-period unit PxL, pitch Px in the X-axis and reference feed velocity Vx0 in the axis direction by the following equation (20).

$$V\delta2 = \delta2 \times Vx0/Px \quad (20)$$

Next, the resist layer was developed, and using the developed resist layer as a mask, etching of the etching layer was performed by dry etching. The dry etching was carried out using $SF_6$ as an etching gas on the conditions of the treatment gas pressure of 1 Pa, treatment power of 300 W, and treatment time of 5 minutes. Next, only the residual resist layer was removed from the cylindrical mold provided with the fine structure on the surface on the condition of 6 minutes using hydrochloric acid of pH=1 to prepare a cylindrical mold (mold for transfer).

(Preparation of Resin Molds)

Each of the obtained two types of cylindrical quartz glass roll surfaces (molds for transfer) was coated with Durasurf (Registered Trademark, the same in the following description) HD-1101Z (made by Daikin Industries, Ltd.), heated at 60° C. for 1 hour, and then, allowed to stand at room temperature for 24 hours to fix. Then, cleaning was performed three times using Durasurf HD-ZV (made by Daikin Industries, Ltd.), and mold release treatment was performed.

Next, reel-shaped resin molds were prepared from the obtained cylinder molds. OPTOOL (Registered Trademark, the same in the following description) DAC (made by Daikin Industries, Ltd.), trimethyloipropane triacrylate (made by TOAGOSEI Co., Ltd. M350), and Irgacure (Registered Trademark, the same in the following description) 184 (made by Ciba) were mixed in a ratio of 10:100:5 in parts by weight to prepare a photocurable resin. Next, the photocurable resin was coated on an easy adhesion surface of a PET film (A4100, made by Toyobo Co., Ltd.: width 300 mm, thickness 100 μm) by Micro Gravure coating (made by Yasui Seiki Co., Ltd.) so that the coating film thickness was 6 μm.

Next, the PET film coated with the photocurable resin was pressed against each of the cylinder molds (cylindrical molds) with a nip roll (0.1 MPa), and was irradiated with ultraviolet rays at a temperature of 25° C. and humidity of 60% under atmospheric pressure using a UV exposure apparatus (made by Fusion UV Systems•Japan Co., Ltd., H bulb) so that the integral amount of exposure below the center of the lamp was 600 $mJ/cm^2$, photo-curing was carried out successively, and obtained were reel-shaped transparent resin molds (length 200 m, width 300 mm) with the fine structure inversely transferred to the surface.

When the resin molds were checked with a scanning electron microscope, two types of resin molds A and B were obtained in which convex portions of cross-sectional shape with Φ400 nm and h800 nm were formed in periodical structure having the following long period structure.

Resin Mold A:
  Pitch Px in the X-axis direction: 398 nm
  Variable width δ2 with respect to the pitch Px in X-axis direction: 40 nm
  Long-period unit PxL in the X-axis direction of the variable width δ2: 3.98 μm
  Pitch Py in the Y-axis direction: 460 nm
  Variable width δ1 with respect to the pitch Py in the Y-axis direction: 46 nm
  Long-period unit PyL in the Y-axis direction of the variable width δ1: 4.60 μm Resin Mold B:
  Pitch Px in the X-axis direction: 398 nm
  Variable width δ2 with respect to the pitch Px in the X-axis direction: 40 nm
  Long-period unit PxL in the X-axis direction of the variable width δ2: 1.99 μm
  Pitch Py in the Y-axis direction: 460 nm
  Variable width δ1 with respect to the pitch Py in the Y-axis direction: 46 nm
  Long-period unit PyL in the Y-axis direction of the variable width δ1: 2.33 μm (Electron Microscope)
Apparatus; HITACHI s-5500
Acceleration voltage; 10 kV
MODE; Normal (Preparation of Inversed Resin Molds)

Next, OPTOOL DAC HP (made by Daikin Industries, Ltd.), trimethylolpropane triacrylate (made by TOAGOSEI Co., Ltd. M350), and Irgacure 184 (made by Ciba) were mixed in a ratio of 10:100:5 in parts by weight to prepare a photocurable resin. The photocurable resin was coated on the easy adhesion surface of the PET film (A4100, made by Toyobo Co., Ltd.: width 300 mm, thickness 100 μm) by Micro Gravure coating (made by Yasui Seiki Co., Ltd.) so that the coating film thickness was 2 μm.

Next, the PET film coated with the photocurable resin was pressed against each of the above-mentioned reel-shaped resin molds with the nip roll (0.1 MPa), and was irradiated with ultraviolet rays at a temperature of 25° C. and humidity of 60% under atmospheric pressure using the UV exposure apparatus (made by Fusion UV Systems Japan Co., Ltd., H bulb) so that the integral amount of exposure below the center of the lamp was 600 $mJ/cm^2$, photo-curing was carried out successively, and obtained were sheet-shaped transparent resin molds A and B (length 200 mm, width 300 mm) with the fine structures of the resin molds A and B inversely transferred to the surfaces, respectively.

(Nanoimprint Lithography: Sapphire Substrate)

Mask materials were applied onto a C-surface sapphire substrate with Φ2" and thickness of 0.33 mm for semiconductor light emitting device by a spin coating method (2,000 rpm, 20 seconds) to form a resist layer. Prepared as the mask materials was a coating solution obtained by diluting with propylene glycol monomethyl ether so that the solid content of a photosensitive resin composition was 5 weight %.

(Photosensitive Resin Composition)

As the photosensitive resin composition, mixed and used were 20 parts by weight of 3-ethyl-3-{[3-ethyloxetane-3-yl)methoxy]methyl}oxetane (OXT-221, made by TOAGOSEI Co., Ltd.), 80 parts by weigh of 3',4'-epoxycyclohexane carboxylic acid 3,4-epoxycyclohexylmethyl (made by Wako Pure Chemical Industries Co., Ltd.), 50 parts by weight of phenoxy diethylene glycol acrylate (Aronix (Registered Trademark, the same in the following description) M-101A, made by Toagosei Co., Ltd.), 50 parts by weight of ethylene oxide-modified bisphenol A diacrylate (Aronix M-211B, made by Toagosei Co., Ltd.), 8 parts by weight of DTS-102 (made by Midori Kagaku Co., Ltd.), 1 part by weight of 1,9-dibutoxy anthracene (Anthracure (Registered Trademark) UVS-1331, made by Kawasaki Kasei Chemicals), 5 parts by weight of Irgacure 184 (made by Ciba), and 4 parts by weight of OPTOOL DAC HP (solid content of 20%, made by Daikin Industries, Ltd.).

The transparent resin mold B was cut in 70 mm×70 mm (□70 mm) and was bonded onto the sapphire substrate for semiconductor light emitting device with the resist layer formed. For bonding, used was a sheet lamination machine (TMS-S2) made by Sun-Tec Co., Ltd. and lamination was performed with lamination nip force of 90 N and lamination velocity of 1.5 m/s. Next, laminated integrated transparent resin mold/resist layer/sapphire substrate for semiconductor light emitting device was sandwiched between two transparent silicone plates (hardness 20) of □70 mm×t 10 mm. In this state, using a nanoimprint apparatus (EUN-4200) made by Engineering System Co., Ltd., the resultant was pressed with a pressure of 0.05 MPa. In the pressed state, ultraviolet rays were applied from the transparent resin mold side with 2,500 mJ/cm$^2$ to cure the resist layer. After curing, the transparent silicone plates and transparent resin mold were removed to obtain a resist/sapphire layered product with the pattern formed on the C-surface.

(Etching: Sapphire Substrate for Semiconductor Light Emitting Device)

Using a reactive ion etching apparatus (RIE-101iPH, made by SAMCO Inc.), the sapphire substrate for semiconductor light emitting device was etched on the following etching conditions.

Etching gas: $Cl_2/(Cl_2+BCl_3)=0.1$
Gas flow rate: 10 sccm
Etching pressure: 0.1 Pa
Antenna: 50 w
Bias: 50 w After etching, when the cross section of the sapphire substrate for semiconductor light emitting device was checked with the electron microscope, it was understood that convex portions of cross-sectional shape with Φ400 nm and h=250 nm were formed as a periodical structure including the same long period structure as in the transparent resin mold B used in nanoimprint.

(Formation of Semiconductor Light Emitting Device)

On the obtained sapphire substrate for semiconductor light emitting device, by MOCVD, layered successively were (1) a GaN low-temperature buffer layer, (2) an n-type GaN layer, (3) an n-type AlGaN clad layer, (4) an InGaN light emitting layer (MQW), (5) a p-type AlGaN clad layer, (6) a p-type GaN layer, and (7) an ITO layer. Concavities and convexities on the sapphire substrate for semiconductor light emitting device were embedded in layering (2) the n-type GaN layer, and the flattened deposition condition was made. By the above-mentioned configurations, the emitted light from the semiconductor layer was 460 nm, and the optical wavelength in the GaN layer (refractive index: 2.46) was 187 nm.

(Nanoimprint: ITO)

Next, mask materials were applied to the ITO layer formed on the surface by the spin coating method (2,000 rpm, 20 seconds) to form a resist layer. Prepared as the mask materials was a coating solution obtained by diluting with propylene glycol monomethyl ether so that the solid content of the above-mentioned photosensitive resin composition was 5 weight %.

The transparent resin mold A was cut in 70 mm×70 mm (□70 mm) and was bonded onto the ITO with the resist layer formed. For bonding, used was the sheet lamination machine (TMS-S2) made by Sun-Tec Co., Ltd. and lamination was performed with lamination nip force of 90 N and lamination velocity of 1.5 m/s. Next, laminated integrated transparent resin mold/resist layer/ITO layer/layered semiconductor layer/sapphire substrate for semiconductor light emitting device was sandwiched between two transparent silicone plates (hardness 20) of □70 mm×t 10 mm. In this state, using the nanoimprint apparatus (EUN-4200) made by Engineering System Co., Ltd., the resultant was pressed with a pressure of 0.05 MPa. In the pressed state, ultraviolet rays were applied from the transparent resin mold side with 2,500 mJ/cm$^2$ to cure the resist layer. After curing, the transparent silicone plates and transparent resin mold were removed to obtain a resist/ITO/layered semiconductor layer with the ITO surface pattern formed.

(Etching: ITO Layer)

Using the reactive ion etching apparatus (RIE-101iPH, made by SAMCO Inc.), the ITO layer was etched on the following etching conditions.

Etching gas: $Cl_2/(Cl_2+BCl_3)=0.1$
Gas flow rate: 10 sccm
Etching pressure: 0.1 Pa
Antenna: 50 w
Bias: 50 w After etching, when observation was performed on the ITO surface with the electron microscope, it was understood that convex portions of cross-sectional shape with Φ400 nm and h=50 nm were formed as a periodical structure including the same long period structure as in the reel-shaped transparent resin mold A used in nanoimprint. The optical wavelength inside the ITO layer (refractive index: 2.0) was 230 nm with respect to the emitted light 460 nm from the semiconductor layer of the ITO layer. Further, etching treatment was performed, and electrode pads were attached.

(Semiconductor Light Emitting Apparatus)

The semiconductor light emitting device obtained as described above was disposed in a package, and was electrically connected with the electrode pads via Au wire. Next, the inside of the package was filled with the wavelength conversion member obtained by mixing $CaAlSiN_3$:Eu (fluorescent material) with a main wavelength of 650 nm into a silicone resin.

In this state, a current of 20 mA was passed between the cathode and the anode to measure light emission output. Table 4 shows the light emission output ratio with light emission output from a semiconductor light emitting apparatus of Comparative Example 1 being "1". In Example 1, as compared with Comparative Example 1, it was understood that any fluctuations specific to diffraction were not observed in the emitted light from the semiconductor light emitting device, and that there was little emission angle dependence.

Example 2

A cylindrical mold prepared as in Example 1 was exposed on the following conditions, while rotating at linear speed s=1.0 m/sec.

Cylindrical Mold C:
Exposure semiconductor laser wavelength: 405 nm
Exposure laser power: 3.5 mV
Pitch Px in the X-axis direction: 260 nm
Variable width δ2 with respect to the pitch Px in the X-axis direction: 26 nm
Long-period unit PxL1 in the X-axis direction of the variable width δ2: 2.60 μm
Pitch Py in the Y-axis direction: 300 nm
Variable width δ1 with respect to the pitch Py in the Y-axis direction: 30 nm
Long-period unit PyL1 in the Y-axis direction of the variable width δ1: 2.60 μm
Long-period unit PyL2 in the Y-axis direction of the variable width δ1: 1.30 μm The pitch Py in the Y-axis direction is determined as described below. Time T required for one circumference is measured using the Z-phase signal of the spindle motor as a reference, a circumferential length L is calculated from the linear speed s, and the following equation (12) is obtained.

$$L = T \times s \tag{12}$$

Assuming a target pitch as Py, a value of 0.1% or less of the target pitch Py is added to adjust so that L/Py is an integer, and an effective pitch Py' is obtained by the following equation (13).

$$L/Py' = m \ (m \text{ is an integer}) \tag{13}$$

With respect to the target pitch Py and effective pitch Py', although strictly Py≠Py', since L/Py≈$10^7$, the equation of |Py−Py'|/Py'≈$10^{-7}$ holds, and it is possible to handle so that Py and Py' are substantially equal. Similarly, with respect to the long-period unit PyL1, effective long-period units PyL1' and PyL2' are obtained by the following equations (21) and (22) so that L/PyL1 is an integer.

$$L/PyL1' = n \ (n \text{ is an integer}) \tag{21}$$

$$L/PyL2' = m \ (m \text{ is an integer}) \tag{22}$$

Also in this case, although strictly PyL1≠PyL1' and PyL2≠PyL2', since L/PyL≈$10^5$, the equations of |PyL1−PyL1'|/PyL1'≈$10^{-5}$ and |PyL2−PyL2'|/PyL2'≈$10^{-5}$ hold, and it is possible to handle to be substantially equal.

Next, from the effective pitch Py', a reference pulse frequency fy0 and modulation frequency fyL are calculated by equations (15), (23) and (24).

$$fy0 = s/Py' \tag{15}$$

$$fyL1 = s/PyL1' \tag{23}$$

$$fyL1 = s/PyL2' \tag{24}$$

Finally, from the equations (15), (23) and (24), a pulse frequency fy at elapsed time t from the Z-phase signal of the spindle motor is determined as in equation (25).

$$fy = fy0 + \delta1 \times \sin(tx(fyL1/fy0) \times 2\pi + tx(fyL2/fy0) \times 2\pi) \tag{25}$$

Next, as in Example 1, obtained was a reel-shaped transparent resin mold (length 200 m, width 30.0 mm) with the surface structure inversely transferred.

When the resin mold was checked with the scanning electron microscope, a resin mold C was obtained in which convex portions of cross-sectional shape with Φ250 nm and h500 nm were formed in periodical structure having the following long period structure.

Resin Mold C:
Exposure semiconductor laser wavelength: 405 nm
Exposure laser power: 3.5 mV
Pitch Px in the X-axis direction: 260 nm
Variable width δ2 with respect to the pitch Px in the X-axis direction: 26 nm
Long-period unit PxL1 in the X-axis direction of the variable width δ2: 2.60 μm
Pitch Py in the Y-axis direction: 300 nm.
Variable width δ1 with respect to the pitch Py in the Y-axis direction: 30 nm
Long-period unit PyL1 in the Y-axis direction of the variable width δ1: 2.60 μm
Long-period unit PyL2 in the Y-axis direction of the variable width δ1: 1.30 μm Hereinafter, as in Example 1, the pattern of the resin mold C was transferred to the surface of the sapphire substrate for semiconductor light emitting device to prepare a semiconductor light emitting device.

The semiconductor light emitting device obtained as described above was disposed in a package, and was electrically connected with the electrode pads via Au wire. Next, the inside of the package was filled with the wavelength conversion member obtained by Mixing each of CaAlSiN$_3$:Eu (fluorescent material) with a main wavelength of 650 nm and β-SiAlON:Eu (fluorescent material) with a main wavelength of 530 nm into a silicone resin.

Table 4 shows the light emission output ratio of Example 2 at 20 mA. As in Example 1, the emitted light with glare specific to diffraction was not observed, and there was little emission angle dependence.

Example 3

The semiconductor light emitting device as in Example 2 was disposed in a package, and was electrically connected with the electrode pads via Au wire. Next, the inside of the package was filled with the wavelength conversion member obtained by mixing fluorescent materials with the following main wavelengths into a silicone resin.

530 nm β-SiAlON:Eu
580 nm Ca-α-SiAlON:Eu
650 nm CaAlSiN$_3$:Eu

Table 4 shows the light emission output ratio of Example 3 at 20 mA. In Example 3, as in Examples 1 and 2, the emitted light with glare specific to diffraction was not observed, and there was little emission angle dependence.

Comparative Example 1

On the same conditions as in Example 1, a semiconductor light emitting device was formed on a normal flat sapphire substrate for semiconductor light emitting device, and was then sealed with the same wavelength conversion member as in Example 1, and light emission output was measured.

Comparative Example 2

By the same method as in Example 1, a fine structure (fine concavo-convex structure) of nano-pattern was formed on a quartz glass surface by the direct-write lithography method using the semiconductor laser. Pitches in the X-axis direction and the Y-axis direction were the same, and a hexagonal arrangement without pitch variations was made.

Pitch Px in the X-axis direction: 398 nm
Pitch Py in the Y-axis direction: 460 nm Subsequently, by the same methods as in Example 1, a semiconductor light emitting apparatus was formed, and light emission output was measured. In the emitted light from the obtained semiconductor light emitting device, diffracted light specific to diffraction structure was strongly observed, and the emission angle distribution was large.

Comparative Example 3

By the same method as in Example 1, a fine structure (fine concavo-convex structure) of nano-pattern was formed on a quartz glass surface by the direct-write lithography method using the semiconductor laser. Pitches in the X-axis direction and the Y-axis direction were the same, and a hexagonal arrangement without pitch variations was made.

Pitch Px in the X-axis direction: 260 nm
Pitch Py in the Y-axis direction: 300 nm Subsequently, by the same methods as in Example 1, a semiconductor light emitting apparatus was formed, and light emission output was measured. In the emitted light from the obtained semiconductor light emitting device, diffracted light specific to diffraction structure was strongly observed, and the emission angle distribution was large.

The relationship between the period of the two-dimensional photonic crystal and the optical wavelength in Examples 1, 2 and 3 are summarized and shown in Tables 1, 2 and 3.

In each of the Examples, it was understood that the crystal has two or more periods of 1 μm or more. Further, it was understood that the crystal has the period six or more times the optical wavelength, and that the number of the periods is two or more.

Example 1

[Table 1]

Example 2

[Table 2]

Example 3

[Table 3]

Table 4 shows the light emission output ratio of each sample with the output of Comparative Example 1 being "1". From Table 4, according to the semiconductor light emitting apparatuses (Examples 1 to 3) according to this Embodiment, as compared with the conventional flat sapphire substrate (Comparative Example 1) for semiconductor light emitting device, and the conventional sapphire substrate (Comparative Example 2) for semiconductor light emitting device having the two-dimensional photonic crystal without having the period six or more times the optical wavelength, it was understood that it is possible to reduce the number of dislocation defects inside the semiconductor layer deposited on the sapphire substrate for semiconductor light emitting device, it is also possible to resolve the waveguide mode due to light scattering caused by the concave-convex pattern with periodicity disturbed to increase the light extraction efficiency, and that it is thereby possible to obtain the semiconductor light emitting devices with high luminous efficiency. Further, it was understood that there was little angle dependence in light emission characteristics from the light emitting devices, and therefore, the devices are suitable light emitting devices in industrial practical use.

The angle dependence was observed by visually checking emission conditions at 20 mA, and was evaluated while regarding the case where strong emitted light was observed at a particular angle or color of the emitted light changed according to the observation angle as being strong in the angle dependence and X.

Further, three-dimensional emission conditions at 20 mA were measured with a light distribution spectrometer (IMS5000-LED made by Asahi Spectra Co., Ltd.), and were represented by a coefficient of variation (coefficient of variation=standard deviation/average value) of the emission intensity distribution in the circumferential direction at an elevation angle of 45 degrees.

As shown in Table 4, the coefficient of variation exceeded 10% in Comparative Examples 2 and 3. On the other hand, Examples 1 to 3 show coefficients of variation almost the same as in Comparative Example 1 of the flat substrate without the angle dependence, and it was understood that it is possible to make the coefficient lower than 4%. By this means, in the Examples, it was understood that strong emitted light was not observed at any particular angle, and that there was little angle dependence.

[Table 4]

Example 4

(Formation of the Layered Semiconductor)

On a sapphire substrate for semiconductor light emitting device, by MOCVD, layered successively were (1) a GaN low-temperature buffer layer, (2) an n-type GaN layer, (3) an n-type AlGaN clad layer, (4) an InGaN light emitting layer (MQW), (5) a p-type AlGaN clad layer, (6) a p-type GaN layer, and (7) an ITO layer. By the above-mentioned configuration, the emitted light from the semiconductor layer was 460 nm, and the film thickness of the ITO layer was made 600 nm.

(Nanoimprint: ITO)

Next, mask materials were applied to the ITO layer formed on the surface by the spin coating method (2,000 rpm, 20 seconds) to form a resist layer. Prepared as the mask materials was a coating solution obtained by diluting with propylene glycol monomethyl ether so that the solid content of the above-mentioned photosensitive resin composition was 5 weight %.

The transparent resin mold C was cut in 70 mm×70 mm (□70 mm) and was bonded onto the ITO with the resist layer formed. For bonding, used was the sheet lamination machine (TMS-S2) made by Sun-Tec Co., Ltd. and lamination was performed with lamination nip force of 90 N and lamination velocity of 1.5 m/s. Next, laminated integrated transparent resin mold/resist layer/ITO layer/layered semiconductor layer/sapphire substrate for semiconductor light emitting device was sandwiched between two transparent silicone plates (hardness 20) of 70 mm×t 10 mm. In this state, using the nanoimprint apparatus (EUN-4200) made by Engineering System Co., Ltd., the resultant was pressed with a pressure of 0.05 MPa. In the pressed state, ultraviolet rays were applied from the transparent resin mold side with 2,500 mJ/cm$^2$ to cure the resist layer. After curing, the transparent silicone plates and transparent resin mold were removed to obtain a resist/ITO/layered semiconductor layer with the ITO surface pattern formed.

(Etching: ITO Layer)

Using the reactive ion etching apparatus (RIE-101iPH, made by SAMCO Inc.), the ITO layer was etched on the following etching conditions.

Etching gas: $BCl_3$
Gas flow rate: 10 sccm
Etching pressure: 0.2 Pa
Antenna: 150 w
Bias: 50 w After etching, when observation was performed on the ITO surface with the electron microscope, it was understood that a fine structure layer was obtained in which convex portions of cross-sectional shape with Φ230 nm and h=250 nm were formed as a periodical structure as in the reel-shaped transparent resin mold C used in nanoimprint, and that the two-dimensional photonic crystal having two different periods was formed.

The semiconductor light emitting device obtained as described above was disposed in a package, and was electrically connected with electrode pads via Au wire. Next, the surface of the fine structure layer was sealed with a silicone resin (refractive index 1.53) as an intermediate material so as to cover only the surface of the fine structure layer of the semiconductor light emitting device disposed inside the package, and subsequently, the silicone resin was cured. Then, the inside of the package was filled with the wavelength conversion member obtained by mix ng fluorescent materials with the following main wavelengths into a silicone resin (refractive index) as the first material. The average particle diameter of each of the used fluorescent materials was 200 nm.
530 nm β-SiAlON:Eu
580 nm Ca-α-SiAlON:Eu
650 nm CaAlSiN$_3$:Eu Example 5

In sealing the semiconductor light emitting device obtained as in Example 4 inside a package, the package was filled with only the wavelength conversion member obtained by mixing CaAlSiN$_3$:Eu (fluorescent material) with the main wavelength of 650 nm into the silicone resin (refractive index 1.5) used in Example 4.

Comparative Example 4

After forming a semiconductor light emitting device on a sapphire substrate for semiconductor light emitting device on the same conditions as in Example 4, the device was sealed with the wavelength conversion member as in Example 1 without providing the fine structure layer on the surface of the ITO layer, and the light emission output was measured.

Table 5 shows the light emission output ratio of each sample with the output of Comparative Example 4 being "1". From Table 5, in Example 4 in which the silicone resin as the intermediate material existed between the fine structure layer and the wavelength conversion member, as compared with Example 5 in which the fine structure layer was formed in contact with the wavelength conversion member, it is possible to resolve the waveguide mode inside the semiconductor light emitting device, further increase scattering properties of the fluorescent light, and increase the light extraction efficiency, and it is thereby possible to obtain the semiconductor light emitting device with high luminous efficiency. Further, by forming the two-dimensional photonic crystal having two different periods, it is possible to resolve the waveguide mode and increase scattering properties, it is thereby possible to obtain the semiconductor light emitting device with the light extraction efficiency further increased, and therefore, the device is a suitable light emitting device in industrial practical use.

[Table 5]

In addition, the present invention is not limited to the above-mentioned Embodiment, and is capable of being carried into practice with various modifications thereof. In the above-mentioned Embodiment, with respect to the size, shape and the like shown in the attached drawings, the invention is not limited thereto, and is capable of being carried into practice with modifications thereof as appropriate within the scope of exhibiting the effects of the invention. Further, the invention is capable of being carried into practice with modifications thereof as appropriate without departing from the scope of the object of the invention.

INDUSTRIAL APPLICABILITY

According to the semiconductor light emitting apparatus of the present invention, by decreasing the number of dislocation defects inside the semiconductor layer due to the fine structure layer provided in the semiconductor light emitting device, in the emitted light, it is possible to improve the internal quantum efficiency IQE, and in the emitted light and fluorescence, it is possible to resolve the waveguide mode by light scattering and to increase the light extraction efficiency LEE. Further, it is possible to efficiently convert the wavelength of the first emitted light emitted efficiently from the semiconductor light emitting device. By these effects, it is possible to increase final luminous efficiency of the semiconductor light emitting apparatus, and further, since it is possible to reduce the angle dependence of the emission distribution, it is possible to apply to industrial practical uses with ease. Furthermore, the semiconductor light emitting apparatus of the invention has high luminous efficiency, allows effective use of power, and is capable of significantly contributing to energy saving.

The present application is based on Japanese Patent Application No. 2013-121580 filed on Jun. 10, 2013, Japanese Patent Application No. 2013-152682 filed on Jul. 23, 2013, and Japanese Patent Application No. 2013-155598 filed on Jul. 26, 2013, entire contents of which are expressly incorporated by reference herein.

TABLE 1

|  | SAPPHIRE/GAN INTERFACE | | ITO/WAVELENGTH CONVERSION MEMBER INTERFACE | |
| --- | --- | --- | --- | --- |
| PERIOD/μm | 2.33 | | 4.6 | |
| EMISSION WAVELENGTH/nm | 460 | 650 | 460 | 650 |
| OPTICAL WAVELENGTH/nm | 187 | 264 | 230 | 325 |
| PERIOD/OPTICAL WAVELENGTH | 12.5 | 8.8 | 20 | 14.2 |

TABLE 2

|  | SAPPHIRE/GAN INTERFACE | | | | | |
| --- | --- | --- | --- | --- | --- | --- |
| PERIOD/μm | 2.33 | | | 1.3 | | |
| EMISSION WAVELENGTH/nm | 460 | 530 | 650 | 460 | 530 | 650 |
| OPTICAL WAVELENGTH/nm | 187 | 215 | 264 | 187 | 215 | 264 |
| PERIOD/OPTICAL WAVELENGTH | 12.5 | 10.8 | 8.8 | 7 | 6 | 4.9 |

TABLE 3

|  | SAPPHIRE/GAN INTERFACE | | | | | | | |
| --- | --- | --- | --- | --- | --- | --- | --- | --- |
| PERIOD/μm | 2.33 | | | | 1.3 | | | |
| EMISSION WAVELENGTH/nm | 460 | 530 | 580 | 650 | 460 | 530 | 580 | 650 |
| OPTICAL WAVELENGTH/nm | 187 | 215 | 236 | 264 | 187 | 215 | 236 | 264 |
| PERIOD/OPTICAL WAVELENGTH | 12.5 | 10.8 | 9.9 | 8.8 | 7 | 6 | 5.5 | 4.9 |

TABLE 4

|  | LIGHT EMISSION OUTPUT RATIO | ANGLE DEPENDENCE | COEFFICIENT OF VARIATION (%) AT ELEVATION ANGLE OF 45° |
|---|---|---|---|
| EXAMPLE 1 | 2.1 | ○ | 3.6 |
| EXAMPLE 2 | 2.4 | ○ | 3.2 |
| EXAMPLE 3 | 2.5 | ○ | 3.3 |
| COMPARATIVE EXAMPLE 1 | 1 | ○ | 3.1 |
| COMPARATIVE EXAMPLE 2 | 1.35 | x | 13.3 |
| COMPARATIVE EXAMPLE 3 | 1.5 | x | 10.6 |

TABLE 5

|  | LIGHT EMISSION OUTPUT RATIO |
|---|---|
| EXAMPLE 4 | 1.83 |
| EXAMPLE 5 | 1.4 |
| COMPARATIVE EXAMPLE 4 | 1 |

The invention claimed is:

1. A semiconductor light emitting apparatus comprising:
a semiconductor light emitting device having a layered semiconductor layer configured by layering at least two semiconductor layers, and a light emitting layer to emit first light; and
a wavelength conversion member that covers at least a part of the semiconductor light emitting device, absorbs at least a part of the first light and that emits second light with a wavelength different from that of the first light,
wherein the semiconductor light emitting device is provided with a fine structure layer, as a component, including dots comprised of a plurality of convex portions or concave portions extending in an out-of-plane direction on one of main surfaces forming the semiconductor light emitting device,
wherein the fine structure layer forms a two-dimensional photonic crystal controlled by a pitch between the dots that is an inconstant pitch that increases and decreases periodically, and
wherein the two-dimensional photonic crystal includes at least two periods that each have a long period unit, of the inconstant pitch that increases and decreases periodically, of 1.3 µm or more.

2. The semiconductor light emitting apparatus according to claim 1, wherein the two-dimensional photonic crystal includes at least two periods that each have a long period unit, of the inconstant pitch between the dots that increases and decreases periodically, of at least six times an optical wavelength of the first light and at least six times an optical wavelength of the second light.

3. A semiconductor light emitting apparatus comprising:
a semiconductor light emitting device having a layered semiconductor layer configured by layering at least two semiconductor layers, and a light emitting layer to emit first light; and
a wavelength conversion member that covers at least a part of the semiconductor light emitting device, absorbs at least a part of the first light and that emits second light with a wavelength different from that of the first light,
wherein the semiconductor light emitting device is provided with a fine structure layer, as a component, including dots comprised of a plurality of convex portions or concave portions extending in an out-of-plane direction on one of main surfaces forming the semiconductor light emitting device,
wherein the fine structure layer forms a two-dimensional photonic crystal controlled by a pitch between the dots that is an inconstant pitch that increases and decreases periodically, and
wherein the two-dimensional photonic crystal includes at least two periods that each have a long period unit, of the inconstant pitch between the dots that increases and decreases periodically, of at least six times an optical wavelength of the first light and at least six times an optical wavelength of the second light.

4. The semiconductor light emitting apparatus according to claim 1, wherein the wavelength conversion member contains a first material transparent at least to the first light and the second light, and a second material that absorbs at least a part of the first light to emit the second light.

5. The semiconductor light emitting apparatus according to claim 4, wherein the fine structure layer is provided at least on an uppermost surface of the semiconductor light emitting device as a component, and
an intermediate material, which is substantially transparent at least to the first light and the second light and does not contain the second material, is filled in between the fine structure layer and the wavelength conversion member.

6. The semiconductor light emitting apparatus according to claim 5, wherein the second material has an average particle diameter smaller than the optical wavelength of the first light in the first material.

7. The semiconductor light emitting apparatus according to claim 4, wherein the wavelength conversion member is configured to emit the second light and third light with a wavelength different from that of each of the first light and the second light, and contains a first material transparent at least to the first light, the second light and the third light, and a third material that absorbs at least a part of the first light to emit the third light, and
wherein the two-dimensional photonic crystal includes a period having a long period unit, of the inconstant pitch between the dots that increases and decreases periodically, of at least six times an optical wavelength of the third light.

8. The semiconductor light emitting apparatus according to claim 7, wherein the fine structure layer is provided at least on an uppermost surface of the semiconductor light emitting device as a component, and an intermediate material, which is substantially transparent at least to the first light, the second light and the third light and does not contain any of the second material and the third material, is filled in between the fine structure layer and the wavelength conversion member.

9. The semiconductor light emitting apparatus according to claim 8, wherein at least one of the second material and the third material has an average particle diameter smaller than the optical wavelength of the first light in the first material.

10. The semiconductor light emitting apparatus according to claim 7, wherein the wavelength conversion member is configured to emit the second light, the third light, and fourth light with a wavelength different from that of each of the first light, the second light and the third light, and contains a first material transparent at least to the first light, the second light, the third light and the fourth light, and a fourth material that absorbs at least a part of the first light to emit the fourth light, and the two-dimensional photonic crystal has a period six or more times an optical wavelength of the fourth light.

11. The semiconductor light emitting apparatus according to claim 10, wherein the fine structure layer is provided at least on an uppermost surface of the semiconductor light emitting device as a component, and an intermediate material, which is substantially transparent at least to the first light, the second light, the third light and the fourth light and does not contain any of the second material, the third material and the fourth material, is filled in between the fine structure layer and the wavelength conversion member.

12. The semiconductor light emitting apparatus according to claim 11, wherein at least one of the second material, the third material and the fourth material has an average particle diameter smaller than the optical wavelength of the first light in the first material.

13. The semiconductor light emitting apparatus according to claim 1, wherein the two-dimensional photonic crystal is configured on two or more different main surfaces forming the semiconductor light emitting device, and wherein the long period units, of the inconstant pitch between the dots that increases and decreases periodically, of respective two-dimensional photonic crystals are different from one another.

14. The semiconductor light emitting apparatus according to claim 1, wherein the long period units, of the inconstant pitch between the dots that increases and decreases periodically, of the two-dimensional photonic crystal have periods at least in one axial direction of the main surface.

15. The semiconductor light emitting apparatus according to claim 1, wherein the long period units, of the inconstant pitch between the dots that increases and decreases periodically, of the two-dimensional photonic crystal have periods at least in independent two axial directions of the main surface.

* * * * *